*US012199136B2*

United States Patent
Tanaka

(10) Patent No.: US 12,199,136 B2
(45) Date of Patent: Jan. 14, 2025

(54) SEMICONDUCTOR DEVICE

(71) Applicant: ROHM CO., LTD., Kyoto (JP)

(72) Inventor: Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 409 days.

(21) Appl. No.: 17/772,024

(22) PCT Filed: Sep. 30, 2020

(86) PCT No.: PCT/JP2020/037309
§ 371 (c)(1),
(2) Date: Apr. 26, 2022

(87) PCT Pub. No.: WO2021/106363
PCT Pub. Date: Jun. 3, 2021

(65) Prior Publication Data
US 2022/0367603 A1    Nov. 17, 2022

(30) Foreign Application Priority Data

Nov. 29, 2019    (JP) ................................. 2019-217565

(51) Int. Cl.
*H01F 27/28* (2006.01)
*H01L 49/02* (2006.01)

(52) U.S. Cl.
CPC ............. *H01L 28/10* (2013.01); *H01F 27/28* (2013.01)

(58) Field of Classification Search
CPC ....... H01L 28/10; H01F 27/28; H01F 27/292; H01F 27/363; H01F 2019/085; H01F 2027/2809; H01F 27/2804
See application file for complete search history.

(56) References Cited

U.S. PATENT DOCUMENTS 10,483,199 B2 *  11/2019  Igarashi .............. H01L 23/5283
2013/0075859 A1    3/2013  Kerber
(Continued)

FOREIGN PATENT DOCUMENTS

DE    102012109164 A1    3/2013
JP    2006261613    9/2006
(Continued)

OTHER PUBLICATIONS

International Search Report and Written Opinion issued for International Patent Application No. PCT/JP2020/037309, Date of mailing: Dec. 8, 2020, 9 pages including English translation of Search Report.
(Continued)

*Primary Examiner* — Douglas W Owens
(74) *Attorney, Agent, or Firm* — HSML P.C.

(57) ABSTRACT

A semiconductor device includes a semiconductor chip that has a main surface, an insulating layer that is formed on the main surface, a functional device that is formed in at least one among the semiconductor chip and the insulating layer, a low potential terminal that is formed on the insulating layer and is electrically connected to the functional device, a high potential terminal that is formed on the insulating layer at an interval from the low potential terminal and is electrically connected to the functional device, and a seal conductor that is embedded as a wall in the insulating layer such as to demarcate a region including the functional device, the low potential terminal and the high potential terminal from another region in plan view, and is electrically separated from the semiconductor chip, the functional device, the low potential terminal and the high potential terminal.

19 Claims, 20 Drawing Sheets

(56) References Cited

U.S. PATENT DOCUMENTS

| | | | |
|---|---|---|---|
| 2017/0359097 | A1 | 12/2017 | Uchida et al. |
| 2018/0197950 | A1 | 7/2018 | Natsume et al. |
| 2018/0308795 | A1 | 10/2018 | Uchida et al. |
| 2021/0193380 | A1* | 6/2021 | Tanaka .................. H01F 27/40 |

FOREIGN PATENT DOCUMENTS

| | | |
|---|---|---|
| JP | 2011023516 | 2/2011 |
| JP | 2013149940 | 8/2013 |
| JP | 2017220607 | 12/2017 |
| WO | 2018020713 | 2/2018 |
| WO | 2019074130 | 4/2019 |

OTHER PUBLICATIONS

International Preliminary Report on Patentability issued for International Patent Application No. PCT/JP2020/037309, Date of mailing: Jun. 9, 2022, 12 pages including English translation.
Office Action issued for German Patent Application No. 11 2020 005 334.2, dated Jul. 18, 2023, 21 pages including informal English translation.
Notice of Reasons for Refusal issued for Japanese Patent Application No. 2021-561193, Dispatch date: Nov. 28, 2024, 5 pages including English machine translation.

* cited by examiner

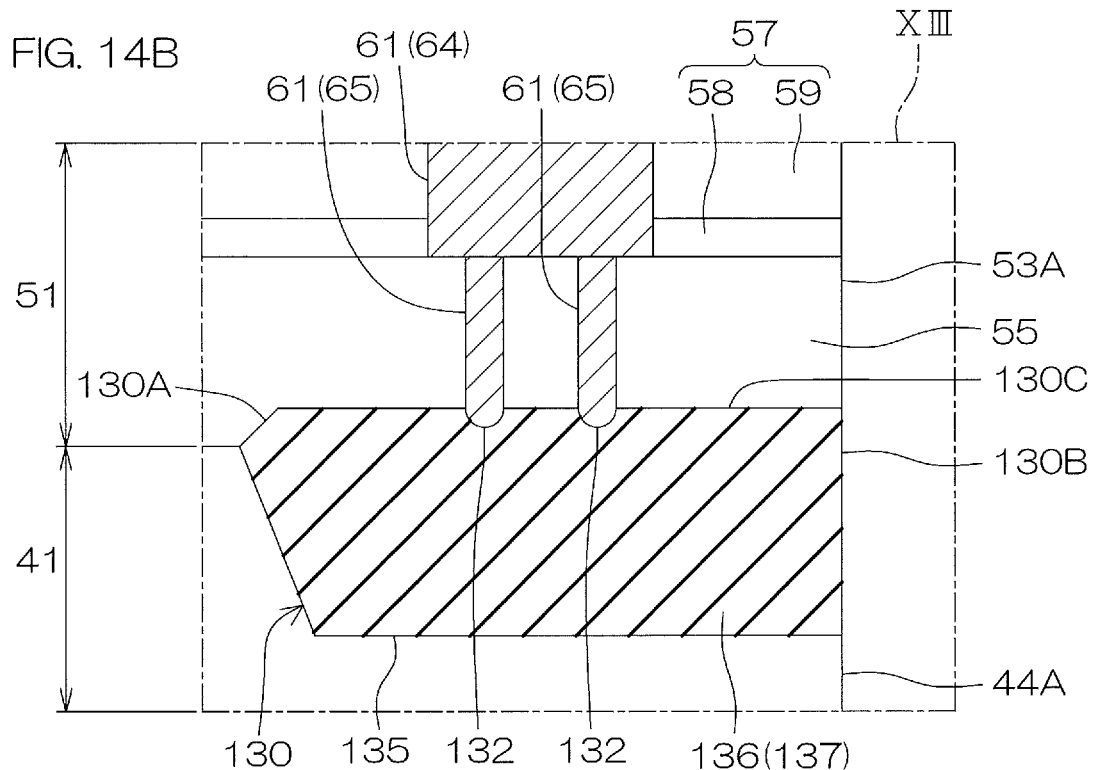
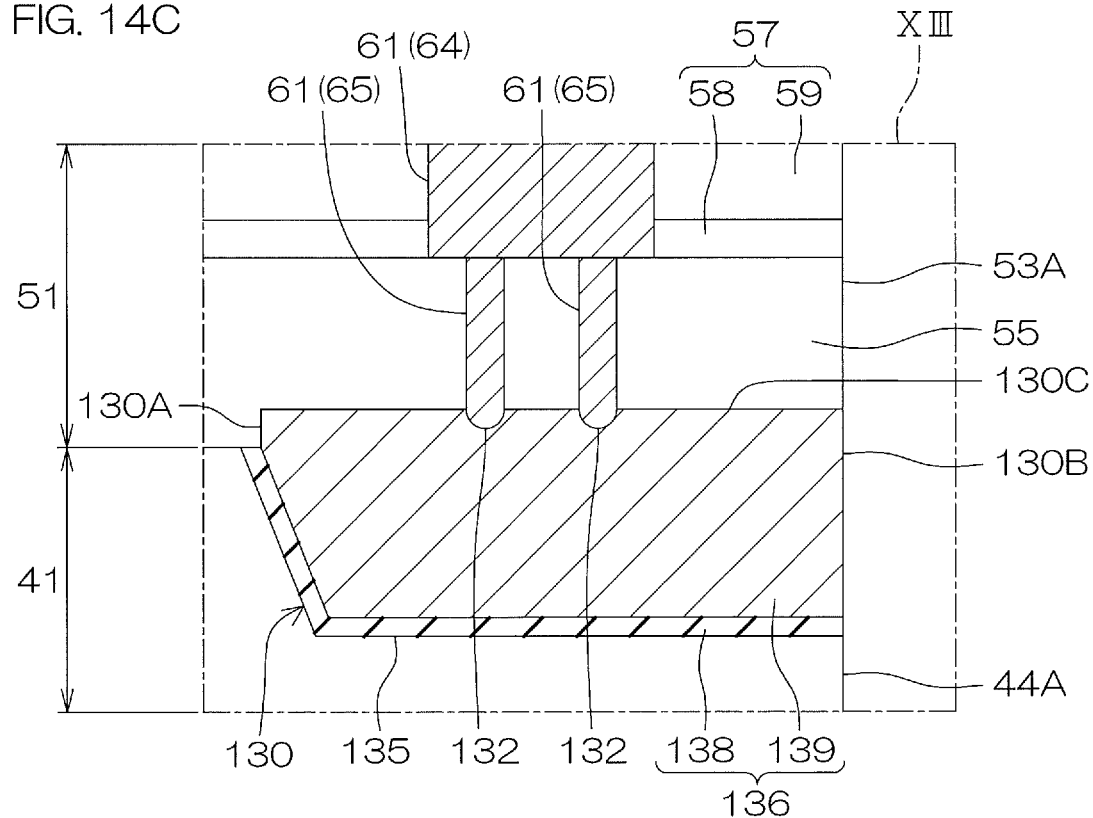

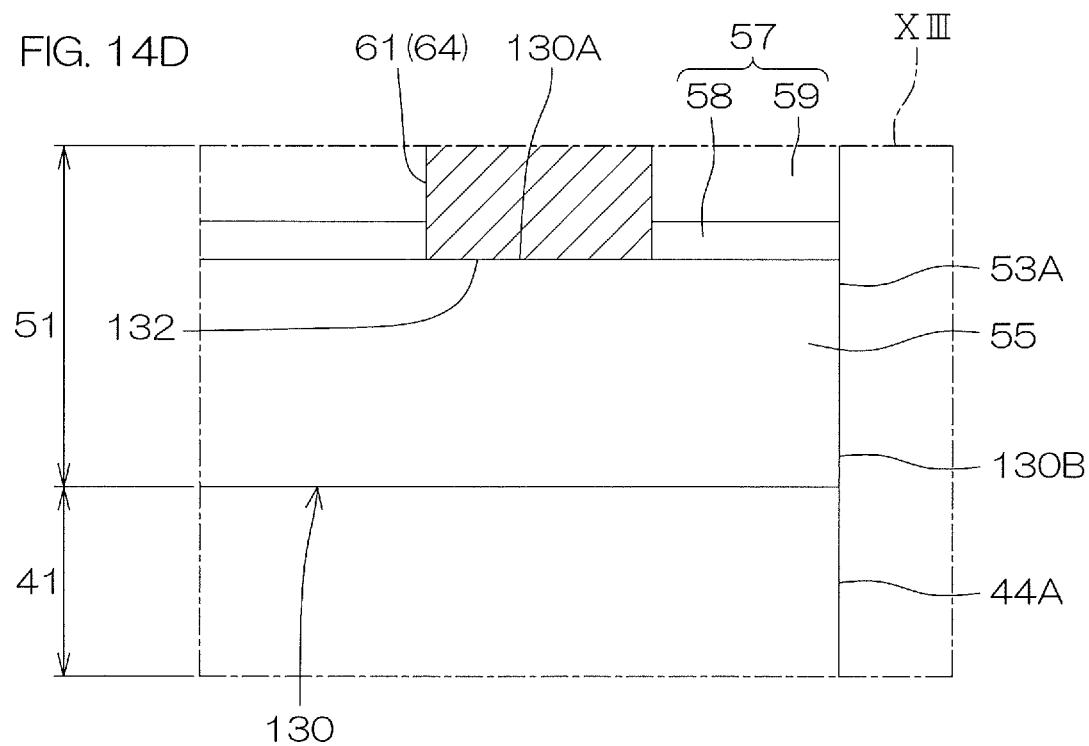

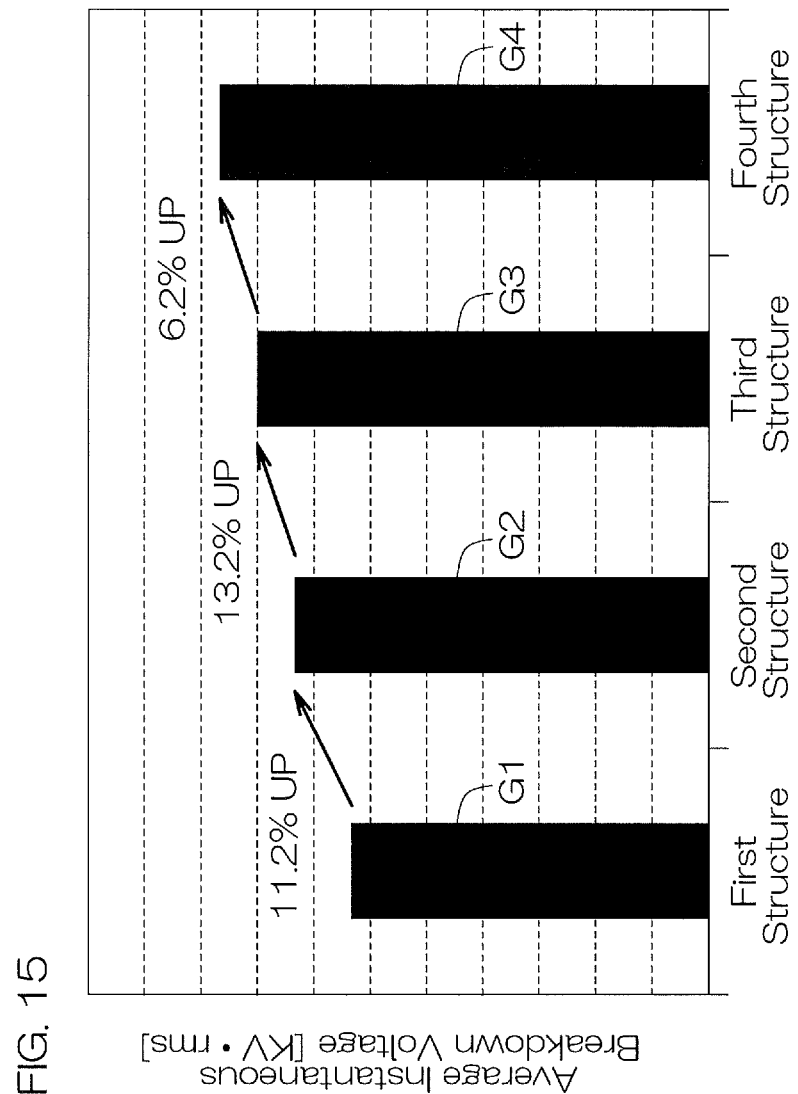

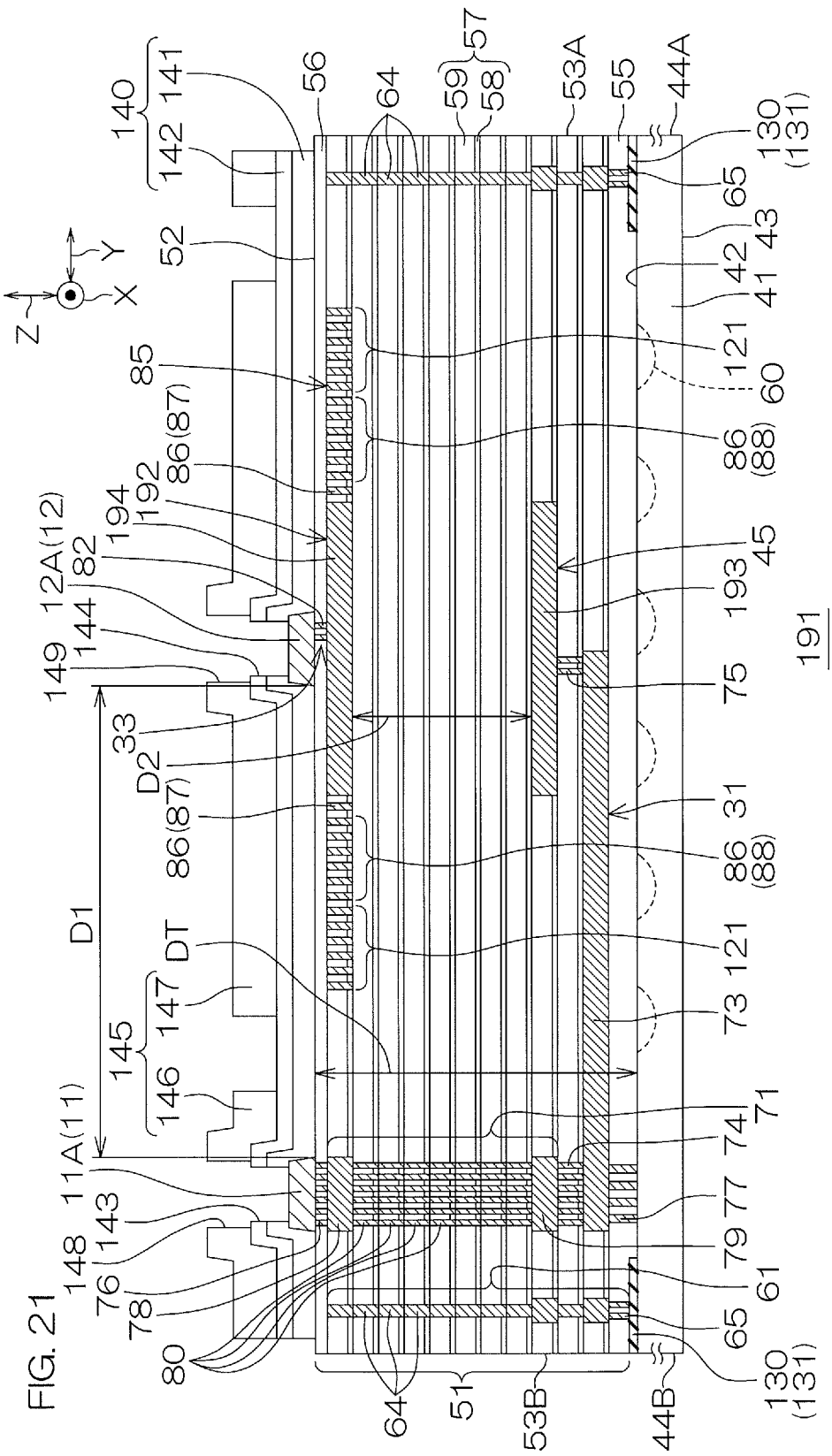

SEMICONDUCTOR DEVICE

TECHNICAL FIELD

The present invention relates to a semiconductor device that includes a seal conductor.

BACKGROUND ART

Patent Literature 1 discloses a semiconductor device that includes a semiconductor substrate, an active element, a plurality of interlayer insulating layers, a plurality of metal electrodes, and a moisture proof ring (seal conductor). The active element is formed in the semiconductor substrate. The plurality of interlayer insulating layers are laminated on the semiconductor substrate. The plurality of metal electrodes are formed on an uppermost interlayer insulating layer. The moisture proof ring is embedded in the plurality of interlayer insulating layers such as to surround the active element and the plurality of metal electrodes in plan view. The moisture proof ring is grounded to the semiconductor substrate.

CITATION LIST

Patent Literature

Patent Literature 1: Japanese Patent Application Publication No. 2006-261613

SUMMARY OF INVENTION

Technical Problem

With the semiconductor device according to Patent Literature 1, due to the structure where the seal conductor is grounded to the semiconductor substrate, there is a possibility for undesirable conduction to occur between the plurality of metal electrodes and the seal conductor when a voltage is applied to the plurality of metal electrodes. A withstand voltage of the semiconductor device decreases due to this type of conduction. Examples of modes of the undesirable conduction include electric leakage and electric discharge, etc.

A preferred embodiment of the present invention provides a semiconductor device with which withstand voltage can be improved in a structure that includes a seal conductor.

Solution to Problem

A preferred embodiment of the present invention provides a semiconductor device including a semiconductor chip that has a main surface, an insulating layer that is formed on the main surface, a functional device that is formed in at least one among the semiconductor chip and the insulating layer, a low potential terminal that is formed on the insulating layer and is electrically connected to the functional device, a high potential terminal that is formed on the insulating layer at an interval from the low potential terminal and is electrically connected to the functional device, and a seal conductor that is embedded as a wall in the insulating layer such as to demarcate a region including the functional device, the low potential terminal and the high potential terminal from another region in plan view, and is electrically separated from the semiconductor chip, the functional device, the low potential terminal and the high potential terminal.

According to this semiconductor device, undesirable conduction between the high potential terminal and the seal conductor can be suppressed when a voltage is applied to the low potential terminal and the high potential terminal. Also, undesirable conduction between the low potential terminal and the seal conductor can be suppressed. Also, undesirable conduction between the functional device and the seal conductor can be suppressed. Withstand voltage can thus be improved.

A preferred embodiment of the present invention provides a semiconductor device including a semiconductor chip that has a main surface, an insulating layer that is formed on the main surface, a low potential pattern that is formed inside the insulating layer, a high potential pattern that is formed inside the insulating layer such as to oppose the low potential pattern in a normal direction to the main surface, a dummy pattern that is formed in a periphery of the high potential pattern inside the insulating layer, includes a conductor, and shields an electric field between the low potential pattern and the high potential pattern, a low potential terminal that is formed on the insulating layer and is electrically connected to the low potential pattern, a high potential terminal that is formed on the insulating layer at an interval from the low potential terminal and is electrically connected to the high potential pattern, and a seal conductor that is embedded as a wall in the insulating layer such as to demarcate a region including the low potential pattern, the high potential pattern, the dummy pattern, the low potential terminal and the high potential terminal from another region in plan view, and is electrically separated from the semiconductor chip, the low potential pattern, the high potential pattern, the dummy pattern, the low potential terminal and the high potential terminal.

According to this semiconductor device, electric field concentration with respect to the high potential pattern can be suppressed by the dummy pattern when a voltage is applied to the low potential terminal and the high potential terminal. Further, according to this semiconductor device, undesirable conduction between the high potential pattern (high potential terminal) and the seal conductor can be suppressed when a voltage is applied to the low potential terminal and the high potential terminal. Also, undesirable conduction between the low potential pattern (low potential terminal) and the seal conductor can be suppressed. Also, undesirable conduction between the dummy pattern and the seal conductor can be suppressed. Withstand voltage can thus be improved.

The aforementioned as well as yet other objects, features, and effects of the present invention will be made clear by the following description of the preferred embodiments, with reference to the accompanying drawings.

BRIEF DESCRIPTION OF DRAWINGS

FIG. 14B is an enlarged view of the region XIII shown in FIG. 8 and is a diagram showing the separating structure according to a third configuration example.

FIG. 14C is an enlarged view of the region XIII shown in FIG. 8 and is a diagram showing the separating structure according to a fourth configuration example.

FIG. 14D is an enlarged view of the region XIII shown in FIG. 8 and is a diagram showing the separating structure according to a fifth configuration example.

FIG. 15 is a graph of average instantaneous dielectric breakdown voltages.

FIG. 21 is a sectional view of a region corresponding to FIG. 8 and is a sectional view of a semiconductor device according to a third preferred embodiment of the present invention.

DESCRIPTION OF EMBODIMENTS

Figure 1:
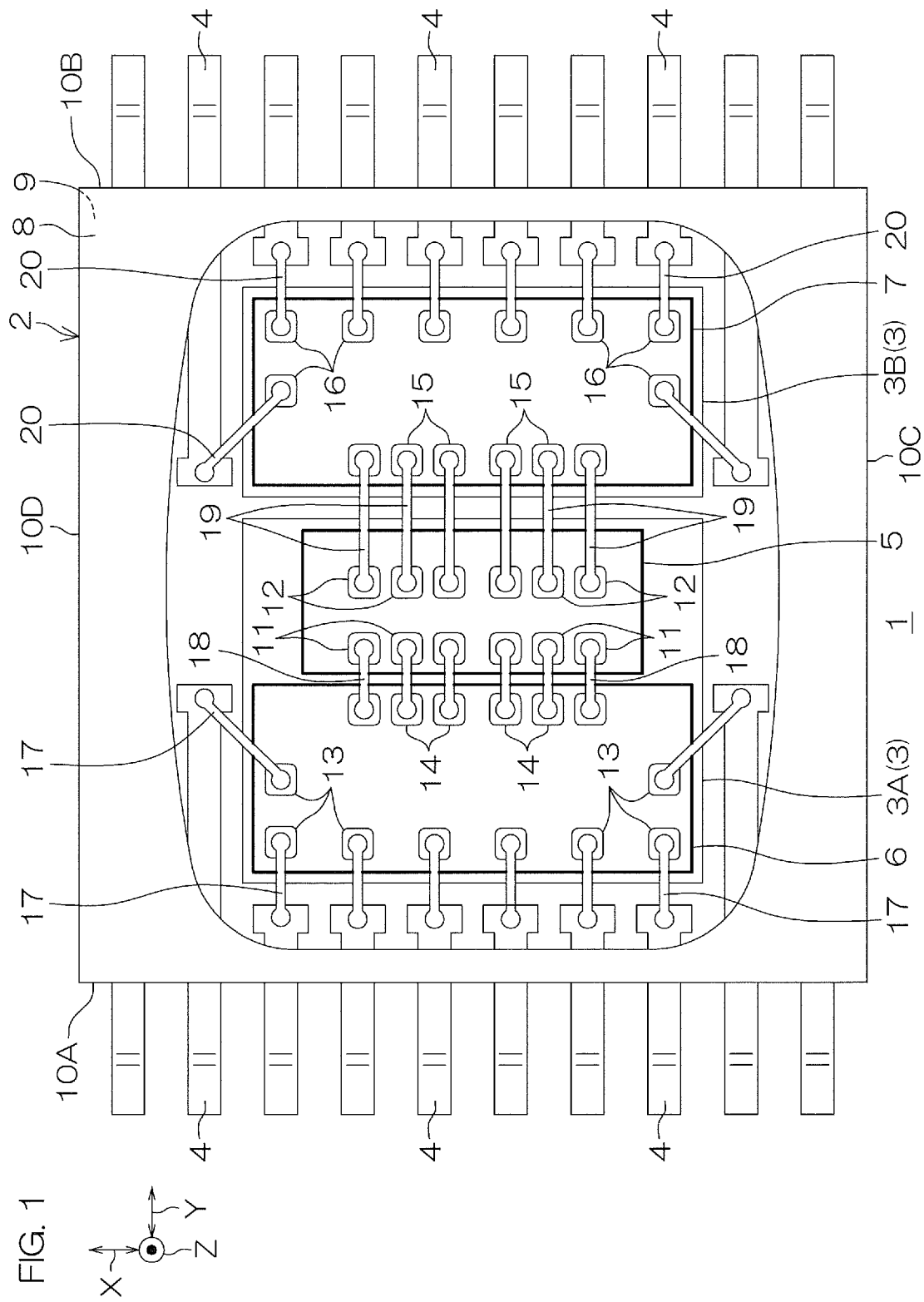
FIG. 1 is a plan view of a semiconductor module incorporating a semiconductor device according to a first preferred embodiment of the present invention.

FIG. 1 is a plan view of a semiconductor module 1 incorporating a semiconductor device 5 according to a first preferred embodiment of the present invention. In FIG. 1, a central portion of a package main body 2 is shown transparently for clarification of an internal structure.

Referring to FIG. 1, the semiconductor module 1 in this embodiment is constituted of an SOP (small outline package). The semiconductor module 1 is not restricted to an SOP and may be constituted of a QFN (quad for non-lead package), a DFP (dual flat package), a DIP (dual inline package), a QFP (quad flat package), an SIP (single inline package), or an SOJ (small outline J-leaded package) or any of various packages related to these.

In this embodiment, the semiconductor module 1 is a composite type module that includes a plurality of devices. The semiconductor module 1 includes the package main body 2, a plurality of die pads 3, a plurality of lead terminals 4, the semiconductor device 5, a controller IC 6, a driver IC 7, and a plurality of lead wires 17 to 20.

The semiconductor device 5 is a transformer chip that boosts and outputs an electrical signal that has been input. The controller IC 6 is an IC chip that drives and controls the semiconductor device 5. The driver IC 7 is an IC chip that generates an electrical signal in accordance with the electrical signal from the semiconductor device 5 to drive and control a load (for example, a switching device, etc.). The controller IC 6 is a low potential device with respect to the semiconductor device 5. The driver IC 7 is a high potential device with respect to the semiconductor device 5.

The package main body 2 includes a molded resin. The molded resin may include an epoxy resin. The package main body 2 is formed to a rectangular parallelepiped shape. The package main body 2 has a non-mounting surface 8 at one side, a mounting surface 9 at another side, and side walls 10A to 10D connecting the non-mounting surface 8 and the mounting surface 9. The non-mounting surface 8 and the mounting surface 9 are formed to quadrilateral shapes in plan view as viewed from a normal direction Z thereto. The mounting surface 9 is a surface that opposes a connection object in a state where the semiconductor module 1 is mounted on the connection object. Examples of the connection object include a circuit board such as a PCB (printed circuit board).

The side walls 10A to 10D include a first side wall 10A, a second side wall 10B, a third side wall 10C, and a fourth side wall 10D. The first side wall 10A and the second side wall 10B extend along a first direction X and oppose each other in a second direction Y orthogonal to the first direction X. The third side wall 10C and the fourth side wall 10D extend in the second direction Y and oppose each other in the first direction X.

The plurality of die pads 3 are arranged inside the package main body 2. In this embodiment, the plurality of die pads 3 are each formed to a rectangular parallelepiped shape. The plurality of die pads 3 include a first die pad 3A and a second die pad 3B. The first die pad 3A is arranged at the first side wall 10A side. The second die pad 3B is arranged at the second side wall 10B side at an interval from the first die pad 3A.

The plurality of lead terminals 4 are respectively arranged at the first side wall 10A side and the second side wall 10B side of the package main body 2. Each lead terminal 4 has one end portion positioned inside the package main body 2 and another end portion positioned outside the package main body 2. The other end portion of each lead terminal 4 is formed as an external connection portion that is connected to the connection object.

The semiconductor device 5 is arranged on the first die pad 3A inside the package main body 2. In this embodiment, the semiconductor device 5 is formed to a rectangular shape in plan view. The semiconductor device 5 is arranged on the first die pad 3A in an orientation such that its long sides oppose the first side wall 10A (second side wall 10B).

The semiconductor device 5 includes a plurality of low potential terminals 11 and a plurality of high potential terminals 12. The plurality of low potential terminals 11 are arranged at intervals along the long side of the semiconductor device 5 at the first side wall 10A side. The plurality of high potential terminals 12 are arranged at intervals along the long side of the semiconductor device 5 at the second side wall 10B side.

The controller IC 6 is arranged on the first die pad 3A inside the package main body 2. Specifically, the controller IC 6 is arranged on the first die pad 3A at an interval to the first side wall 10A side from the semiconductor device 5. In this embodiment, the controller IC 6 is formed to a rectangular shape in plan view. The controller IC 6 is arranged on the first die pad 3A in an orientation such that its long sides oppose the first side wall 10A (second side wall 10B).

The controller IC 6 includes a plurality of first input pads 13 and a plurality of first output pads 14. The plurality of first input pads 13 are arranged at intervals along the long side of the controller IC 6 at the first side wall 10A side. The plurality of first output pads 14 are arranged at intervals along the long side of the controller IC 6 at the second side wall 10B side.

The driver IC 7 is arranged on the second die pad 3B inside the package main body 2. In this embodiment, the driver IC 7 is formed to a rectangular shape in plan view. The driver IC 7 is arranged on the second die pad 3B in an orientation such that its long sides oppose the first side wall 10A (second side wall 10B).

The driver IC 7 includes a plurality of second input pads 15 and a plurality of second output pads 16. The plurality of second input pads 15 are arranged at intervals along the long side of the driver IC 7 at the first side wall 10A side. The plurality of second output pads 16 are arranged at intervals along the long side of the driver IC 7 at the second side wall 10B side.

The plurality of lead wires 17 to 20 selectively connect the plurality of lead terminals 4, the semiconductor device 5, the controller IC 6, and the driver IC 7 inside the package main body 2. The plurality of lead wires 17 to 20 are each constituted of a bonding wire. The plurality of lead wires 17 to 20 include at least one among a copper wire, a gold wire, and an aluminum wire.

The plurality of lead wires 17 to 20 include first lead wires 17, second lead wires 18, third lead wires 19, and fourth lead wires 20. The first lead wires 17 are connected to the lead terminals 4 at the first side wall 10A side and the first input pads 13 of the controller IC 6. The second lead wires 18 are connected to the low potential terminals 11 of the semiconductor device 5 and the first output pads 14 of the controller IC 6. The third lead wires 19 are connected to the high potential terminals 12 of the semiconductor device 5 and the second input pads of the driver IC 7. The fourth lead wires 20 are connected to the second output pads 16 of the driver IC 7 and the lead terminals 4 at the second side wall 10B side.

Figure 2:
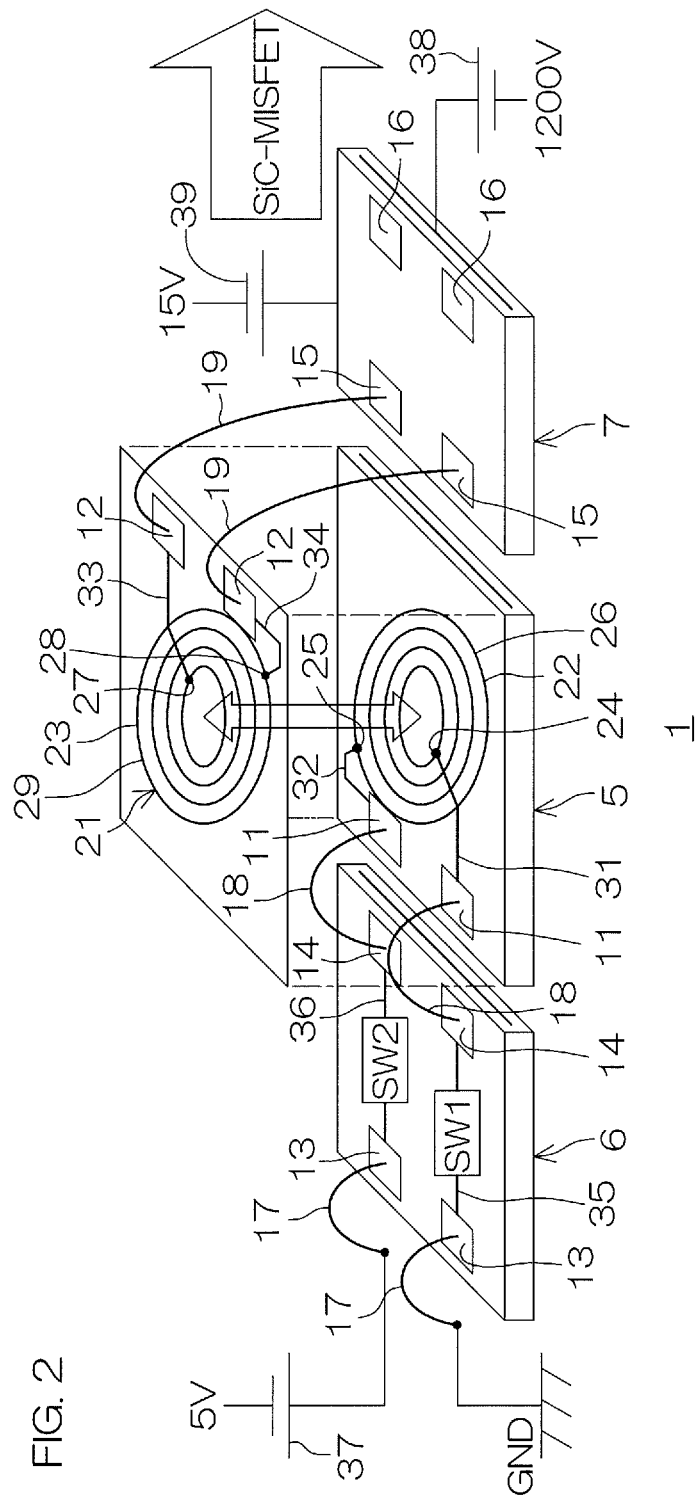
FIG. 2 is a diagram for describing an operation of the semiconductor module shown in FIG. 1.
Figure 3:
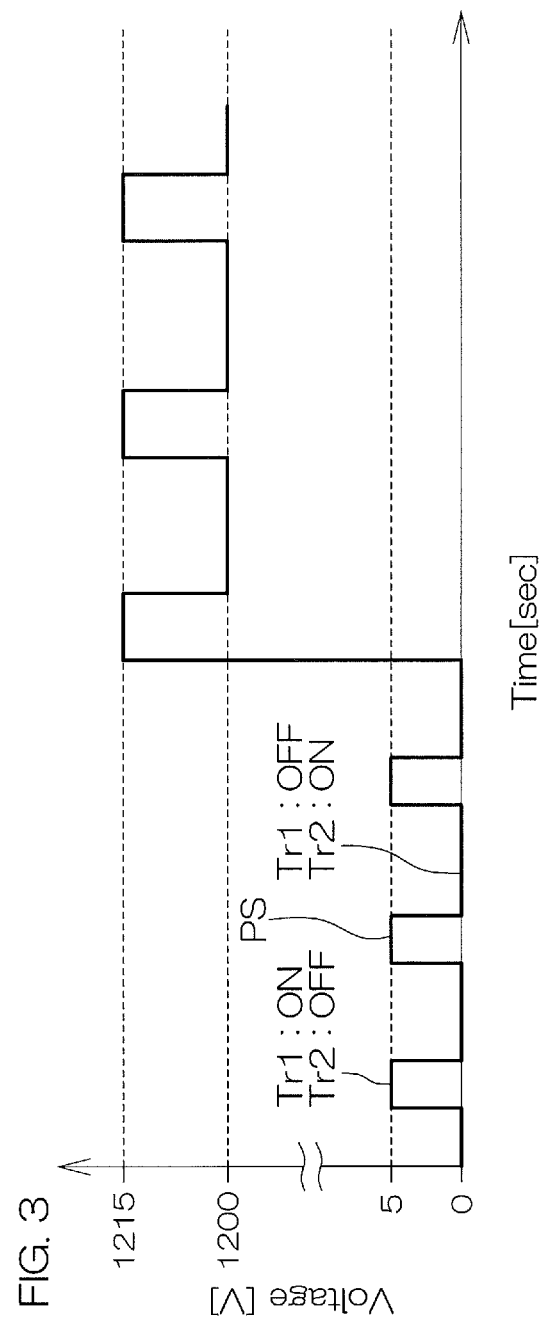
FIG. 3 is a voltage waveform diagram used in the description of FIG. 2.

FIG. 2 is a diagram for describing an operation of the semiconductor module 1 shown in FIG. 1. FIG. 3 is a voltage waveform diagram used in the description of FIG. 2.

Referring to FIG. 2, the semiconductor device 5 includes a transformer 21. The transformer 21 includes a low potential coil 22 (low potential conductor pattern) at a primary side and a high potential coil 23 (high potential conductor pattern) that oppose each other in an up/down direction. The high potential coil 23 is arranged at an upper side with respect to the low potential coil 22 and opposes the low potential coil 22.

The high potential coil 23 is AC connected by magnetic coupling to the low potential coil 22 and at the same time is DC isolated from the low potential coil 22. That is, the driver IC 7 is AC connected to the controller IC 6 via the semiconductor device 5 and at the same time is DC isolated from the controller IC 6 by the semiconductor device 5.

The low potential coil 22 includes a first inner terminal end 24, a first outer terminal end 25, and a first spiral portion 26 that is routed in a spiral between the first inner terminal end 24 and the first outer terminal end 25. The high potential coil 23 includes a second inner terminal end 27, a second outer terminal end 28, and a second spiral portion 29 that is routed in a spiral between the second inner terminal end 27 and the second outer terminal end 28.

The semiconductor device 5 includes a first low potential wiring 31, a second low potential wiring 32, a first high potential wiring 33, and a second high potential wiring 34. The first low potential wiring 31 connects the first inner terminal end 24 of the low potential coil 22 to the corresponding low potential terminal 11. The second low potential wiring 32 connects the first outer terminal end 25 of the low potential coil 22 to the corresponding low potential terminal 11. The first high potential wiring 33 connects the second inner terminal end 27 of the high potential coil 23 to the corresponding high potential terminal 12. The second high potential wiring 34 connects the second outer terminal end 28 of the high potential coil 23 to the corresponding high potential terminal 12.

The controller IC 6 includes a first wiring 35 and a second wiring 36. The first wiring 35 is connected to the corresponding first input pad 13 and first output pad 14. The second wiring 36 is connected to the corresponding first input pad 13 and first output pad 14. The controller IC 6 further includes a first switching device Sw1 and a second switching device Sw2. The first switching device Sw1 and the second switching device Sw2 are each constituted of a transistor.

The first switching device Sw1 is interposed in the first wiring 35. The first switching device Sw1 controls conduction and interruption of an electrical signal transmitted to the first wiring 35. The second switching device Sw2 is interposed in the second wiring 36. The second switching device Sw2 controls conduction and interruption of an electrical signal transmitted to the second wiring 36.

The first input pad 13 at the first wiring 35 side is connected to ground via a first lead wire 17. The first output pad 14 at the first wiring 35 side is electrically connected to the low potential terminal 11 at the first inner terminal end 24 side via a second wiring 18. The first input pad 13 at the second wiring 36 side is electrically connected to a power supply 37 via a first lead wire 17. The power supply 37 applies a voltage, for example, of 5 V to the controller IC 6. The first output pad 14 at the second wiring 36 side is electrically connected to the low potential terminal 11 at the first outer terminal end 25 side via a second wiring 18.

The driver IC 7 is electrically connected to the semiconductor device 5 via the plurality of third lead wires 19. Specifically, a second input pad 15 of the driver IC 7 is electrically connected to the high potential terminal 12 at the second inner terminal end 27 side via a third lead wire 19. Also, a second input pad 15 of the driver IC 7 is electrically connected to the high potential terminal 12 at the second outer terminal end 28 side via a third lead wire 19.

A reference voltage power supply 38, a power supply 39, and a SiC-MISFET (metal insulator semiconductor field effect transistor) as an example of the load are connected to the driver IC 7. The reference voltage power supply 38 applies a reference voltage, for example, of 1200 V to the driver IC 7. This reference voltage is also applied to the high potential coil 23 via the driver IC 7. The power supply 39 applies a voltage, for example, of 15 V to the driver IC 7. The driver IC 7 drives and controls the SiC-MISFET with 1200 V as a reference voltage.

Referring to FIG. 3, the controller IC 6 performs on/off control of the first switching device Sw1 and the second switching device Sw2 in a predetermined switching pattern to generate a pulse signal PS. In this example, the predetermined switching pattern includes a first application state (Sw1: On, Sw2: Off) and a second application state (Sw1: Off, Sw2: On). FIG. 3 shows an example where the pulse signal PS of 5 V with 0 V (ground potential) as a reference is generated.

The pulse signal PS generated by the controller IC 6 is input into the semiconductor device 5. The semiconductor device 5 transmits the pulse signal PS from the low potential coil 22 to the high potential coil 23. The pulse signal PS is thereby boosted by just an amount that is in accordance with a winding ratio (transformation ratio) of the low potential coil 22 and the high potential coil 23. An example where the pulse signal PS is boosted to 15 V is shown in FIG. 3.

The boosted pulse signal PS is input into the driver IC 7. The driver IC 7 generates an electrical signal that is in accordance with the boosted pulse signal PS to drive and control the SiC-MISFET. The numerical values indicated in FIG. 2 and FIG. 3 are all merely an example. For example, the reference voltage at the secondary side (high potential side) may be not less than 500 V and not more than 4000 V.

Figure 4:
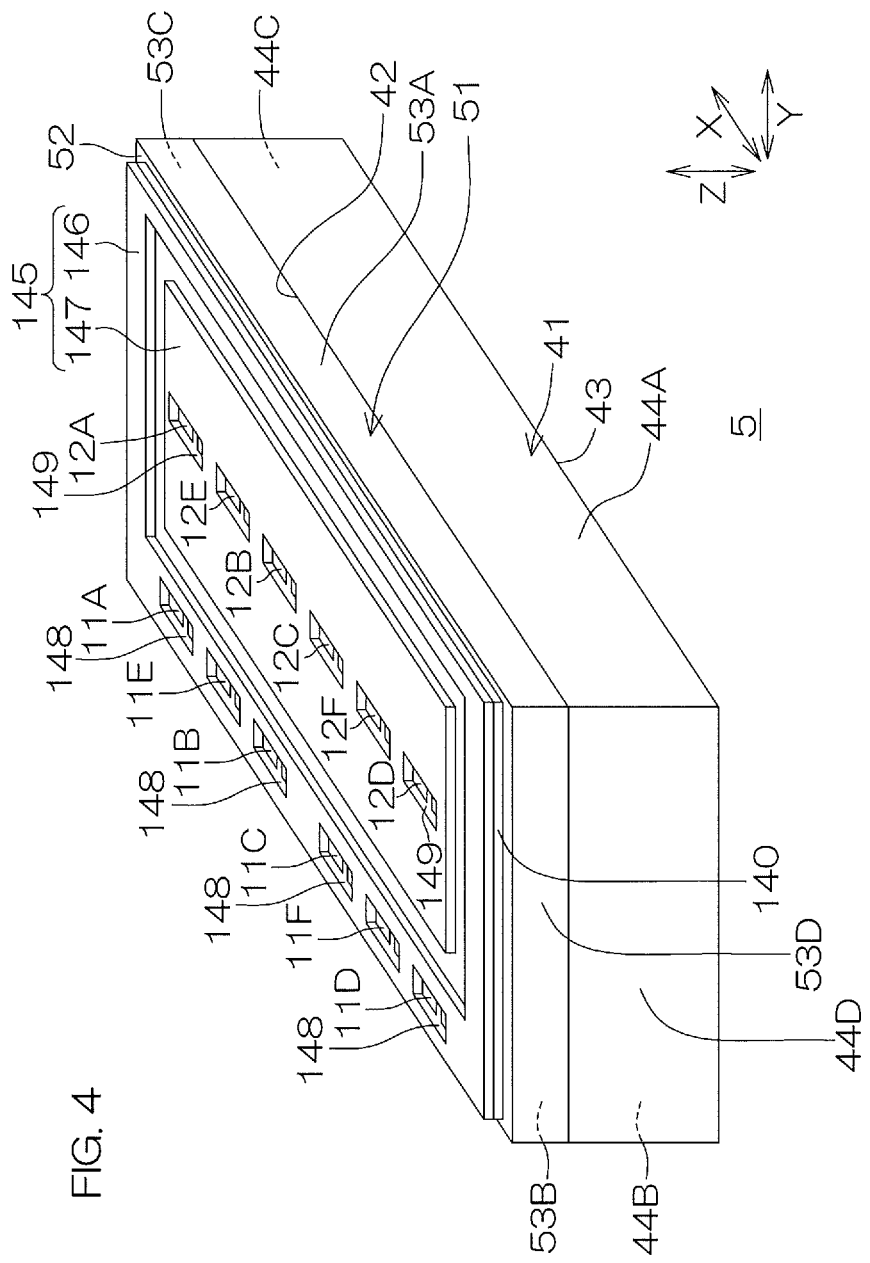
FIG. 4 is a perspective view of the semiconductor device shown in FIG. 1.
Figure 5:
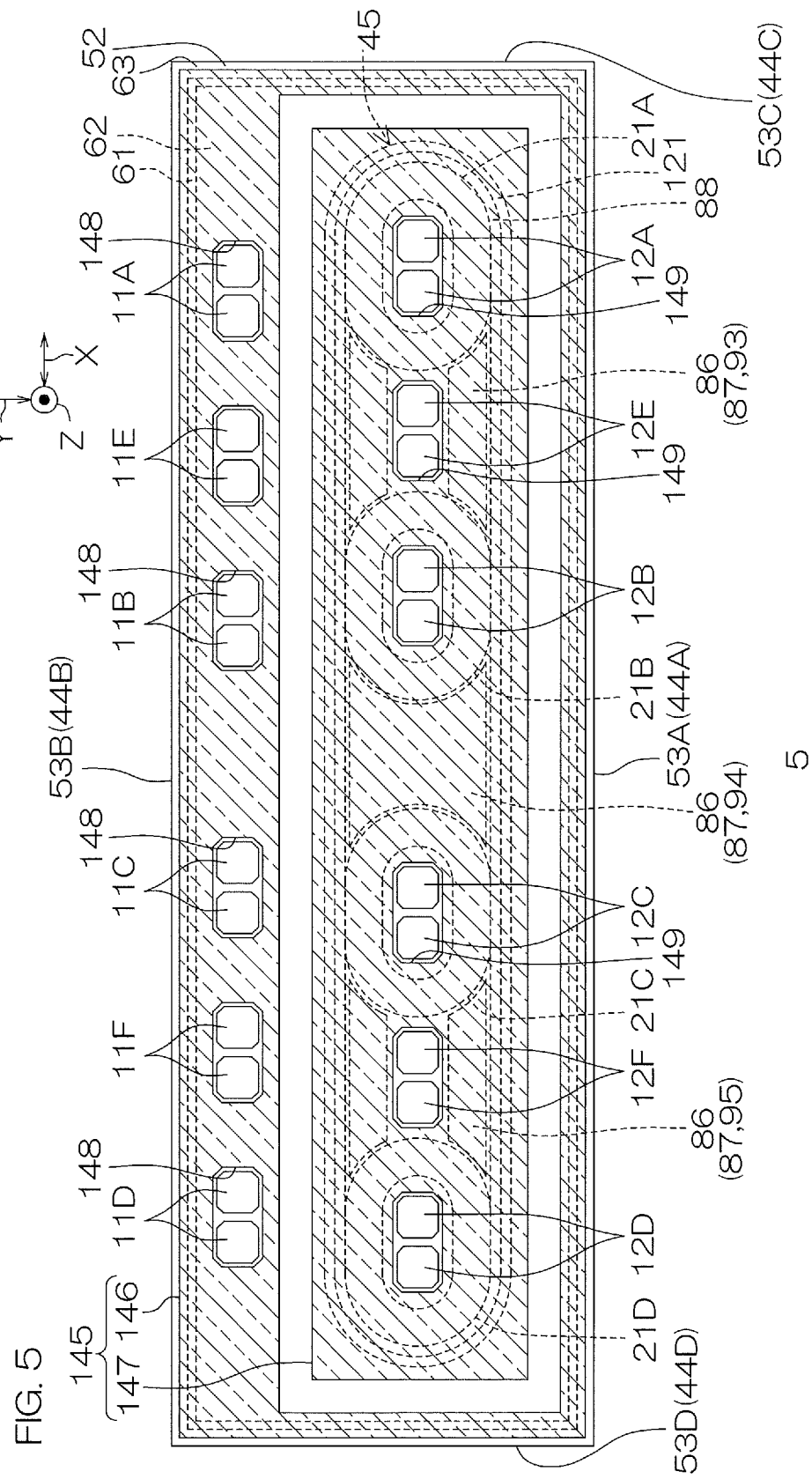
FIG. 5 is a plan view of the semiconductor device shown in FIG. 4.
Figure 6:
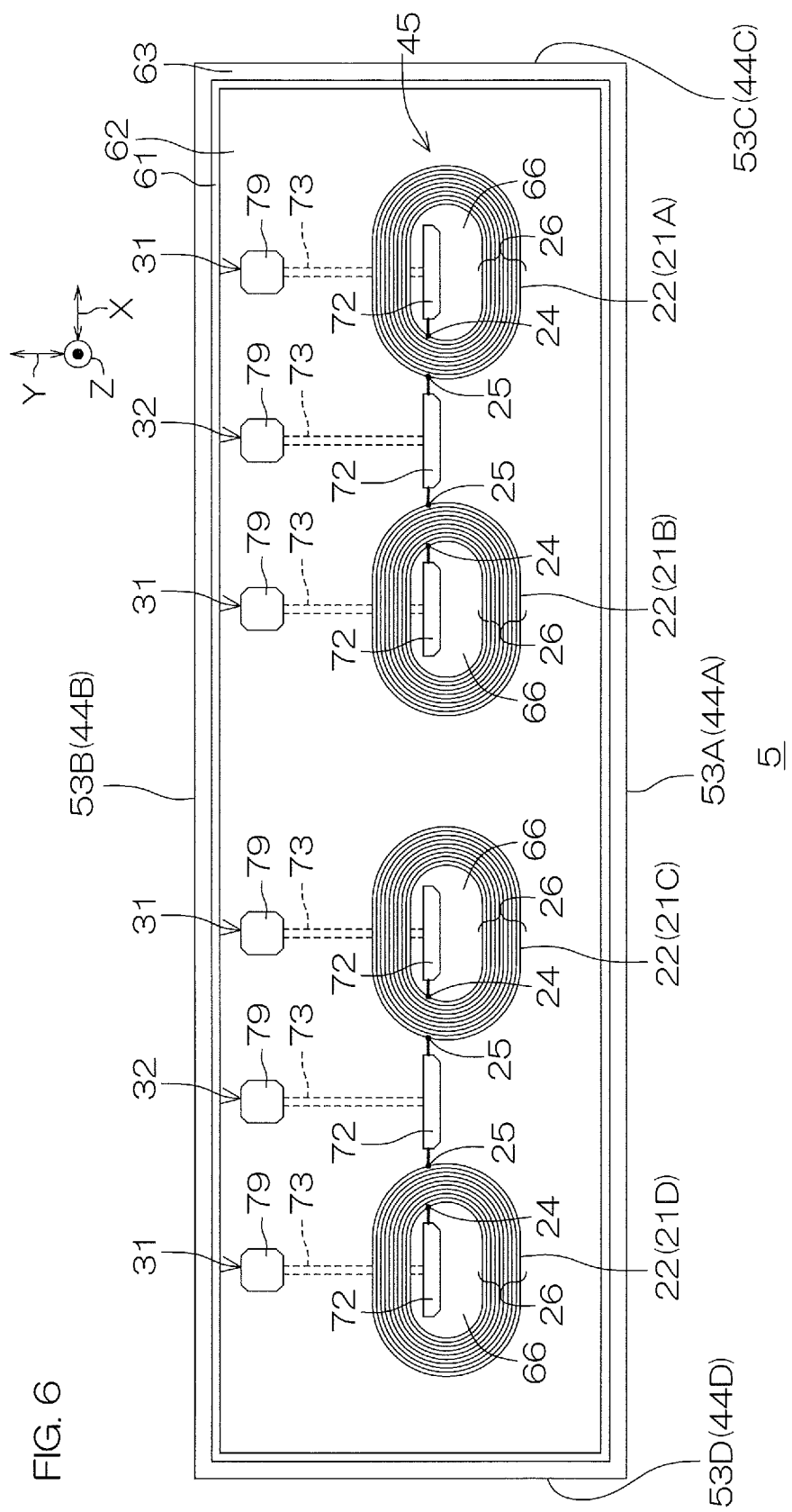
FIG. 6 is a plan view of a layer of the semiconductor device shown in FIG. 4 in which low potential coils are formed.
Figure 7:
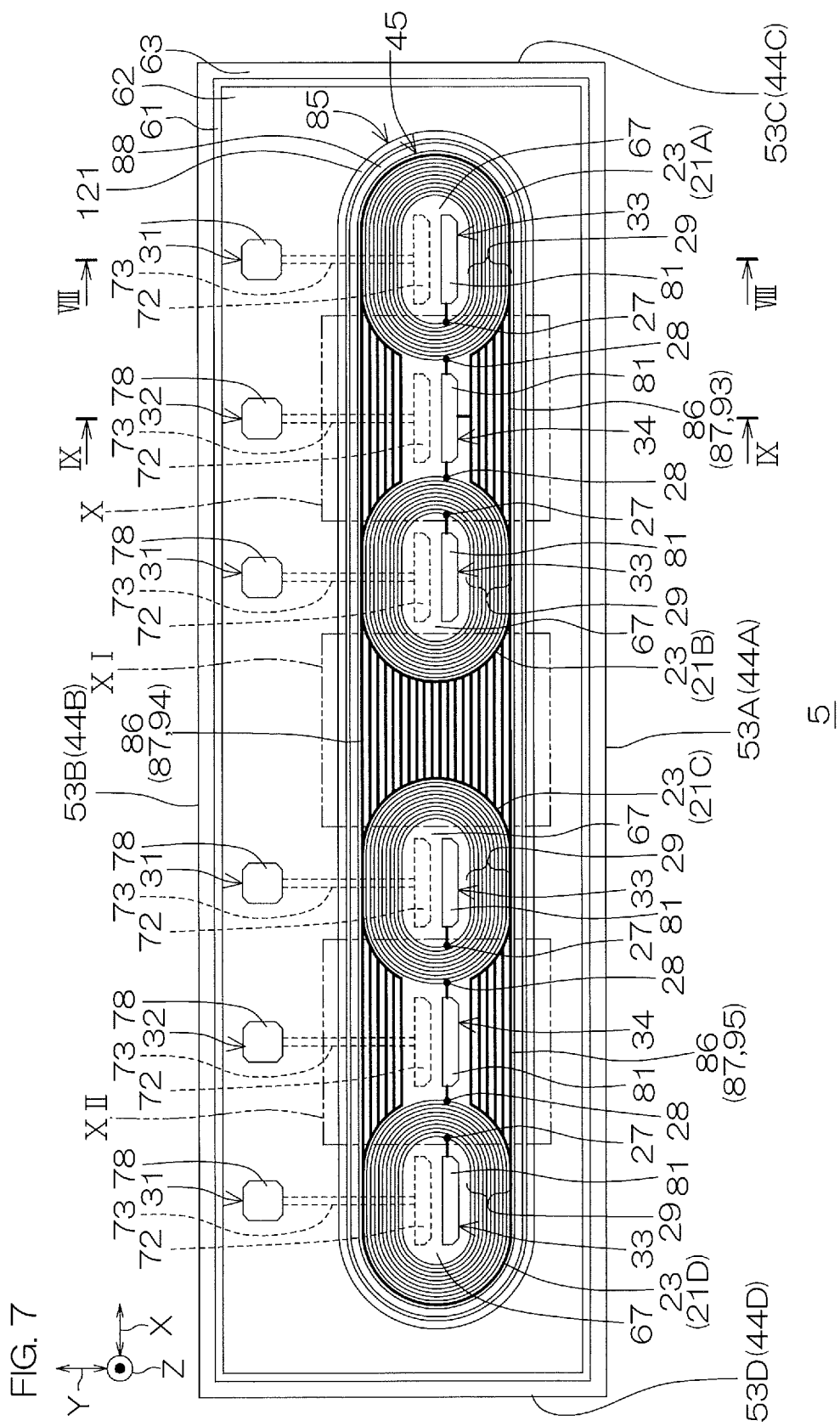
FIG. 7 is a plan view of a layer of the semiconductor device shown in FIG. 4 in which high potential coils are formed.
Figure 8:
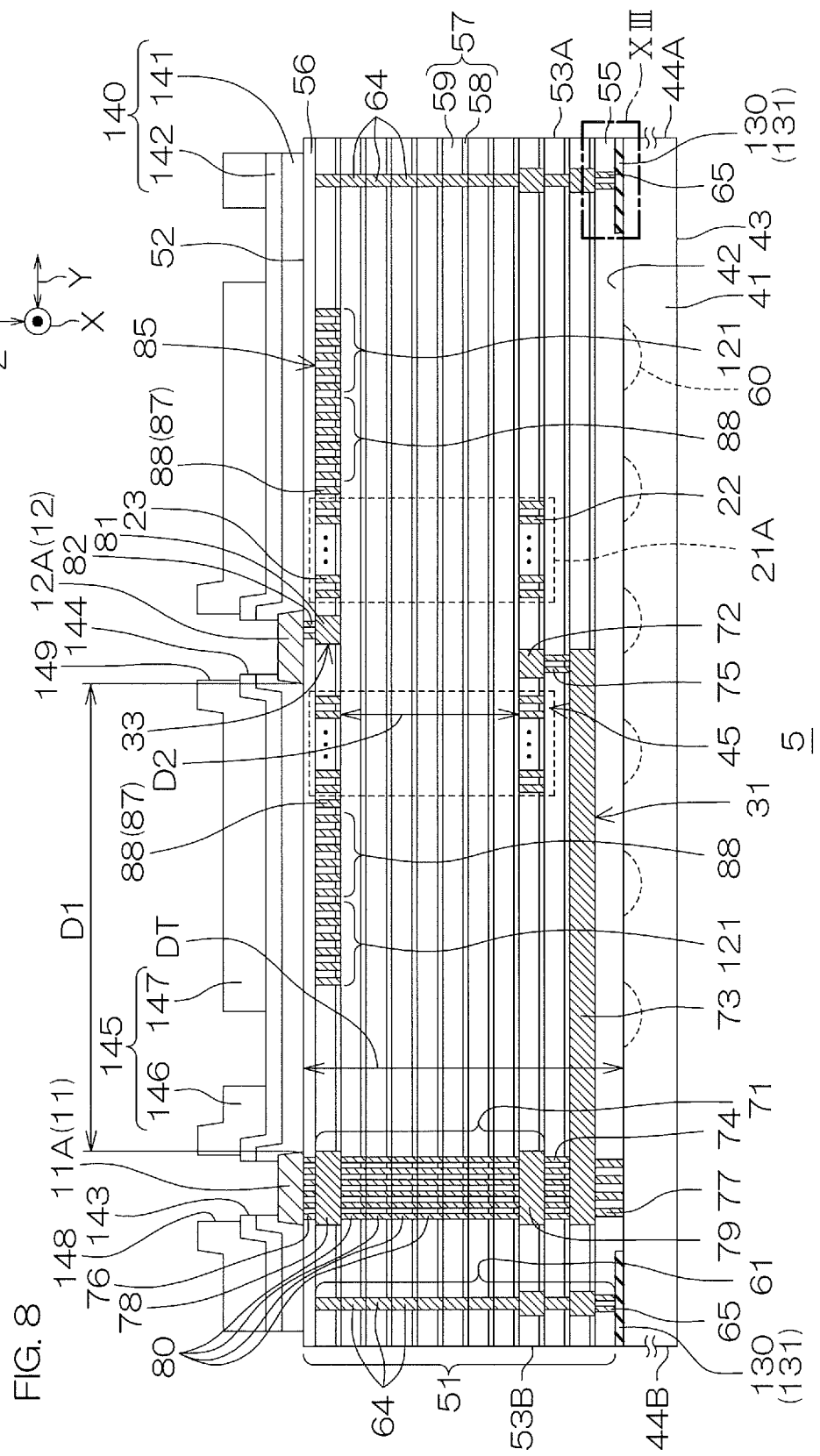
FIG. 8 is a sectional view taken along line VIII-VIII shown in FIG. 7.
Figure 9:
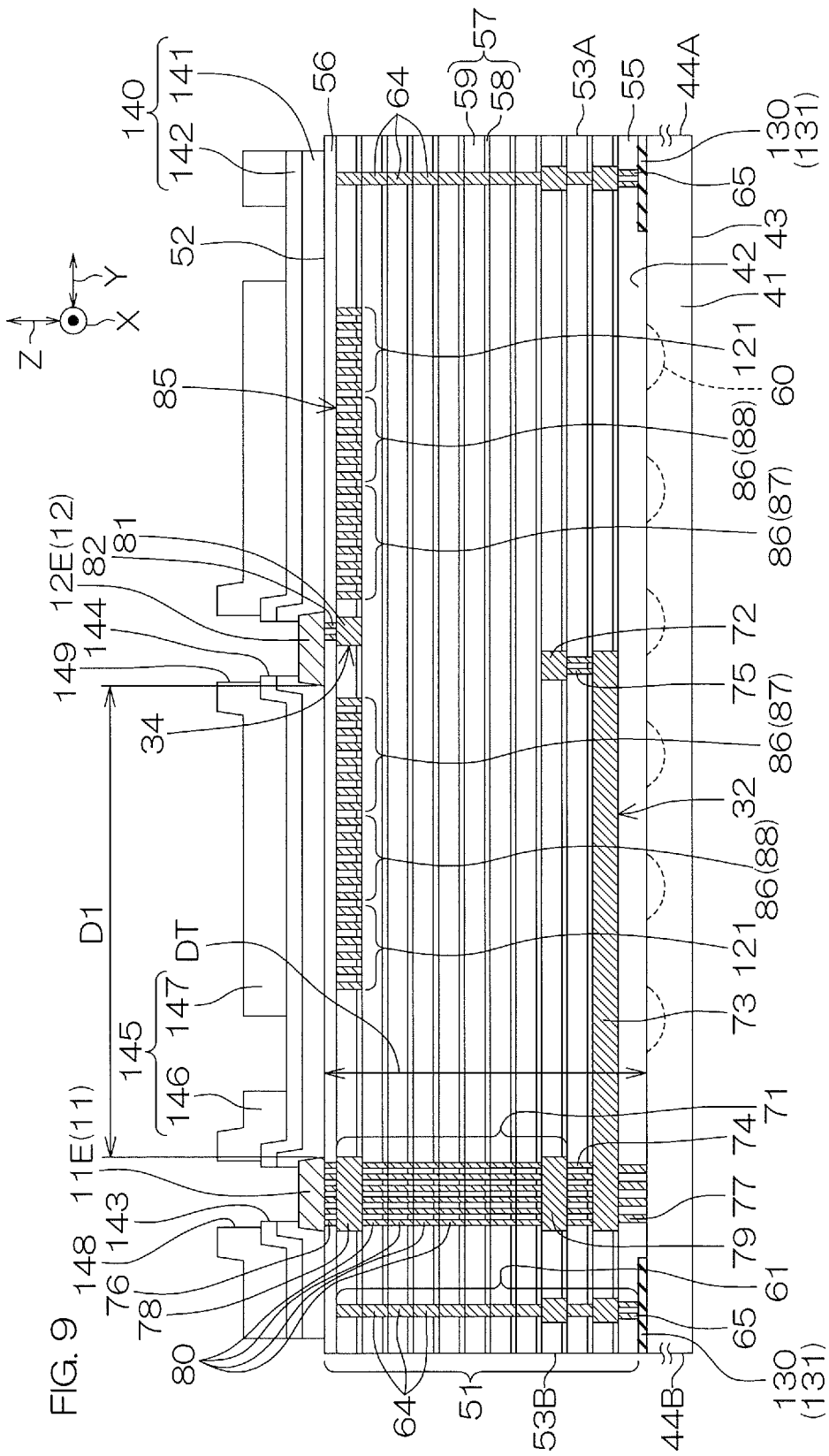
FIG. 9 is a sectional view taken along line IX-IX shown in FIG. 7.
Figure 10:
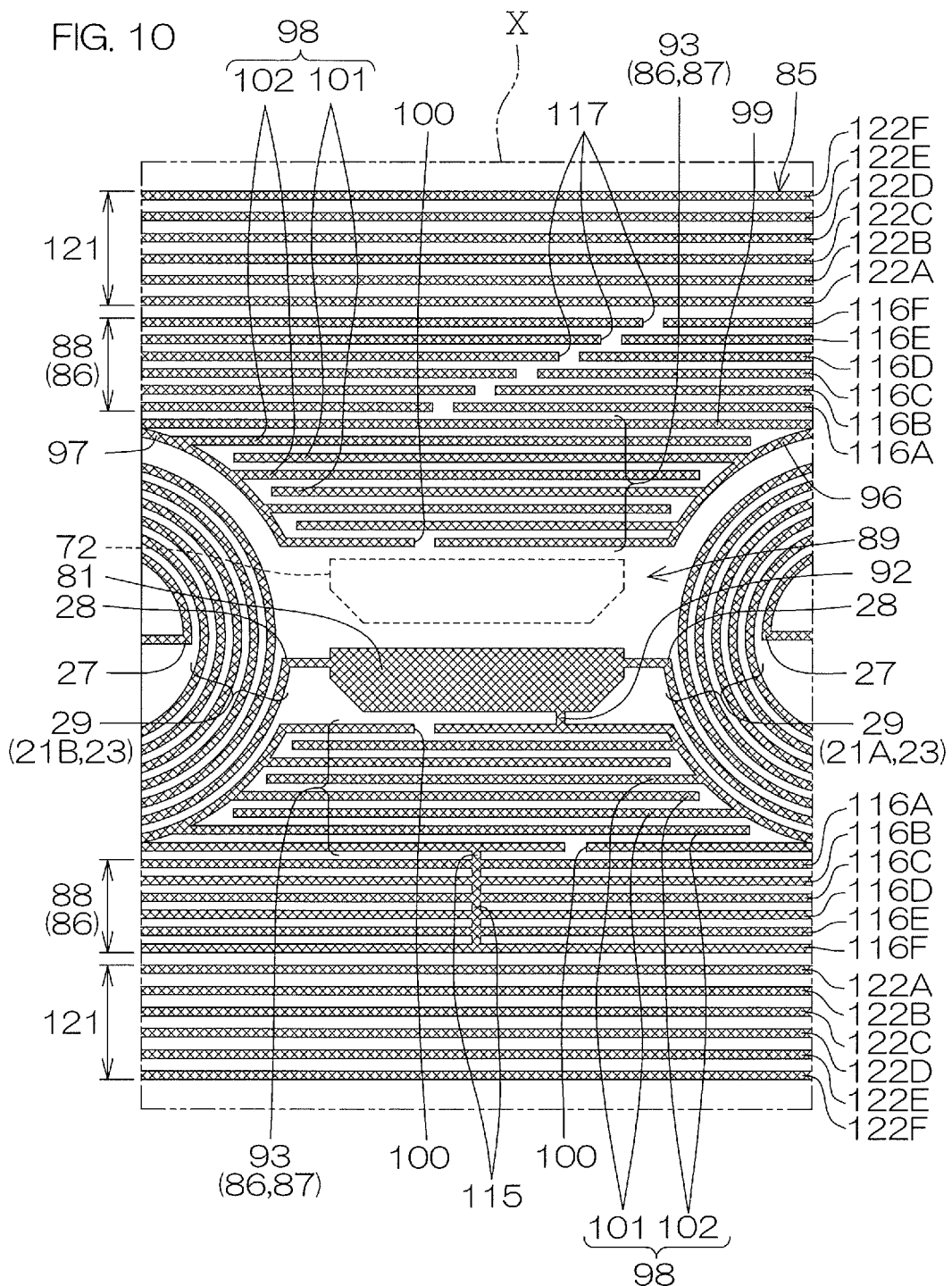
FIG. 10 is an enlarged view of a region X shown in FIG. 7.
Figure 11:
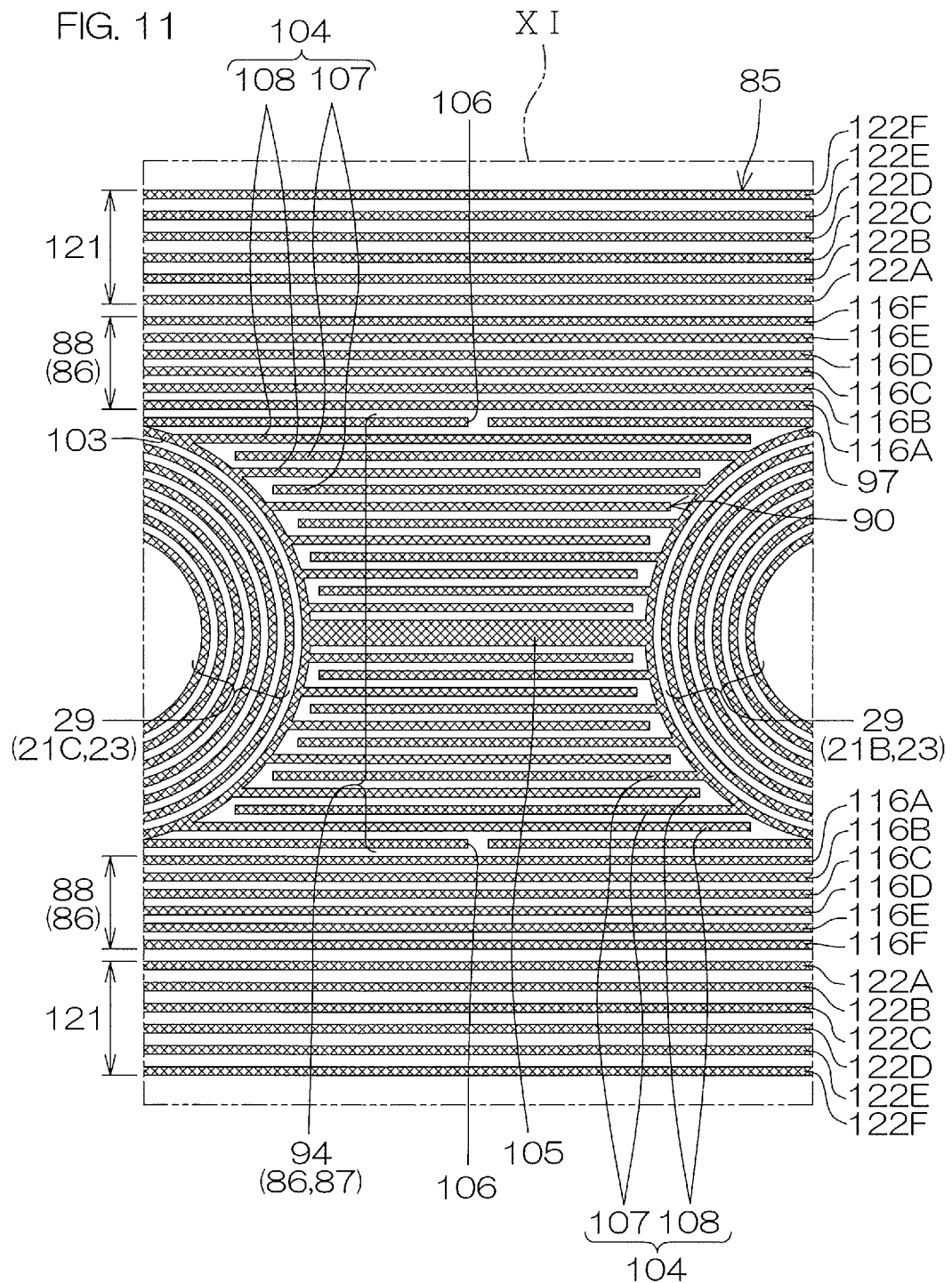
FIG. 11 is an enlarged view of a region XI shown in FIG. 7.
Figure 12:
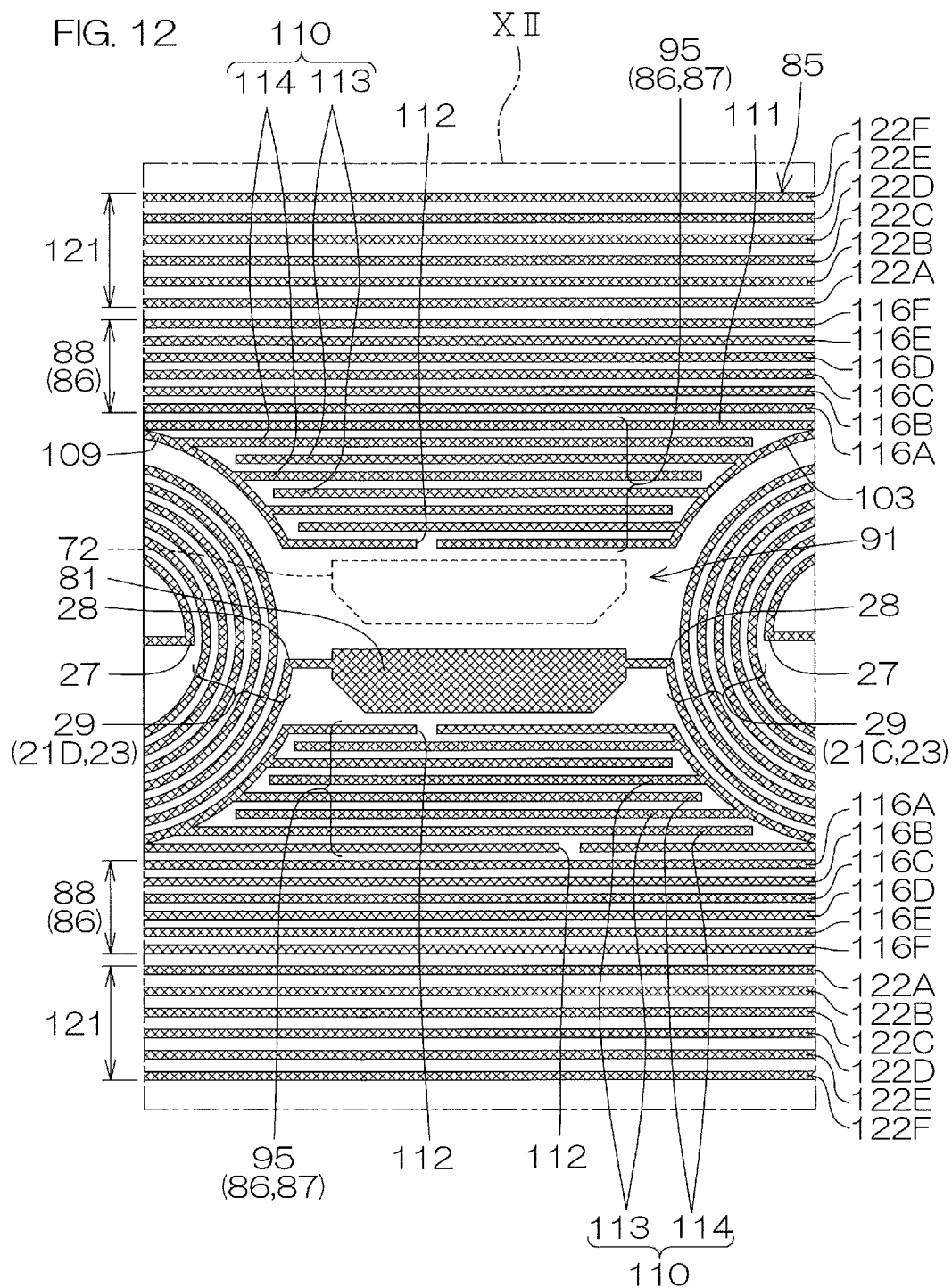
FIG. 12 is an enlarged view of a region XII shown in FIG. 7.
Figure 13:
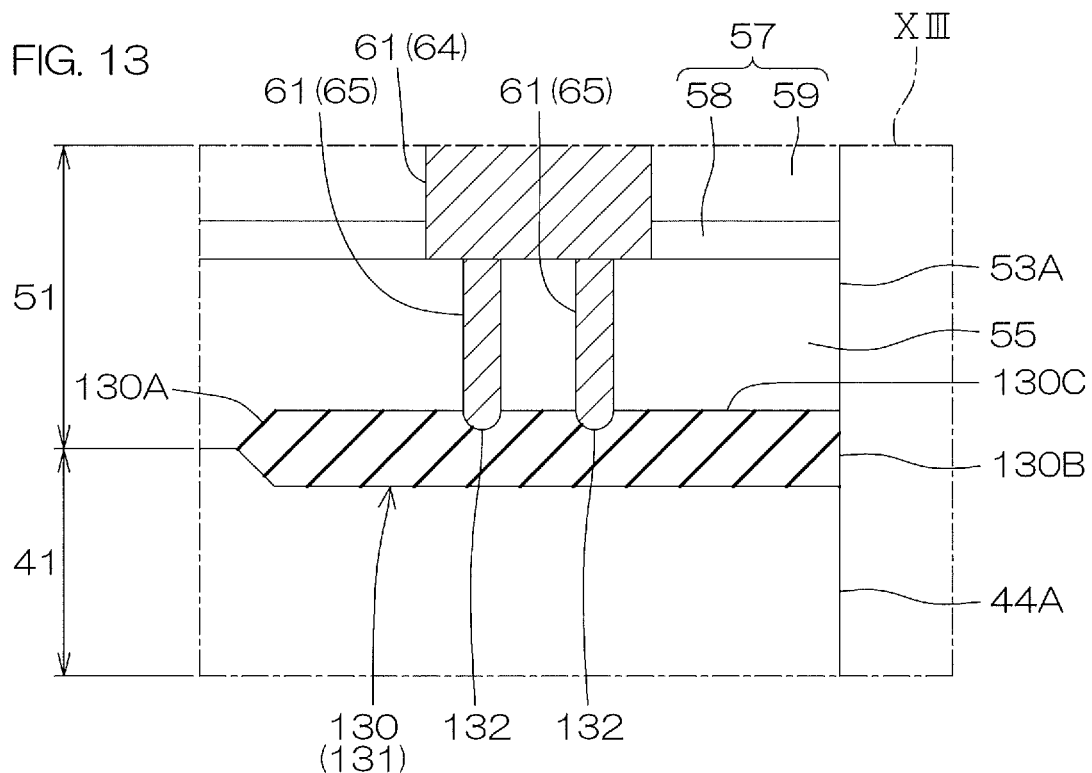
FIG. 13 is an enlarged view of a region XIII shown in FIG. 8 and is a diagram showing a separating structure according to a first configuration example.

FIG. 4 is a perspective view of the semiconductor device 5 shown in FIG. 1. FIG. 5 is a plan view of the semiconductor device 5 shown in FIG. 4. FIG. 6 is a plan view of a layer of the semiconductor device 5 shown in FIG. 4 in which low potential coils 22 are formed. FIG. 7 is a plan view of a layer of the semiconductor device 5 shown in FIG. 4 in which high potential coils 23 are formed. FIG. 8 is a sectional view taken along line VIII-VIII shown in FIG. 7. FIG. 9 is a sectional view taken along line IX-IX shown in FIG. 7. FIG. 10 is an enlarged view of a region X shown in FIG. 7. FIG. 11 is an enlarged view of a region XI shown in FIG. 7. FIG. 12 is an enlarged view of a region XII shown in FIG. 7. FIG. 13 is an enlarged view of a region XIII shown in FIG. 8 and is a diagram showing a separating structure 130 according to a first configuration example.

Referring to FIG. 4 to FIG. 8, the semiconductor device 5 includes a semiconductor chip 41 of rectangular parallelepiped shape. The semiconductor chip 41 includes at least one among silicon, a wide bandgap semiconductor, and a compound semiconductor.

The wide bandgap semiconductor is constituted of a semiconductor that exceeds the bandgap (approximately 1.12 eV) of silicon. The bandgap of the wide bandgap semiconductor is preferably not less than 2.0 eV. The wide bandgap semiconductor may be SiC (silicon carbide). The compound semiconductor may be a group III-V compound semiconductor. The compound semiconductor may include at least one among AlN (aluminum nitride), InN (indium nitride), GaN (gallium nitride), and GaAs (gallium arsenide).

In this embodiment, the semiconductor chip 41 includes a semiconductor substrate made of silicon. The semiconductor chip 41 may be an epitaxial substrate having a laminated structure that includes a semiconductor substrate made of silicon and an epitaxial layer made of silicon. A conductivity type of the semiconductor substrate may be an n type or a p type. The epitaxial layer may be of an n type or a p type.

The semiconductor chip 41 has a first main surface 42 at one side, a second main surface 43 at another side, and chip side walls 44A to 44D connecting the first main surface 42 and the second main surface 43. The first main surface 42 and the second main surface 43 are formed to quadrilateral shapes (rectangular shapes in this embodiment) in a plan view as viewed from the normal direction Z thereto (hereinafter referred to simply as "plan view").

The chip side walls 44A to 44D include a first chip side wall 44A, a second chip side wall 44B, a third chip side wall 44C, and a fourth chip side wall 44D. The first chip side wall 44A and the second chip side wall 44B form long sides of the semiconductor chip 41. The first chip side wall 44A and the second chip side wall 44B extend along the first direction X and oppose each other in the second direction Y. The third chip side wall 44C and the fourth chip side wall 44D form short sides of the semiconductor chip 41. The third chip side wall 44C and the fourth chip side wall 44D extend in the second direction Y and oppose each other in the first direction X. The chip side walls 44A to 44D are constituted of ground surfaces.

The semiconductor device 5 further includes an insulating layer 51 that is formed on the first main surface 42 of the semiconductor chip 41. The insulating layer 51 has an insulating main surface 52 and insulating side walls 53A to 53D. The insulating main surface 52 is formed to a quadrilateral shape (rectangular shape in this embodiment) conforming to the first main surface 42 in plan view. The insulating main surface 52 extends in parallel to the first main surface 42.

The insulating side walls 53A to 53D include a first insulating side wall 53A, a second insulating side wall 53B, a third insulating side wall 53C, and a fourth insulating side wall 53D. The insulating side walls 53A to 53D extend toward the semiconductor chip 41 from peripheral edges of the insulating main surface 52 and are continuous to the chip side walls 44A to 44D. Specifically, the insulating side walls 53A to 53D are formed flush with the chip side walls 44A to 44D. The insulating side walls 53A to 53D form ground surfaces that are flush with the chip side walls 44A to 44D.

The insulating layer 51 is constituted of a multilayer insulating laminated structure that includes a lowermost insulating layer 55, an uppermost insulating layer 56, and a plurality (eleven in this embodiment) of interlayer insulating layers 57. The lowermost insulating layer 55 is an insulating layer that directly covers the first main surface 42. The uppermost insulating layer 56 is an insulating layer that forms the insulating main surface 52. The plurality of interlayer insulating layers 57 are insulating layers that are interposed between the lowermost insulating layer 55 and the uppermost insulating layer 56. In this embodiment, the lowermost insulating layer 55 has a single layer structure that includes silicon oxide. In this embodiment, the uppermost insulating layer 56 has a single layer structure that includes silicon oxide. A thickness of the lowermost insulating layer 55 and a thickness of the uppermost insulating layer 56 may each be not less than 1 μm and not more than 3 μm (for example, approximately 2 μm).

The plurality of interlayer insulating layers 57 each have a laminated structure that includes a first insulating layer 58 at the lowermost insulating layer 55 side and a second insulating layer 59 at the uppermost insulating layer 56 side. The first insulating layer 58 may include silicon nitride. The first insulating layer 58 is formed as an etching stopper layer with respect to the second insulating layer 59. A thickness of the first insulating layer 58 may be not less than 0.1 μm and not more than 1 μm (for example, approximately 0.3 μm).

The second insulating layer 59 is formed on the first insulating layer 58. The second insulating layer 59 includes an insulating material differing from the first insulating layer 58. The second insulating layer 59 may include silicon oxide. A thickness of the second insulating layer 59 may be not less than 1 μm and not more than 3 μm (for example, approximately 2 μm). The thickness of the second insulating layer 59 preferably exceeds the thickness of the first insulating layer 58.

A total thickness DT of the insulating layer 51 may be not less than 5 µm and not more than 50 µm. The total thickness DT of the insulating layer 51 and the number of laminated layers of the interlayer insulating layers 57 are arbitrary and are adjusted in accordance with a dielectric withstand voltage (dielectric breakdown resistance) to be realized. Also, insulating materials of the lowermost insulating layer 55, the uppermost insulating layer 56, and the interlayer insulating layers 57 are arbitrary and not restricted to specific insulating materials.

The semiconductor device 5 incudes a first functional device 45 that is formed in the insulating layer 51. The first functional device 45 includes one or a plurality (a plurality in this embodiment) of the transformers 21. That is, the semiconductor device 5 is constituted of a multichannel type device that includes the plurality of transformers 21. The plurality of transformers 21 are formed in an inner portion of the insulating layer 51 at intervals from the insulating side walls 53A to 53D. The plurality of transformers 21 are formed at intervals in the first direction X.

Specifically, the plurality of transformers 21 include a first transformer 21A, a second transformer 21B, a third transformer 21C, and a fourth transformer 21D that are formed in that order from the insulating side wall 53C side to the insulating side wall 53D side in plan view. The plurality of transformers 21A to 21D each have the same structure. In the following, the structure of the first transformer 21A shall be described as an example. Description of the structures of the second transformer 21B, the third transformer 21C, and the fourth transformer 21D shall be omitted since the description of the first transformer 21A applies thereto.

Referring to FIG. 6 to FIG. 9, the first transformer 21A includes a low potential coil 22 and a high potential coil 23. The low potential coil 22 is formed inside the insulating layer 51. The high potential coil 23 is formed inside the insulating layer 51 such as to oppose the low potential coil 22 in the normal direction Z. In this embodiment, the low potential coil 22 and the high potential coil 23 are formed in a region sandwiched by the lowermost insulating layer 55 and the uppermost insulating layer 56 (that is, in the plurality of interlayer insulating layers 57).

The low potential coil 22 is formed at the lowermost insulating layer 55 (semiconductor chip 41) side inside the insulating layer 51 and the high potential coil is formed at the uppermost insulating layer 56 (insulating main surface 52) side inside the insulating layer 51 with respect to the low potential coil 22. That is, the high potential coil 23 opposes the semiconductor chip 41 across the low potential coil 22. Arrangement locations of the low potential coil 22 and the high potential coil 23 are arbitrary. Also, it suffices that the high potential coil 23 opposes the low potential coil 22 across one or more interlayer insulating layers 57.

A distance (that is, the number of laminated layers of the interlayer insulating layers 57) between the low potential coil 22 and the high potential coil 23 is adjusted as appropriate in accordance with a dielectric withstand voltage and a field intensity between the low potential coil 22 and the high potential coil 23. In this embodiment, the low potential coil 22 is formed in the third interlayer insulating layer 57 as counted from the lowermost insulating layer 55 side. In this embodiment, the high potential coil 23 is formed in the first interlayer insulating layer 57 as counted from the uppermost insulating layer 56 side.

The low potential coil 22 is embedded in an interlayer insulating layer 57 such as to penetrate through the first insulating layer 58 and the second insulating layer 59. The low potential coil 22 includes a first inner terminal end 24, a first outer terminal end 25, and a first spiral portion 26 that is routed in a spiral between the first inner terminal end 24 and the first outer terminal end 25. The first spiral portion 26 is routed in a spiral that extends in an elliptical shape (oval shape) in plan view. A portion of the first spiral portion 26 that forms an innermost peripheral edge demarcates a first inner region 66 of elliptical shape in plan view.

The number of windings of the first spiral portion 26 may be not less than 5 and not more than 30. A width of the first spiral portion 26 may be not less than 0.1 µm and not more than 5 µm. The width of the first spiral portion 26 is preferably not less than 1 µm and not more than 3 µm. The width of the first spiral portion 26 is defined by a width in a direction orthogonal to a spiral direction. A first winding pitch of the first spiral portion 26 may be not less than 0.1 µm and not more than 5 µm. The first winding pitch is preferably not less than 1 µm and not more than 3 µm. The first winding pitch is defined by a distance between two portions of the first spiral portion 26 that are adjacent in the direction orthogonal to the spiral direction.

A winding shape of the first spiral portion 26 and a planar shape of the first inner region 66 are arbitrary and are not restricted to the embodiment shown in FIG. 6, etc. The first spiral portion 26 may be wound in a polygonal shape such as a triangular shape, a quadrilateral shape, etc., or in a circular shape in plan view. The first inner region 66 may be demarcated in a polygonal shape such as a triangular shape, a quadrilateral shape, etc., or in a circular shape in plan view in accordance with the winding shape of the first spiral portion 26.

The low potential coil 22 may include at least one among titanium, titanium nitride, copper, aluminum, and tungsten. The low potential coil 22 may have a laminated structure that includes a barrier layer and a main body layer. The barrier layer demarcates a recess space inside the interlayer insulating layer 57. The main body layer is embedded in the recess space demarcated by the barrier layer. The barrier layer may include at least one among titanium and titanium nitride. The main body layer may include at least one among copper, aluminum, and tungsten.

The high potential coil 23 is embedded in an interlayer insulating layer 57 such as to penetrate through the first insulating layer 58 and the second insulating layer 59. The high potential coil 23 includes a second inner terminal end 27, a second outer terminal end 28, and a second spiral portion 29 that is routed in a spiral between the second inner terminal end 27 and the second outer terminal end 28. The second spiral portion 29 is routed in a spiral that extends in an elliptical shape (oval shape) in plan view. In this embodiment, a portion of the second spiral portion 29 that forms an innermost peripheral edge demarcates a second inner region 67 of elliptical shape in plan view. The second inner region 67 of the second spiral portion 29 opposes the first inner region 66 of the first spiral portion 26 in the normal direction Z.

The number of windings of the second spiral portion 29 may be not less than 5 and not more than 30. The number of windings of the second spiral portion 29 with respect to the number of windings of the first spiral portion 26 is adjusted in accordance with a voltage value to be boosted. The number of windings of the second spiral portion 29 preferably exceeds the number of windings of the first spiral portion 26. As a matter of course, the number of windings of the second spiral portion 29 may be less than the number of windings of the first spiral portion 26 or may be equal to the number of windings of the first spiral portion 26.

A width of the second spiral portion 29 may be not less than 0.1 µm and not more than 5 µm. The width of the second spiral portion 29 is preferably not less than 1 µm and not more than 3 µm. The width of the second spiral portion 29 is defined by a width in the direction orthogonal to the spiral direction. The width of the second spiral portion 29 is preferably equal to the width of the first spiral portion 26.

A second winding pitch of the second spiral portion 29 may be not less than 0.1 µm and not more than 5 µm. The second winding pitch is preferably not less than 1 µm and not more than 3 µm. The second winding pitch is defined by a distance between two portions of the second spiral portion 29 that are adjacent in the direction orthogonal to the spiral direction. The second winding pitch is preferably equal to the first winding pitch of the first spiral portion 26.

A winding shape of the second spiral portion 29 and a planar shape of the second inner region 67 are arbitrary and are not restricted to the embodiment shown in FIG. 7, etc. The second spiral portion 29 may be wound in a polygonal shape such as a triangular shape, a quadrilateral shape, etc., or in a circular shape in plan view. The second inner region 67 may be demarcated in a polygonal shape such as a triangular shape, a quadrilateral shape, etc., or in a circular shape in plan view in accordance with the winding shape of the second spiral portion 29.

The high potential coil 23 is preferably formed of the same conductive materials as the low potential coil 22. That is, as with the low potential coil 22, the high potential coil 23 preferably includes a barrier layer and a main body layer.

Referring to FIG. 5, the semiconductor device 5 includes the plurality (twelve in this embodiment) of the low potential terminals 11 and the plurality (twelve in this embodiment) of the high potential terminals 12. The plurality of low potential terminals 11 are electrically connected respectively to the low potential coils 22 of the corresponding transformers 21A to 21D. The plurality of high potential terminals 12 are electrically connected respectively to the high potential coils 23 of the corresponding transformers 21A to 21D.

The plurality of low potential terminals 11 are formed on the insulating main surface 52 of the insulating layer 51. Specifically, the plurality of low potential terminals 11 are formed in a region at the insulating side wall 53B side at intervals in the second direction Y from the plurality of transformers 21A to 21D and are aligned at intervals in the first direction X.

The plurality of low potential terminals 11 include first low potential terminals 11A, second low potential terminals 11B, third low potential terminals 11C, fourth low potential terminals 11D, fifth low potential terminals 11E, and sixth low potential terminals 11F. In this embodiment, two of each of the plurality of low potential terminals 11A to 11F are formed. The number of each of the plurality of low potential terminals 11A to 11F is arbitrary.

The first low potential terminals 11A oppose the first transformer 21A in the second direction Y in plan view. The second low potential terminals 11B oppose the second transformer 21B in the second direction Y in plan view. The third low potential terminals 11C oppose the third transformer 21C in the second direction Y in plan view. The fourth low potential terminals 11D oppose the fourth transformer 21D in the second direction Y in plan view. The fifth low potential terminals 11E are formed in a region between the first low potential terminals 11A and the second low potential terminals 11B in plan view. The sixth low potential terminals 11F are formed in a region between the third low potential terminals 11C and the fourth low potential terminals 11D in plan view.

The first low potential terminals 11A are electrically connected to the first inner terminal end 24 of the first transformer 21A (low potential coil 22). The second low potential terminals 11B are electrically connected to the first inner terminal end 24 of the second transformer 21B (low potential coil 22). The third low potential terminals 11C are electrically connected to the first inner terminal end 24 of the third transformer 21C (low potential coil 22). The fourth low potential terminals 11D are electrically connected to the first inner terminal end 24 of the fourth transformer 21D (low potential coil 22).

The fifth low potential terminals 11E are electrically connected to the first outer terminal end 25 of the first transformer 21A (low potential coil 22) and the first outer terminal end 25 of the second transformer 21B (low potential coil 22). The sixth low potential terminals 11F are electrically connected to the first outer terminal end 25 of the third transformer 21C (low potential coil 22) and the first outer terminal end 25 of the fourth transformer 21D (low potential coil 22).

The plurality of high potential terminals 12 are formed on the insulating main surface 52 of the insulating layer 51 at intervals from the plurality of low potential terminals 11. Specifically, the plurality of high potential terminals 12 are formed in a region at the insulating side wall 53A side at intervals in the second direction Y from the plurality of low potential terminals 11 and are aligned at intervals in the first direction X.

The plurality of high potential terminals 12 are respectively formed in regions in proximity to the corresponding transformers 21A to 21D in plan view. That the high potential terminals 12 are in proximity to the transformers 21A to 21D means that distances between the high potential terminals 12 and the transformer 21 are less than distances between the low potential terminals 11 and the high potential terminals 12 in plan view.

Specifically, the plurality of high potential terminals 12 are formed at intervals along the first direction X such as to oppose the plurality of transformers 21A to 21D along the first direction X in plan view. More specifically, the plurality of high potential terminals 12 are formed at intervals along the first direction X such as to be positioned in the second inner regions 67 of the high potential coils 23 and regions between adjacent high potential coils 23 in plan view. The plurality of high potential terminals 12 are thereby aligned in a single row together with the plurality of transformers 21A to 21D in the first direction X in plan view.

The plurality of high potential terminals 12 include first high potential terminals 12A, second high potential terminals 12B, third high potential terminals 12C, fourth high potential terminals 12D, fifth high potential terminals 12E, and sixth high potential terminals 12F. In this embodiment, two of each of the plurality of high potential terminals 12A to 12F are formed. The number of each of the plurality of high potential terminals 12A to 12F is arbitrary.

The first high potential terminals 12A are formed in the second inner region 67 of the first transformer 21A (high potential coil 23) in plan view. The second high potential terminals 12B are formed in the second inner region 67 of the second transformer 21B (high potential coil 23) in plan view. The third high potential terminals 12C are formed in the second inner region 67 of the third transformer 21C (high potential coil 23) in plan view. The fourth high potential terminals 12D are formed in the second inner region 67 of the fourth transformer 21D (high potential coil 23) in plan view. The fifth high potential terminals 12E are formed in a region between the first transformer 21A and the second transformer 21B in plan view. The sixth high potential terminals 12F are formed in a region between the third transformer 21C and the fourth transformer 21D in plan view.

The first high potential terminals 12A are electrically connected to the second inner terminal end 27 of the first transformer 21A (high potential coil 23). The second high potential terminals 12B are electrically connected to the second inner terminal end 27 of the second transformer 21B (high potential coil 23). The third high potential terminals 12C are electrically connected to the second inner terminal end 27 of the third transformer 21C (high potential coil 23). The fourth high potential terminals 12D are electrically connected to the second inner terminal end 27 of the fourth transformer 21D (high potential coil 23).

The fifth high potential terminals 12E are electrically connected to the second outer terminal end 28 of the first transformer 21A (high potential coil 23) and the second outer terminal end 28 of the second transformer 21B (high potential coil 23). The sixth high potential terminals 12F are electrically connected to the second outer terminal end 28 of the third transformer 21C (high potential coil 23) and the second outer terminal end 28 of the fourth transformer 21D (high potential coil 23).

Referring to FIG. 6 to FIG. 9, the semiconductor device 5 includes first low potential wirings 31, second low potential wirings 32, first high potential wirings 33, and second high potential wirings 34 that are respectively formed inside the insulating layer 51. In this embodiment, a plurality of the first low potential wirings 31, a plurality of the second low potential wirings 32, a plurality of the first high potential wirings 33, and a plurality of the second high potential wirings 34 are formed.

First low potential wirings 31 and a second low potential wiring 32 fix the low potential coil 22 of the first transformer 21A and the low potential coil 22 of the second transformer 21B at the same potential. Also, first low potential wirings 31 and a second low potential wiring 32 fix the low potential coil 22 of the third transformer 21C and the low potential coil 22 of the fourth transformer 21D at the same potential. In this embodiment, the first low potential wirings 31 and the second low potential wirings 32 fix the low potential coils 22 of all transformers 21A to 21D at the same potential.

First high potential wirings 33 and a second high potential wiring 34 fix the high potential coil 23 of the first transformer 21A and the high potential coil 23 of the second transformer 21B at the same potential. Also, first high potential wirings 33 and a second high potential wiring 34 fix the high potential coil 23 of the third transformer 21C and the high potential coil 23 of the fourth transformer 21D at the same potential. In this embodiment, the first high potential wirings 33 and the second high potential wirings 34 fix the high potential coils 23 of all transformers 21A to 21D at the same potential.

The plurality of first low potential wirings 31 are electrically connected respectively to the corresponding low potential terminals 11A to 11D and the first inner terminal ends 24 of the corresponding transformers 21A to 21D (low potential coils 22). The plurality of first low potential wirings 31 have the same structure. In the following, the structure of the first low potential wiring 31 that is connected to the first low potential terminals 11A and the first transformer 21A shall be described as an example. Description of the structures of the other first low potential wirings 31 shall be omitted since the description of the first low potential wiring 31 connected to the first transformer 21A applies thereto.

The first low potential wiring 31 includes a penetrating wiring 71, a low potential connection wiring 72, a lead-out wiring 73, a first connection plug electrode 74, a second connection plug electrode 75, one or a plurality (a plurality in this embodiment) of pad plug electrodes 76, and one or a plurality (a plurality in this embodiment) of substrate plug electrodes 77.

The penetrating wiring 71, the low potential connection wiring 72, the lead-out wiring 73, the first connection plug electrode 74, the second connection plug electrode 75, the pad plug electrodes 76, and the substrate plug electrodes 77 are preferably formed respectively of the same conductive materials as the low potential coils 22, etc. That is, as with the low potential coils 22, etc., each of the penetrating wiring 71, the low potential connection wiring 72, the lead-out wiring 73, the first connection plug electrode 74, the second connection plug electrode 75, the pad plug electrodes 76, and the substrate plug electrodes 77 preferably includes a barrier layer and a main body layer.

The penetrating wiring 71 penetrates through a plurality of the interlayer insulating layers 57 and extends as a column that extends along the normal direction Z in the insulating layer 51. In this embodiment, the penetrating wiring 71 is formed in a region of the insulating layer 51 between the lowermost insulating layer 55 and the uppermost insulating layer 56. The penetrating wiring 71 has an upper end portion at the uppermost insulating layer 56 side and a lower end portion at the lowermost insulating layer 55 side. The upper end portion of the penetrating wiring 71 is formed in the same interlayer insulating layer 57 as the high potential coils 23 and is covered by the uppermost insulating layer 56. The lower end portion of the penetrating wiring 71 is formed in the same interlayer insulating layer 57 as the low potential coils 22.

In this embodiment, the penetrating wiring 71 includes a first electrode layer 78, a second electrode layer 79, and a plurality of wiring plug electrodes 80. With the penetrating wiring 71, the first electrode layer 78, the second electrode layer 79, and the wiring plug electrodes 80 are respectively formed of the same conductive materials as the low potential coils 22, etc. That is, as with the low potential coils 22, etc., each of the first electrode layer 78, the second electrode layer 79, and the wiring plug electrodes 80 includes a barrier layer and a main body layer.

The first electrode layer 78 forms the upper end portion of the penetrating wiring 71. The second electrode layer 79 forms the lower end portion of the penetrating wiring 71. The first electrode layer 78 is formed as an island and opposes low potential terminals 11 (the first low potential terminals 11A) in the normal direction Z. The second electrode layer 79 is formed as an island and opposes the first electrode layer 78 in the normal direction Z.

The plurality of wiring plug electrodes 80 are respectively embedded in the plurality of interlayer insulating layers 57 that are positioned in a region between the first electrode layer 78 and the second electrode layer 79. The plurality of wiring plug electrodes 80 are laminated from the lowermost insulating layer 55 toward the uppermost insulating layer 56 such as to be electrically connected to each other and electrically connect the first electrode layer 78 and the second electrode layer 79. Each of the plurality of wiring plug electrodes 80 has a planar area less than a planar area of the first electrode layer 78 and a planar area of the second electrode layer 79.

The number of laminated layers of the plurality of wiring plug electrodes 80 matches the number of laminated layers of the plurality of interlayer insulating layers 57. Although in this embodiment, six wiring plug electrodes 80 are embedded in each interlayer insulating layer 57, the number of wiring plug electrodes 80 embedded in each interlayer insulating layer 57 is arbitrary. As a matter of course, one or a plurality of wiring plug electrodes 80 that penetrate through a plurality of the interlayer insulating layers 57 may be formed.

The low potential connection wiring 72 is formed in the first inner region 66 of the first transformer 21A (low potential coil 22) inside the same interlayer insulating layer 57 as the low potential coil 22. The low potential connection wiring 72 is formed as an island and opposes high potential terminals 12 (the first high potential terminals 12A) in the normal direction Z. The low potential connection wiring 72 preferably has a planar area that exceeds the planar area of the wiring plug electrode 80. The low potential connection wiring 72 is electrically connected to the first inner terminal end 24 of the low potential coil 22.

The lead-out wiring 73 is formed in a region inside the interlayer insulating layers 57 between the semiconductor chip 41 and the penetrating wiring 71. In this embodiment, the lead-out wiring 73 is formed inside the first interlayer insulating layer 57 as counted from the lowermost insulating layer 55. The lead-out wiring 73 includes a first end portion at one side, a second end portion at another side, and a wiring portion that connects the first end portion and the second end portion. The first end portion of the lead-out wiring 73 is positioned in a region between the semiconductor chip 41 and the lower end portion of the penetrating wiring 71. The second end portion of the lead-out wiring 73 is positioned in a region between the semiconductor chip 41 and the low potential connection wiring 72. The wiring portion extends along the first main surface 42 of the semiconductor chip 41 and extends as a band in a region between the first end portion and the second end portion.

The first connection plug electrode 74 is formed in a region inside the interlayer insulating layers 57 between the penetrating wiring 71 and the lead-out wiring 73 and is electrically connected to the penetrating wiring 71 and the first end portion of the lead-out wiring 73. The second connection plug electrode 75 is formed in a region inside the interlayer insulating layers 57 between the low potential connection wiring 72 and the lead-out wiring 73 and is electrically connected to the low potential connection wiring 72 and the second end portion of the lead-out wiring 73.

The plurality of pad plug electrodes 76 are formed in a region inside the uppermost insulating layer 56 between the low potential terminals 11 (first low potential terminals 11A) and the penetrating wiring 71 and are each electrically connected to the low potential terminals 11 and the upper end portion of the penetrating wiring 71. The plurality of substrate plug electrodes 77 are formed in a region inside the lowermost insulating layer 55 between the semiconductor chip 41 and the lead-out wiring 73. In this embodiment, the substrate plug electrodes 77 are formed in a region between the semiconductor chip 41 and the first end portion of the lead-out wiring 73 and are each electrically connected to the semiconductor chip 41 and the first end portion of the lead-out wiring 73.

Referring to FIG. 9, the plurality of second low potential wirings 32 are electrically connected respectively to the corresponding low potential terminals 11E and 11F and the first outer terminal ends 25 of the low potential coils 22 of the corresponding transformers 21A to 21D. The plurality of second low potential wirings 32 each have the same structure. In the following, the structure of the second low potential wiring 32 that is connected to the fifth low potential terminals 11E and the first transformer 21A (second transformer 21B) shall be described as an example. Description of the structure of the other second low potential wiring 32 shall be omitted since the description of the second low potential wiring 32 connected to the first transformer 21A (second transformer 21B) applies thereto.

As with the first low potential wiring 31, the second low potential wiring 32 includes a penetrating wiring 71, a low potential connection wiring 72, a lead-out wiring 73, a first connection plug electrode 74, a second connection plug electrode 75, pad plug electrodes 76, and substrate plug electrodes 77. The second low potential wiring 32 has the same structure as the first low potential wiring 31 with the exception that the low potential connection wiring 72 is electrically connected to the first outer terminal end 25 of the first transformer 21A (low potential coil 22) and the first outer terminal end 25 of the second transformer 21B (low potential coil 22).

The low potential connection wiring 72 of the second low potential wiring 32 is formed in a periphery of the low potential coil 22 inside the same interlayer insulating layer 57 as the low potential coil 22. Specifically, the low potential connection wiring 72 is formed in a region between two low potential coils 22 that are adjacent in plan view. The pad plug electrodes 76 are formed in a region inside the uppermost insulating layer 56 between low potential terminals 11 (fifth low potential terminals 11E) and the low potential connection wiring 72 and are electrically connected to the low potential terminals 11 and the low potential connection wiring 72.

Referring to FIG. 8, the plurality of first high potential wirings 33 are electrically connected respectively to the corresponding high potential terminals 12A to 12D and the second inner terminal ends 27 of the corresponding transformers 21A to 21D (high potential coils 23). The plurality of first high potential wirings 33 each have the same structure. In the following, the structure of the first high potential wiring 33 that is connected to the first high potential terminals 12A and the first transformer 21A shall be described as an example. Description of the structures of the other first high potential wirings 33 shall be omitted since the description of the first high potential wiring 33 connected to the first transformer 21A applies thereto.

The first high potential wiring 33 includes a high potential connection wiring 81 and one or a plurality (a plurality in this embodiment) of pad plug electrodes 82. The high potential connection wiring 81 and the pad plug electrodes 82 are preferably formed of the same conductive materials as the low potential coils 22, etc. That is, as with the low potential coils 22, etc., each of the high potential connection wiring 81 and the pad plug electrodes 82 preferably includes a barrier layer and a main body layer.

The high potential connection wiring 81 is formed in the second inner region 67 of the high potential coil 23 inside the same interlayer insulating layer 57 as the high potential coil 23. The high potential connection wiring 81 is formed as an island and opposes high potential terminals (the first high potential terminals 12A) in the normal direction Z. The high potential connection wiring 81 is electrically connected to the second inner terminal end 27 of the high potential coil 23. The high potential connection wiring 81 is formed at an interval from the low potential connection wiring 72 in plan view and does not oppose the low potential connection wiring 72 in the normal direction Z. Thereby, an insulation distance between the low potential connection wiring 72 and the high potential connection wiring 81 is increased and a dielectric withstand voltage of the insulating layer 51 is increased.

The plurality of pad plug electrodes 82 are formed in a region inside the uppermost insulating layer 56 between the high potential terminals 12 (first high potential terminals 12A) and the high potential connection wiring 81 and are each electrically connected to the high potential terminals 12 and the high potential connection wiring 81. The plurality of pad plug electrodes 82 each have a planar area less than a planar area of the high potential connection wiring 81 in plan view.

Referring to FIG. 9, the plurality of second high potential wirings 34 are electrically connected respectively to the corresponding high potential terminals 12E and 12F and the second outer terminal ends 28 of the corresponding transformers 21A to 21D (high potential coils 23). The plurality of second high potential wirings 34 each have the same structure. In the following, the structure of the second high potential wiring 34 that is connected to the fifth high potential terminals 12E and the first transformer 21A (second transformer 21B) shall be described as an example. Description of the structure of the other second high potential wiring 34 shall be omitted since the description of the second high potential wiring 34 connected to the first transformer 21A (second transformer 21B) applies thereto.

As with the first high potential wiring 33, the second high potential wiring 34 includes a high potential connection wiring 81 and pad plug electrodes 82. The second high potential wiring 34 has the same structure as the first high potential wiring 33 with the exception that the high potential connection wiring 81 is electrically connected to the second outer terminal end 28 of the first transformer 21A (high potential coil 23) and the second outer terminal end 28 of the second transformer 21B (high potential coil 23).

The high potential connection wiring 81 of the second high potential wiring 34 is formed in a periphery of the high potential coil 23 inside the same interlayer insulating layer 57 as the high potential coil 23. The high potential connection wiring 81 is formed in a region between two high potential coils 23 that are adjacent in plan view and opposes high potential terminals 12 (the fifth high potential terminals 12E) in the normal direction Z. The high potential connection wiring 81 is formed at an interval from the low potential connection wiring 72 in plan view and does not oppose the low potential connection wiring 72 in the normal direction Z.

The plurality of pad plug electrodes 82 are formed in a region inside the uppermost insulating layer 56 between the high potential terminals 12 (fifth high potential terminals 12E) and the high potential connection wiring 81 and are electrically connected respectively to the high potential terminals 12 and the high potential connection wiring 81.

Referring to FIG. 8 and FIG. 9, a distance D1 between the low potential terminals 11 and the high potential terminals 12 preferably exceeds a distance D2 between the low potential coils 22 and the high potential coils 23 (D2<D1). The distance D1 preferably exceeds the total thickness DT of the plurality of interlayer insulating layers 57 (DT<D1). A ratio D2/D1 of the distance D2 with respect to the distance D1 may be not less than 0.01 and not more than 0.1. The distance D1 is preferably not less than 100 μm and not more than 500 μm. The distance D2 may be not less than 1 μm and not more than 50 μm. The distance D2 is preferably not less than 5 μm and not more than 25 μm. The values of the distance D1 and the distance D2 are arbitrary and are adjusted as appropriate in accordance with the dielectric withstand voltage to be realized.

Referring to FIG. 7 to FIG. 12, the semiconductor device 5 includes a dummy pattern 85 that is embedded inside the insulating layer 51 such as to be positioned in peripheries of the transformers 21A to 21D in plan view. In FIG. 10 to FIG. 12, the dummy pattern 85 is indicated by hatching. The dummy pattern 85 includes a conductor. The dummy pattern 85 is preferably formed of the same conductive materials as the low potential coils 22, etc. That is, as with the low potential coils 22, etc., the dummy pattern 85 preferably includes a barrier layer and a main body layer.

The dummy pattern 85 is formed of a pattern (discontinuous pattern) differing from the high potential coils 23 and the low potential coils 22 and is independent of the transformers 21A to 21D. That is, the dummy pattern 85 does not function as the transformers 21A to 21D. The dummy pattern 85 is formed as a shield conductor layer that shields electric fields between the low potential coils 22 and the high potential coils 23 in the transformers 21A to 21D and suppresses electric field concentration with respect to the high potential coils 23.

In this embodiment, the dummy pattern 85 is routed in a form of dense lines such as to partially cover and partially expose a region of the periphery of one or a plurality of the high potential coils 23 in plan view. In this embodiment, the dummy pattern 85 is routed at a line density equal to a line density of the high potential coils 23 per unit area. That the line density of the dummy pattern 85 is equal to the line density of the high potential coils 23 means that the line density of the dummy pattern 85 falls within a range of ±20% of the line density of the high potential coils 23.

The dummy pattern 85 is preferably formed in regions in closer proximity to the high potential coils 23 than the low potential terminals 11 in plan view. That the dummy pattern 85 is in proximity to the high potential coils 23 in plan view means that a distance between the dummy pattern 85 and a high potential coil 23 is less than a distance between the dummy pattern 85 and a low potential terminal 11.

A depth position of the dummy pattern 85 in an interior of the insulating layer 51 is arbitrary and is adjusted in accordance with the electric field strengths to be relaxed. The dummy pattern 85 is preferably formed in regions in closer proximity to the high potential coils 23 than the low potential coils 22 in regard to the normal direction Z. That the dummy pattern 85 is in proximity to the high potential coils 23 in regard to the normal direction Z means that in regard to the normal direction Z, a distance between the dummy pattern 85 and a high potential coil 23 is less than a distance between the dummy pattern 85 and a low potential coil 22.

In this case, the electric field concentration with respect to the high potential coils 23 can be suppressed appropriately. The more the distance between the dummy pattern 85 and the high potential coils 23 in regard to the normal direction Z is decreased, the more the electric field concentration with respect to the high potential coils 23 can be suppressed. The dummy pattern 85 is preferably formed inside the same interlayer insulating layer 57 as the high potential coils 23. In this case, the electric field concentration with respect to the high potential coils 23 can be suppressed even more appropriately.

The dummy pattern 85 is preferably formed in the peripheries of the plurality of high potential coils 23 such as to be interposed in regions between adjacent ones of the plurality of high potential coils 23 in plan view. In this case, the undesirable electric field concentration with respect to the plurality of high potential coils 23 can be suppressed by using the regions between adjacent ones of the plurality of high potential coils 23.

The dummy pattern 85 is preferably interposed in regions between the low potential terminals 11 and the high potential coils 23 in plan view. In this case, undesirable conduction between the low potential terminals 11 and the high potential coils 23 due to the electric field concentration at the high potential coils 23 can be suppressed. The dummy pattern 85 is preferably interposed in regions between the low potential terminals 11 and the high potential terminals 12 in plan view. In this case, undesirable conduction between the low potential terminals 11 and the high potential terminals 12 due to the electric field concentration at the high potential coils 23 can be suppressed.

In this embodiment, the dummy pattern 85 is formed along the plurality of high potential coils 23 and is interposed in the regions between adjacent ones of the plurality of high potential coils 23 in plan view. Also, the dummy pattern 85 entirely surrounds a region that includes the plurality of high potential coils 23 and the plurality of high potential terminals 12 in plan view. Also, the dummy pattern 85 is interposed in the regions between the plurality of low potential terminals 11A to 11F and the plurality of high potential coils 23 in plan view. Also, the dummy pattern 85 is interposed in the regions between the plurality of low potential terminals 11A to 11F and the plurality of high potential terminals 12A to 12F in plan view.

Referring to FIG. 7 to FIG. 12, the dummy pattern includes a plurality of dummy patterns differing in electrical state. The dummy pattern 85 includes a high potential dummy pattern 86. The high potential dummy pattern 86 is formed inside the insulating layer 51 such as to be positioned in the peripheries of the transformers 21A to 21D in plan view. The high potential dummy pattern 86 is formed of a pattern (discontinuous pattern) differing from the high potential coils 23 and the low potential coils 22 and is independent of the transformers 21A to 21D. That is, the high potential dummy pattern 86 does not function as the transformers 21A to 21D.

In this embodiment, the high potential dummy pattern 86 is routed in a form of dense lines such as to partially cover and partially expose regions of the peripheries of the high potential coils 23 in plan view. In this embodiment, the high potential dummy pattern 86 is routed at a line density equal to the line density of the high potential coils 23 per unit area. That the line density of the high potential dummy pattern 86 is equal to the line density of the high potential coils 23 means that the line density of the high potential dummy pattern 86 falls within a range of ±20% of the line density of the high potential coils 23.

The high potential dummy pattern 86 shields the electric fields between the low potential coils 22 and the high potential coils 23 in the transformers 21A to 21D and suppresses the electric field concentration with respect to the high potential coils 23. Specifically, the high potential dummy pattern 86 shields the electric fields between the low potential coils 22 and the high potential coils 23 to keep electric fields leaking out to upper sides of the high potential coils 23 away from the high potential coils 23. Electric field concentration at the high potential coils 23 due to the electric fields leaking out to the upper sides of the high potential coils 23 is thereby suppressed.

A voltage exceeding a voltage applied to the low potential coils 22 is applied to the high potential dummy pattern 86. Voltage drops between the high potential coils 23 and the high potential dummy pattern 86 can thereby be suppressed and therefore, the electric field concentration with respect to the high potential coils 23 can be suppressed. Preferably, the voltage applied to the high potential coils 23 is applied to the high potential dummy pattern 86. That is, the high potential dummy pattern 86 is preferably fixed at the same potential as the high potential coils 23. The voltage drops between the high potential coils 23 and the high potential dummy pattern 86 can thereby be suppressed reliably and therefore, the electric field concentration with respect to the high potential coils 23 can be suppressed appropriately.

A depth position of the high potential dummy pattern 86 in the interior of the insulating layer 51 is arbitrary and is adjusted in accordance with the electric field strengths to be relaxed. The high potential dummy pattern 86 is preferably formed in regions in closer proximity to the high potential coils 23 than the low potential coils 22 in regard to the normal direction Z. That the high potential dummy pattern 86 is in proximity to the high potential coils 23 in regard to the normal direction Z means that in regard to the normal direction Z, a distance between the high potential dummy pattern 86 and a high potential coil 23 is less than a distance between the high potential dummy pattern 86 and a low potential coil 22.

In this case, the electric field concentration with respect to the high potential coils 23 can be suppressed appropriately. The more the distance between the high potential dummy pattern 86 and the high potential coils 23 in regard to the normal direction Z is decreased, the more the electric field concentration with respect to the high potential coils 23 can be suppressed. The high potential dummy pattern 86 is preferably formed inside the same interlayer insulating layer 57 as the high potential coils 23. In this case, the electric field concentration with respect to the high potential coils 23 can be suppressed even more appropriately.

The high potential dummy pattern 86 is preferably formed in regions in closer proximity to the high potential coils 23 than the low potential terminals 11 in plan view. That the high potential dummy pattern 86 is in proximity to the high potential coils 23 in plan view means that a distance between the high potential dummy pattern 86 and a high potential coil 23 is less than a distance between the high potential dummy pattern 86 and a low potential terminal 11.

The high potential dummy pattern 86 is preferably formed in the peripheries of the plurality of high potential coils 23 such as to be interposed in the regions between adjacent ones of the plurality of high potential coils 23 in plan view. In this case, the undesirable electric field concentration with respect to the plurality of high potential coils 23 can be suppressed by using the regions between adjacent ones of the plurality of high potential coils 23.

The high potential dummy pattern 86 is preferably interposed in the regions between the low potential terminals 11 and the high potential coils 23 in plan view. In this case, undesirable conduction between the low potential terminals 11 and the high potential coils 23 due to the electric field concentration at the high potential coils 23 can be suppressed. The high potential dummy pattern 86 is preferably interposed in the regions between the low potential terminals 11 and the high potential terminals 12 in plan view. In this case, undesirable conduction between the low potential terminals 11 and the high potential terminals 12 due to the electric field concentration at the high potential coils 23 can be suppressed.

In this embodiment, the high potential dummy pattern 86 is formed along the plurality of high potential coils 23 and interposed in the regions between adjacent ones of the plurality of high potential coils 23 in plan view. Also, the high potential dummy pattern 86 entirely surrounds the region that includes the plurality of high potential coils 23 and the plurality of high potential terminals 12 in plan view. Also, the high potential dummy pattern 86 is interposed in the regions between the plurality of low potential terminals 11A to 11F and the plurality of high potential coils 23 in plan view. Also, the high potential dummy pattern 86 is interposed in the regions between the plurality of low potential terminals 11A to 11F and the plurality of high potential terminals 12A to 12F in plan view.

In the regions between adjacent ones of the plurality of high potential coils 23 in plan view, the high potential dummy pattern 86 is routed around peripheries of the high potential terminals 12E and 12F such as to expose regions directly below the high potential terminals 12E and 12F. Portions of the high potential dummy pattern 86 may oppose the high potential terminals 12A to 12F in the normal direction Z. In this case, the high potential terminals 12E and 12F, like the high potential dummy pattern 86, shields the electric fields to suppress the electric fields leaking out to upper sides of the high potential coils 23. That is, the high potential terminals 12E and 12F are formed as shield conductor layers that, together with the high potential dummy pattern 86, suppress the electric field concentration with respect to the high potential coils 23.

The high potential dummy pattern 86 is preferably formed to a shape with ends. In this case, forming of a loop circuit (closed circuit) of current in the high potential dummy pattern 86 can be suppressed. Noise due to current flowing through the high potential dummy pattern 86 is thereby suppressed. Consequently, undesirable electric field concentration due to the noise can be suppressed and, at the same time, fluctuations in electrical characteristics of the transformers 21A to 21D can be suppressed.

Specifically, the high potential dummy pattern 86 includes a first high potential dummy pattern 87 and a second high potential dummy pattern 88. The first high potential dummy pattern 87 is formed in regions between adjacent ones of the plurality of transformers 21A to 21D (plurality of high potential coils 23) in plan view. The second high potential dummy pattern 88 is formed in a region outside the regions between adjacent ones of the plurality of transformers 21A to 21D (plurality of high potential coils 23) in plan view.

In the following, a region between the first transformer 21A (high potential coil 23) and the second transformer 21B (high potential coil 23) that are adjacent shall be called the first region 89. Also, a region between the second transformer 21B (high potential coil 23) and the third transformer 21C (high potential coil 23) shall be called the second region 90. Also, a region between the third transformer 21C (high potential coil 23) and the fourth transformer 21D (high potential coil 23) shall be called the third region 91.

In this embodiment, the first high potential dummy pattern 87 is electrically connected via the second high potential wiring 34 to high potential terminals 12 (the fifth high potential terminals 12E). Specifically, the first high potential dummy pattern 87 includes a first connection portion 92 connected to the second high potential wiring 34. The position of the first connection portion 92 is arbitrary. The first high potential dummy pattern 87 is thereby fixed at the same potential as the plurality of high potential coils 23.

Specifically, the first high potential dummy pattern 87 includes a first pattern 93 that is formed in the first region 89, a second pattern 94 that is formed in the second region 90, and a third pattern 95 that is formed in the third region 91. The first high potential dummy pattern 87 thereby suppresses the electric fields leaking out to the upper sides of the high potential coils 23 and suppresses the electric field concentration with respect to the adjacent ones of the plurality of high potential coils 23 in the first region 89, the second region 90, and the third region 91.

In this embodiment, the first pattern 93, the second pattern 94, and the third pattern 95 are formed integrally and are fixed at the same potential. The first pattern 93, the second pattern 94, and the third pattern 95 may be separated as long as the patterns are fixed at the same potential.

Referring to FIG. 7 and FIG. 10, the first pattern 93 is connected to the second high potential wiring 34 via the first connection portion 92. The first pattern 93 is routed in a form of dense lines such as to cover and hide a region of a portion of the first region 89 in plan view. The first pattern 93 is formed in the first region 89 at intervals from the high potential terminals 12 (fifth high potential terminals 12E) in plan view and does not oppose the high potential terminals 12 in the normal direction Z. Also, the first pattern 93 is formed at intervals from the low potential connection wirings 72 in plan view and does not oppose the low potential connection wirings 72 in the normal direction Z. Thereby, an insulation distance between the first pattern 93 and the low potential connection wirings 72 is increased and the dielectric withstand voltage of the insulating layer 51 is increased.

The first pattern 93 includes a first outer peripheral line 96, a second outer peripheral line 97, and a plurality of first intermediate lines 98. The first outer peripheral line 96 extends as a band along the periphery of the high potential coil 23 of the first transformer 21A. In this embodiment, the first outer peripheral line 96 is formed in a ring shape having an open end in the first region 89 in plan view. A width of the open end of the first outer peripheral line 96 is less than a width along the second direction Y of the high potential coil 23.

A width of the first outer peripheral line 96 may be not less than 0.1 μm and not more than 5 μm. The width of the first outer peripheral line 96 is preferably not less than 1 μm and not more than 3 μm. The width of the first outer peripheral line 96 is defined by a width in a direction orthogonal to a direction in which the first outer peripheral line 96 extends. The width of the first outer peripheral line 96 is preferably equal to the width of the high potential coil 23. That the width of the first outer peripheral line 96 is equal to the width of the high potential coil 23 means that the width of the first outer peripheral line 96 falls in a range of within ±20% of the width of the high potential coil 23.

A first pitch between the first outer peripheral line 96 and the high potential coil 23 (first transformer 21A) may be not less than 0.1 μm and not more than 5 μm. The first pitch is preferably not less than 1 μm and not more than 3 μm. The first pitch is preferably equal to the second winding pitch of the high potential coil 23. That the first pitch is equal to the first winding pitch means that the first pitch falls in a range of within ±20% of the first winding pitch.

The second outer peripheral line 97 extends as a band along the periphery of the high potential coil 23 of the second transformer 21B. In this embodiment, the second outer peripheral line 97 is formed in a ring shape having an open end in the first region 89 in plan view. A width of the open end of the second outer peripheral line 97 is less than the width of the high potential coil 23 along the second direction Y. The open end of the second outer peripheral line 97 opposes the open end of the first outer peripheral line 96 along the first direction X.

A width of the second outer peripheral line 97 may be not less than 0.1 μm and not more than 5 μm. The width of the second outer peripheral line 97 is preferably not less than 1

μm and not more than 3 μm. The width of the second outer peripheral line 97 is defined by a width in a direction orthogonal to a direction in which the second outer peripheral line 97 extends. The width of the second outer peripheral line 97 is preferably equal to the width of the high potential coil 23. That the width of the second outer peripheral line 97 is equal to the width of the high potential coil 23 means that the width of the second outer peripheral line 97 falls in a range of within ±20% of the width of the high potential coil 23.

A second pitch between the second outer peripheral line 97 and the high potential coil 23 (the second transformer 21B) may be not less than 0.1 μm and not more than 5 μm. The second pitch is preferably not less than 1 μm and not more than 3 μm. The second pitch is preferably equal to the second winding pitch of the high potential coil 23. That the second pitch is equal to the second winding pitch means that the second pitch falls in a range of within ±20% of the second winding pitch.

The plurality of first intermediate lines 98 extend as bands in a region of the first region 89 between the first outer peripheral line 96 and the second outer peripheral line 97. The plurality of first intermediate lines 98 include at least one (one in this embodiment) first connection line 99 that electrically connects the first outer peripheral line 96 and the second outer peripheral line 97.

From a standpoint of preventing the forming of a loop circuit of current, the plurality of first intermediate lines 98 preferably include just one first connection line 99. The position of the first connection line 99 is arbitrary. A slit 100 that interrupts a loop circuit of current is formed in at least one of the plurality of first intermediate lines 98. The position of the slit 100 is adjusted as appropriate by design of the plurality of first intermediate lines 98.

The plurality of first intermediate lines 98 are preferably formed as bands extending along a direction of opposing of the plurality of high potential coils 23. In this embodiment, the plurality of first intermediate lines are respectively formed as bands extending along the first direction X and are formed at intervals in the second direction Y. The plurality of first intermediate lines 98 are formed as stripes extending in the first direction X as a whole in plan view.

Specifically, the plurality of first intermediate lines 98 include a plurality of first lead-out portions 101 and a plurality of second lead-out portions 102. The plurality of first lead-out portions 101 are led out as stripes from the first outer peripheral line 96 toward the second outer peripheral line 97. Tip portions of the plurality of first lead-out portions 101 are formed at intervals to the second outer peripheral line 97 side from the first outer peripheral line 96.

The plurality of second lead-out portions 102 are led out as stripes from the second outer peripheral line 97 toward the first outer peripheral line 96. Tip portions of the plurality of second lead-out portions 102 are formed at intervals to the first outer peripheral line 96 side from the second outer peripheral line 97. In this embodiment, the plurality of second lead-out portions 102 are formed alternately with and at intervals from the plurality of first lead-out portions 101 in the second direction Y in a mode of sandwiching one first lead-out portion 101.

The plurality of second lead-out portions 102 may sandwich the plurality of first lead-out portions 101. Also, a group that includes the plurality of the second lead-out portions 102 may be formed such as to be adjacent to a group that includes the plurality of the first lead-out portions 101. The slit 100, the plurality of first lead-out portions 101, and the plurality of second lead-out portions 102 suppress the forming of a loop circuit of current in the first pattern 93.

A width of each first intermediate line 98 in regard to the second direction Y may be not less than 0.1 μm and not more than 5 μm. The width of the first intermediate line 98 is preferably not less than 1 μm and not more than 3 μm. The width of the first intermediate line 98 is preferably equal to the width of each high potential coil 23. That the width of the first intermediate line 98 is equal to the width of each high potential coil 23 means that the width of the first intermediate line 98 falls in a range of within ±20% of the width of each high potential coil 23.

Third pitches between two adjacent first intermediate lines 98 may be not less than 0.1 μm and not more than 5 μm. The third pitches are preferably not less than 1 μm and not more than 3 μm. Each third pitch is defined by a distance between adjacent ones of the plurality of first intermediate lines 98 in regard to the second direction Y. The third pitches are preferably equal to each other. That the third pitches are equal to each other means that the third pitches fall in a range of within ±20% of the third pitches. The third pitches are preferably equal to the second winding pitch of the high potential coil 23. That the third pitches are equal to the second winding pitch means that the third pitches fall in a range of within ±20% of the second winding pitch.

Referring to FIG. 7 and FIG. 11, the second pattern 94 is electrically connected to high potential terminals 12 via the first high potential wiring 33. In this embodiment, the second pattern 94 is electrically connected to the second high potential wiring 34 (fifth high potential terminals 12E) via the second outer peripheral line 97 of the first pattern 93. The second pattern 94 is routed in a form of dense lines such as to cover and hide the second region 90.

The second pattern 94 includes the second outer peripheral line 97 described above, a third outer peripheral line 103, and a plurality of second intermediate lines 104. The third outer peripheral line 103 extends as a band along the periphery of the high potential coil 23 of the third transformer 21C. In this embodiment, the third outer peripheral line 103 is formed in a ring shape having an open end in the third region 91 in plan view. A width of the open end of the third outer peripheral line 103 is less than a width along the second direction Y of the high potential coil 23 of the third transformer 21C.

A width of the third outer peripheral line 103 may be not less than 0.1 μm and not more than 5 μm. The width of the third outer peripheral line 103 is preferably not less than 1 μm and not more than 3 μm. The width of the third outer peripheral line 103 is defined by a width in a direction orthogonal to a direction in which the third outer peripheral line 103 extends. The width of the third outer peripheral line 103 is preferably equal to the width of the high potential coil 23. That the width of the third outer peripheral line 103 is equal to the width of the high potential coil 23 means that the width of the third outer peripheral line 103 falls in a range of within ±20% of the width of the high potential coil 23.

A fourth pitch between the third outer peripheral line 103 and the high potential coil 23 (the third transformer 21C) may be not less than 0.1 μm and not more than 5 μm. The fourth pitch is preferably not less than 1 μm and not more than 3 μm. The fourth pitch is preferably equal to the second winding pitch of the high potential coil 23. That the fourth pitch is equal to the second winding pitch means that the fourth pitch falls in a range of within ±20% of the second winding pitch.

The plurality of second intermediate lines 104 extend as bands in a region of the second region 90 between the second outer peripheral line 97 and the third outer peripheral line 103. The plurality of second intermediate lines 104 include at least one (one in this embodiment) second connection line 105 that electrically connects the second outer peripheral line 97 and the third outer peripheral line 103.

From the standpoint of preventing the forming of a loop circuit of current, the plurality of second intermediate lines 104 preferably include just one second connection line 105. The second connection line 105 may have a width exceeding a width of the other second intermediate lines 104. The position of the second connection line 105 is arbitrary. A slit 106 that interrupts a loop circuit of current is formed in at least one of the plurality of second intermediate lines 104. The position of the slit 106 is adjusted as appropriate by design of the plurality of second intermediate lines 104.

The plurality of second intermediate lines 104 are preferably formed as bands extending along a direction of opposing of the plurality of high potential coils 23. In this embodiment, the plurality of second intermediate lines 104 are respectively formed as bands extending along the first direction X and are formed at intervals in the second direction Y. The plurality of second intermediate lines 104 are formed as stripes extending in the first direction X as a whole in plan view.

Specifically, the plurality of second intermediate lines 104 include a plurality of third lead-out portions 107 and a plurality of fourth lead-out portions 108. The plurality of third lead-out portions 107 are led out as stripes from the second outer peripheral line 97 toward the third outer peripheral line 103. Tip portions of the plurality of third lead-out portions 107 are formed at intervals to the second outer peripheral line 97 side from the third outer peripheral line 103.

The plurality of fourth lead-out portions 108 are led out as stripes from the third outer peripheral line 103 toward the second outer peripheral line 97. Tip portions of the plurality of fourth lead-out portions 108 are formed at intervals to the third outer peripheral line 103 side from the second outer peripheral line 97. In this embodiment, the plurality of fourth lead-out portions 108 are formed alternately with and at intervals from the plurality of third lead-out portions 107 in the second direction Y in a mode of sandwiching one third lead-out portion 107.

The plurality of fourth lead-out portions 108 may sandwich the plurality of third lead-out portions 107. Also, a group that includes the plurality of the fourth lead-out portions 108 may be formed such as to be adjacent to a group that includes the plurality of the third lead-out portions 107. The slit 106, the plurality of third lead-out portions 107, and the plurality of fourth lead-out portions 108 suppress the forming of a loop circuit of current in the second pattern 94.

The width of each second intermediate line 104 in regard to the second direction Y may be not less than 0.1 μm and not more than 5 μm. The width of the second intermediate line 104 is preferably not less than 1 μm and not more than 3 μm. The width of the second intermediate line 104 is preferably equal to the width of each high potential coil 23. That the width of the second intermediate line 104 is equal to the width of each high potential coil 23 means that the width of the second intermediate line 104 falls in a range of within ±20% of the width of each high potential coil 23.

Fifth pitches between two adjacent second intermediate lines 104 may be not less than 0.1 μm and not more than 5 μm. The fifth pitches are preferably not less than 1 μm and not more than 3 μm. Each fifth pitch is defined by a distance between adjacent ones of the plurality of second intermediate lines 104 in regard to the second direction Y. The fifth pitches are preferably equal to each other. That the fifth pitches are equal to each other means that the fifth pitches fall in a range of within ±20% of the fifth pitches. The fifth pitches are preferably equal to the second winding pitch of the high potential coil 23. That the fifth pitches are equal to the second winding pitch means that the fifth pitches fall in a range of within ±20% of the second winding pitch.

Referring to FIG. 7 and FIG. 12, the third pattern 95 is electrically connected to the second high potential wiring 34. In this embodiment, the third pattern 95 is electrically connected to the second high potential wiring 34 via the second pattern 94 and the first pattern 93. The third pattern 95 is routed in a form of dense lines such as to cover and hide a region of a portion of the third region 91. The third pattern 95 is formed in the third region 91 at intervals from high potential terminals 12 (the sixth high potential terminals 12F) in plan view and does not oppose the high potential terminals 12 in the normal direction Z.

The third pattern 95 is formed at intervals from the low potential connection wirings 72 in plan view and does not oppose the low potential connection wirings 72 in the normal direction Z. Thereby, an insulation distance between the third pattern 95 and the low potential connection wirings 72 is increased in regard to the normal direction Z and the dielectric withstand voltage of the insulating layer 51 is increased.

The third pattern 95 includes the third outer peripheral line 103 described above, a fourth outer peripheral line 109, and a plurality of third intermediate lines 110. The fourth outer peripheral line 109 extends as a band along the periphery of the high potential coil 23 of the fourth transformer 21D. In this embodiment, the fourth outer peripheral line 109 is formed in a ring shape having an open end in the third region 91 in plan view. A width of the open end of the fourth outer peripheral line 109 is less than the width along the second direction Y of the high potential coil 23 of the fourth transformer 21D. The open end of the fourth outer peripheral line 109 opposes the open end of the third outer peripheral line 103 along the first direction X.

A width of the fourth outer peripheral line 109 may be not less than 0.1 μm and not more than 5 μm. The width of the fourth outer peripheral line 109 is preferably not less than 1 μm and not more than 3 μm. The width of the fourth outer peripheral line 109 is defined by a width in a direction orthogonal to a direction in which the fourth outer peripheral line 109 extends. The width of the fourth outer peripheral line 109 is preferably equal to the width of the high potential coil 23. That the width of the fourth outer peripheral line 109 is equal to the width of the high potential coil 23 means that the width of the fourth outer peripheral line 109 falls in a range of within ±20% of the width of the high potential coil 23.

A sixth pitch between the fourth outer peripheral line 109 and the high potential coil 23 (fourth transformer 21D) may be not less than 0.1 μm and not more than 5 μm. The sixth pitch is preferably not less than 1 μm and not more than 3 μm. The sixth pitch is preferably equal to the second winding pitch of the high potential coil 23. That the sixth pitch is equal to the second winding pitch means that the sixth pitch falls in a range of within ±20% of the second winding pitch.

The plurality of third intermediate lines 110 extend as bands in a region of the third region 91 between the third outer peripheral line 103 and the fourth outer peripheral line 109. The plurality of third intermediate lines 110 include at least one (one in this embodiment) third connection line 111 that electrically connects the third outer peripheral line 103 and the fourth outer peripheral line 109.

From a standpoint of preventing the forming of a loop circuit of current, the plurality of third intermediate lines 110 preferably include just one third connection line 111. The position of the third connection line 111 is arbitrary. A slit 112 that interrupts a loop circuit of current is formed in at least one of the plurality of third intermediate lines 110. The position of the slit 112 is adjusted as appropriate by design of the plurality of third intermediate lines 110.

The plurality of third intermediate lines 110 are preferably formed as bands extending along a direction of opposing of the plurality of high potential coils 23. In this embodiment, the plurality of third intermediate lines 110 are respectively formed as bands extending in the first direction X and are formed at intervals in the second direction Y. The plurality of third intermediate lines 110 are formed as stripes as a whole in plan view.

In this embodiment, the plurality of third intermediate lines 110 include a plurality of fifth lead-out portions 113 and a plurality of sixth lead-out portions 114. The plurality of fifth lead-out portions 113 are led out as stripes from the third outer peripheral line 103 toward the fourth outer peripheral line 109. Tip portions of the plurality of fifth lead-out portions 113 are formed at intervals to the third outer peripheral line 103 side from the fourth outer peripheral line 109.

The plurality of sixth lead-out portions 114 are led out as stripes from the fourth outer peripheral line 109 toward the third outer peripheral line 103. Tip portions of the plurality of sixth lead-out portions 114 are formed at intervals to the fourth outer peripheral line 109 side from the third outer peripheral line 103. In this embodiment, the plurality of sixth lead-out portions 114 are formed alternately with and at intervals from the plurality of fifth lead-out portions 113 in the second direction Y in a mode of sandwiching one fifth lead-out portion 113.

The plurality of sixth lead-out portions 114 may sandwich the plurality of fifth lead-out portions 113. Also, a group that includes the plurality of the sixth lead-out portions 114 may be formed such as to be adjacent to a group that includes the plurality of the fifth lead-out portions 113. The slit 112, the plurality of fifth lead-out portions 113, and the plurality of sixth lead-out portions 114 suppress the forming of a loop circuit of current in the third pattern 95.

A width of each third intermediate line 110 in regard to the second direction Y may be not less than 0.1 µm and not more than 5 µm. The width of the third intermediate line 110 is preferably not less than 1 µm and not more than 3 µm. The width of the third intermediate line 110 is preferably equal to the width of each high potential coil 23. That the width of the third intermediate line 110 is equal to the width of each high potential coil 23 means that the width of the third intermediate line 110 falls in a range of within ±20% of the width of each high potential coil 23.

Seventh pitches between two adjacent third intermediate lines 110 may be not less than 0.1 µm and not more than 5 µm. The seventh pitches are preferably not less than 1 µm and not more than 3 µm. Each seventh pitch is defined by a distance between adjacent ones of the plurality of third intermediate lines 110 in regard to the second direction Y. The seventh pitches are preferably equal to each other. That the seventh pitches are equal to each other means that the seventh pitches fall in a range of within ±20% of the seventh pitches. The seventh pitches are preferably equal to the second winding pitch of each high potential coil 23. That the seventh pitches are equal to the second winding pitch means that the seventh pitches fall in a range of within ±20% of the second winding pitch.

Referring to FIG. 7 to FIG. 12, in this embodiment, the second high potential dummy pattern 88 is electrically connected via the first high potential dummy pattern 87 to the high potential terminals 12. Specifically, the second high potential dummy pattern 88 includes a second connection portion 115 connected to the first high potential dummy pattern 87. The position of the second connection portion 115 is arbitrary. The second high potential dummy pattern 88 is thereby fixed at the same potential as the plurality of high potential coils 23.

The second high potential dummy pattern 88 suppresses the electric fields leaking out to the upper sides of the high potential coils 23 and suppresses the electric field concentration with respect to the plurality of high potential coils 23 in a region outside the first region 89, the second region 90, and the third region 91. In this embodiment, the second high potential dummy pattern 88 entirely surrounds the region that includes the plurality of high potential coils 23 and the plurality of high potential terminals 12A to 12F in plan view. In this embodiment, the second high potential dummy pattern 88 is formed to an oval annular shape (elliptical annular shape) in plan view.

The second high potential dummy pattern 88 is thereby interposed in the regions between the plurality of low potential terminals 11A to 11F and the plurality of high potential coils 23 in plan view. Also, the second high potential dummy pattern 88 is interposed in the regions between the plurality of low potential terminals 11A to 11F and the plurality of high potential terminals 12A to 12F in plan view.

The second high potential dummy pattern 88 includes a plurality (six in this embodiment) of high potential lines 116A, 116B, 116C, 116D, 116E, and 116F. The number of high potential lines is adjusted in accordance with the electric fields to be relaxed. The plurality of high potential lines 116A to 116F are formed at intervals in that order in directions away from the plurality of high potential coils 23.

The plurality of high potential lines 116A to 116F entirely surround the plurality of high potential coils in plan view. Specifically, the plurality of high potential lines 116A to 116F entirely surround the region that includes the plurality of high potential coils 23 and the plurality of high potential terminals 12A to 12F in plan view. In this embodiment, the plurality of high potential lines 116A to 116F are formed to oval annular shapes (elliptical annular shapes) in plan view.

The plurality of high potential lines 116A to 116F each have a slit 117 formed therein that interrupts a loop circuit of current. The positions of the slits 117 are adjusted as appropriate by design of the plurality of high potential lines 116A to 116F.

A width of each of the high potential lines 116A to 116F may be not less than 0.1 µm and not more than 5 µm. The width of each of the high potential lines 116A to 116F is preferably not less than 1 µm and not more than 3 µm. The width of each of the high potential lines 116A to 116F is defined by a width in a direction orthogonal to a direction in which the high potential lines 116A to 116F extend. The width of each of the high potential lines 116A to 116F is preferably equal to the width of each high potential coil 23. That the width of each of the high potential lines 116A to 116F is equal to the width of each high potential coil 23 means that the width of each of the high potential lines 116A to 116F falls in a range of within ±20% of the width of each high potential coil 23.

Eighth pitches between two adjacent ones of the high potential lines 116A to 116F may be not less than 0.1 µm and not more than 5 µm. The eighth pitches are preferably not less than 1 μm and not more than 3 μm. The eighth pitches are preferably equal to each other. That the eighth pitches are equal to each other means that the eighth pitches fall in a range of within ±20% of the eighth pitches.

A ninth pitch between the first high potential dummy pattern 87 and the second high potential dummy pattern 88 that are adjacent may be not less than 0.1 μm and not more than 5 μm. The ninth pitch is preferably not less than 1 μm and not more than 3 μm. The ninth pitches are preferably equal to the second winding pitch of the high potential coil 23. That the ninth pitches are equal to the second winding pitch means that the ninth pitches fall in a range of within ±20% of the second winding pitch. The number, width, pitches, etc., of the plurality of high potential lines 116A to 116F are arbitrary and adjusted in accordance with the electric fields to be relaxed.

Referring to FIG. 7 to FIG. 12, the dummy pattern 85 includes a floating dummy pattern 121 that is formed in an electrically floating state inside the insulating layer such as to be positioned in the peripheries of the transformers 21A to 21D in plan view. The floating dummy pattern 121 is formed of a pattern (discontinuous pattern) differing from the high potential coils 23 and the low potential coils 22 and is independent of the transformers 21A to 21D. That is, the floating dummy pattern 121 does not function as the transformers 21A to 21D.

In this embodiment, the floating dummy pattern 121 is routed in a form of dense lines such as to partially cover and partially expose the regions of the peripheries of the high potential coils 23 in plan view. The floating dummy pattern 121 may be formed to a shape with ends or to an endless shape.

The floating dummy pattern 121 is routed at a line density equal to the line density of the high potential coils 23 per unit area. That the line density of the floating dummy pattern 121 is equal to the line density of the high potential coils 23 means that the line density of the floating dummy pattern 121 falls within a range of ±20% of the line density of the high potential coils 23.

Also, the floating dummy pattern 121 is routed at the line density equal to the line density of the high potential dummy pattern 86 per unit area. That the line density of the floating dummy pattern 121 is equal to the line density of the high potential dummy pattern 86 means that the line density of the floating dummy pattern 121 falls within a range of ±20% of the line density of the high potential dummy pattern 86.

The floating dummy pattern 121 shields the electric fields between the low potential coils 22 and the high potential coils 23 in the transformers 21A to 21D and suppresses the electric field concentration with respect to the high potential coils 23. Specifically, by the floating dummy pattern 121, the electric fields leaking out to the upper sides of the high potential coils 23 are dispersed in directions away from the high potential coils 23. The electric field concentration with respect to the high potential coils 23 can thereby be suppressed.

Also, by the floating dummy pattern 121, electric fields leaking out to an upper side of the high potential dummy pattern 86 in a periphery of the high potential dummy pattern 86 are dispersed in directions away from the high potential coils 23 and the high potential dummy pattern 86. Thereby, electric field concentration with respect to the high potential dummy pattern 86 can be suppressed and, at the same time, the electric field concentration with respect to the high potential coils 23 can be suppressed appropriately.

A depth position of the floating dummy pattern 121 in the interior of the insulating layer 51 is arbitrary and is adjusted in accordance with the electric field strengths to be relaxed. The floating dummy pattern 121 is preferably formed in regions in closer proximity to the high potentials coil 23 than the low potential coils 22 in regard to the normal direction Z. That the floating dummy pattern 121 is in proximity to the high potential coils 23 in regard to the normal direction Z means that in regard to the normal direction Z, a distance between the floating dummy pattern 121 and a high potential coil 23 is less than a distance between the floating dummy pattern 121 and a low potential coil 22.

In this case, the electric field concentration with respect to the high potential coils 23 can be suppressed appropriately. The more the distance between the floating dummy pattern 121 and the high potential coils 23 in regard to the normal direction Z is decreased, the more the electric field concentration with respect to the high potential coils 23 can be suppressed. The floating dummy pattern 121 is preferably formed inside the same interlayer insulating layer 57 as the high potential coils 23. In this case, the electric field concentration with respect to the high potential coils 23 can be suppressed even more appropriately.

The floating dummy pattern 121 is preferably interposed in the regions between the low potential terminals 11 and the high potential coils 23 in plan view. In this case, undesirable conduction between the low potential terminals 11 and the high potential coils 23 due to the electric field concentration at the high potential coils 23 can be suppressed. The floating dummy pattern 121 is preferably interposed in a region between the low potential terminals 11 and the high potential terminals 12 in plan view. In this case, undesirable conduction between the low potential terminals 11 and the high potential terminals 12 due to the electric field concentration at the high potential coils 23 can be suppressed.

In this embodiment, the floating dummy pattern 121 is formed along the plurality of high potential coils 23 in plan view. Specifically, the floating dummy pattern 121 entirely surrounds the region that includes the plurality of high potential coils 23 and the plurality of high potential terminals 12 in plan view. In this embodiment, the floating dummy pattern 121 entirely surrounds the region that includes the plurality of high potential coils 23 and the plurality of high potential terminals 12 across the high potential dummy pattern 86 (second high potential dummy pattern 88) in plan view.

Thereby, the floating dummy pattern 121 is interposed in a region between the plurality of low potential terminals 11A to 11F and the plurality of high potential coils 23 in plan view. Also, the floating dummy pattern 121 is interposed in a region between the plurality of low potential terminals 11A to 11F and the plurality of high potential terminals 12A to 12F in plan view.

The number of floating lines is arbitrary and adjusted in accordance with the electric fields to be relaxed. In this embodiment, the floating dummy pattern 121 includes a plurality (six in this embodiment) of floating lines 122A, 122B, 122C, 122D, 122E, and 122F. The plurality of floating lines 122A to 122F are formed at intervals in that order in directions away from the plurality of high potential coils 23.

The plurality of floating lines 122A to 122F entirely surround the plurality of high potential coils 23 in plan view. Specifically, the plurality of floating lines 122A to 122F entirely surround the region that includes the plurality of high potential coils 23 and the plurality of high potential terminals 12A to 12F across the high potential dummy pattern 86 in plan view. In this embodiment, the plurality of floating lines 122A to 122F are formed to oval annular shapes (elliptical annular shapes) in plan view.

A width of each of the floating lines 122A to 122F may be not less than 0.1 μm and not more than 5 μm. The width of each of the floating lines 122A to 122F is preferably not less than 1 μm and not more than 3 μm. The width of each of the floating lines 122A to 122F is defined by a width in a direction orthogonal to a direction in which the floating lines 122A to 122F extend.

Tenth pitches between two adjacent ones of the floating lines 122A to 122F may be not less than 0.1 μm and not more than 5 μm. The tenth pitches are preferably not less than 1 μm and not more than 3 μm. The width of each of the floating lines 122A to 122F is preferably equal to the width of each high potential coil 23. That the width of each of the floating lines 122A to 122F is equal to the width of each high potential coil 23 means that the width of each of the floating lines 122A to 122F falls in a range of within ±20% of the width of each high potential coil 23.

Eleventh pitches between the floating dummy pattern 121 and the high potential dummy pattern 86 (second high potential dummy pattern 88) may be not less than 0.1 μm and not more than 5 μm. The eleventh pitches are preferably not less than 1 μm and not more than 3 μm. The eleventh pitches are preferably equal to each other. That the eleventh pitches are equal to each other means that the eleventh pitches fall in a range of within ±20% of the eleventh pitches.

The eleventh pitches are preferably equal to the second winding pitch of the high potential coil 23. That the eleventh pitches between the floating lines 122A to 122F are equal to the second winding pitch means that the eleventh pitches fall in a range of within ±20% of the second winding pitch. In FIG. 10 to FIG. 12, an example where the eleventh pitches exceed the second winding pitch is shown for the sake of clarity.

A twelfth pitch between the floating dummy pattern 121 and the high potential dummy pattern 86 is preferably equal to the second winding pitch. That the twelfth pitch is equal to the second winding pitch means that the twelfth pitch falls in a range of within ±20% of the second winding pitch. The number, width, pitches, etc., of the plurality of floating lines 122A to 122F are adjusted in accordance with the electric fields to be relaxed and are not restricted to specific values.

Referring to FIG. 8 and FIG. 9, the semiconductor device 5 includes a second functional device 60 that is formed in the first main surface 42 of the semiconductor chip 41 in a device region 62. The second functional device 60 is formed using a surface layer portion of the first main surface 42 of the semiconductor chip 41 and/or a region on the first main surface 42 of the semiconductor chip 41 and are covered by the insulating layer 51 (lowermost insulating layer 55). In FIG. 8 and FIG. 9, the second functional device 60 is shown in simplified manner by broken lines indicated in the surface layer portion of the first main surface 42.

The second functional device 60 is electrically connected to the low potential terminals 11 via low potential wirings and are electrically connected to the high potential terminals 12 via high potential wirings. With the exception of being routed inside the insulating layer 51 such as to be connected to the second functional device 60, the low potential wirings have the same structure as the first low potential wirings 31 (second low potential wirings 32). With the exception of being routed inside the insulating layer 51 such as to be connected to the second functional device 60, the high potential wirings have the same structure as the first high potential wirings 33 (second high potential wirings 34). Specific description of the low potential wirings and the high potential wirings related to the second functional device 60 is omitted.

The second functional device 60 may include at least one among a passive device, a semiconductor rectifying device, and a semiconductor switching device. The passive device, the second functional device 60 may include a circuit network in which any two or more types of devices among the passive device, the semiconductor rectifying device, and the semiconductor switching device are selectively combined. The circuit network may form a portion or an entirety of an integrated circuit.

The passive device may include a semiconductor passive device. The passive device may include either or both of a resistor and a capacitor. The semiconductor rectifying device may include at least one among a pn junction diode, a PIN diode, a Zener diode, a Schottky barrier diode, and a fast recovery diode. The semiconductor switching device may include at least one among a BJT (bipolar junction transistor), a MISFET (metal insulator field effect transistor), an IGBT (insulated gate bipolar junction transistor), and a JFET (junction field effect transistor).

Referring to FIG. 8 and FIG. 9, the semiconductor device 5 further includes a seal conductor 61 that is embedded inside the insulating layer 51. The seal conductor 61 is embedded as a wall inside the insulating layer 51 at intervals from the insulating side walls 53A to 53D in plan view and demarcates the insulating layer 51 into the device region 62 and an outer region 63. The seal conductor 61 suppresses penetration of moisture and penetration of cracks into the device region 62 from the outer region 63.

The device region 62 is a region that includes the first functional device 45 (plurality of transformers 21), the second functional device 60, the plurality of low potential terminals 11, the plurality of high potential terminals 12, the first low potential wirings 31, the second low potential wirings 32, the first high potential wirings 33, the second high potential wirings 34, and the dummy pattern 85. The outer region 63 is a region outside the device region 62.

The seal conductor 61 is electrically separated from the device region 62. Specifically, the seal conductor is electrically separated from the first functional device 45 (plurality of transformers 21), the second functional device 60, the plurality of low potential terminals 11, the plurality of high potential terminals 12, the first low potential wirings 31, the second low potential wirings 32, the first high potential wirings 33, the second high potential wirings 34, and the dummy pattern 85. More specifically, the seal conductor 61 is fixed in an electrically floating state. The seal conductor 61 does not form a current path that is connected to the device region 62.

The seal conductor 61 is formed as a band along the insulating side walls 53 to 53D in plan view. In this embodiment, the seal conductor 61 is formed to a quadrilateral annular shape (specifically, a rectangular annular shape) in plan view. The seal conductor 61 thereby demarcates the device region 62 of a quadrilateral shape (specifically, a rectangular shape) in plan view. Also, the seal conductor 61 demarcates the outer region 63 of a quadrilateral annular shape (specifically, a rectangular annular shape) that surrounds the device region 62 in plan view.

Specifically, the seal conductor 61 has an upper end portion at the insulating main surface 52 side, a lower end portion at the semiconductor chip 41 side, and a wall portion that extends as a wall between the upper end portion and the lower end portion. In this embodiment, the upper end portion of the seal conductor 61 is formed at an interval to the semiconductor chip 41 side from the insulating main surface 52 and is positioned inside the insulating layer 51. In this embodiment, the upper end portion of the seal conductor 61 is covered by the uppermost insulating layer 56. The upper end portion of the seal conductor 61 may be covered by a one or a plurality of the interlayer insulating layers 57. The upper end portion of the seal conductor 61 may be exposed from the uppermost insulating layer 56. The lower end portion of the seal conductor 61 is formed at an interval to the upper end portion side from the semiconductor chip 41.

The seal conductor 61 is thus embedded inside the insulating layer 51 such as to be positioned at the semiconductor chip 41 side with respect to the plurality of low potential terminals 11 and the plurality of high potential terminals 12 in this embodiment. Also, inside the insulating layer 51, the seal conductor 61 opposes the first functional device 45 (plurality of transformers 21), the first low potential wirings 31, the second low potential wirings 32, the first high potential wirings 33, the second high potential wirings 34 and the dummy pattern 85 in directions parallel to the insulating main surface 52. Inside the insulating layer 51, the seal conductor 61 may also oppose a portion of the second functional device 60 in directions parallel to the insulating main surface 52.

The seal conductor 61 includes a plurality of seal plug conductors 64 and one or a plurality (a plurality in this embodiment) of seal via conductors 65. The number of seal via conductors 65 is arbitrary. The uppermost seal plug conductor 64 among the plurality of seal plug conductors 64 forms the upper end portion of the seal conductor 61. The plurality of seal via conductors 65 each form the lower end portion of the seal conductor 61. The seal plug conductors 64 and the seal via conductors 65 are preferably formed of the same conductive materials as the low potential coils 22. That is, as with the low potential coils 22, etc., each of the seal plug conductors 64 and the seal via conductors 65 preferably includes a barrier layer and a main body layer.

The plurality of seal plug conductors 64 are respectively embedded in the plurality of interlayer insulating layers 57 and are each formed to a quadrilateral annular shape (specifically, a rectangular annular shape) that surrounds the device region 62 in plan view. The plurality of seal plug conductors 64 are laminated from the lowermost insulating layer 55 toward the uppermost insulating layer 56 such as to be connected to each other. The number of laminated layers of the plurality of seal plug conductors 64 matches the number of laminated layers of the plurality of interlayer insulating layers 57. As a matter of course, one or a plurality of seal plug conductors 64 that penetrate through the plurality of the interlayer insulating layers 57 may be formed.

If one annular seal conductor 61 is formed by an assembly of the plurality of seal plug conductors 64, not all of the plurality of seal plug conductors 64 have to be formed to an annular shape. For example, at least one of the plurality of seal plug conductors 64 may be formed to a shape with ends. Also, at least one of the plurality of seal plug conductors 64 may be divided into a plurality of band shaped portions with ends. However, in view of the risk of penetration of moisture and cracks into the device region 62, the plurality of seal plug conductors 64 are preferably formed to endless shapes (annular shapes).

The plurality of seal via conductors 65 are each formed in a region in the lowermost insulating layer 55 between the semiconductor chip 41 and a seal plug conductor 64. The plurality of seal via conductors 65 are formed at intervals from the semiconductor chip 41 and are connected to the seal plug conductor 64. The plurality of seal via conductors 65 have a planar area less than a planar area of the seal plug conductor 64. If a single seal via conductor 65 is formed, the single seal via conductor 65 may have a planar area not less than planar area of the seal plug conductor 64.

A width of the seal conductor 61 may be not less than 0.1 μm and not more than 10 μm. The width of the seal conductor 61 is preferably not less than 1 μm and not more than 5 μm. The width of the seal conductor 61 is defined by a width in a direction orthogonal to a direction in which the seal conductor 61 extends.

Referring to FIG. 8, FIG. 9, and FIG. 13, the semiconductor device 5 further includes the separating structure 130 that is interposed between the semiconductor chip 41 and the seal conductor 61 and electrically separates the seal conductor 61 from the semiconductor chip 41. The separating structure 130 preferably includes an insulator. In this embodiment, the separating structure 130 is constituted of a field insulating film 131 that is formed in the first main surface 42 of the semiconductor chip 41.

The field insulating film 131 includes at least one among an oxide film (silicon oxide film) and a nitride film (silicon nitride film). The field insulating film 131 is preferably constituted of a LOCOS (local oxidation of silicon) film as an example of an oxide film that is formed by oxidation of the first main surface 42 of the semiconductor chip 41. A thickness of the field insulating film 131 is arbitrary as long as it can insulate the semiconductor chip 41 and the seal conductor 61. The thickness of the field insulating film 131 may be not less than 0.1 μm and not more than 5 μm.

The separating structure 130 is formed in the first main surface 42 of the semiconductor chip 41 and extends as a band along the seal conductor 61 in plan view. In this embodiment, the separating structure 130 is formed to a quadrilateral annular shape (specifically, a rectangular annular shape) in plan view. The separating structure 130 has connection portions 132 to which the lower end portion (seal via conductors 65) of the seal conductor 61 is connected. The connection portions 132 may form anchor portions with which the lower end portion (seal via conductors 65) of the seal conductor 61 is wedged in toward the semiconductor chip 41 side. As a matter of course, the connection portions 132 may be formed flush with a main surface of the separating structure 130.

The separating structure 130 includes an inner end portion 130A at the device region 62 side, an outer end portion 130B at the outer region 63 side, and a main body portion 130C between the inner end portion 130A and the outer end portion 130B. In plan view, the inner end portion 130A demarcates the region (that is, the device region 62) in which the second functional device 60 is formed. The inner end portion 130A may be formed integral to an insulating film (not shown) that is formed on the first main surface 42 of the semiconductor chip 41.

The outer end portion 130B is exposed from the chip side walls 44A to 44D of the semiconductor chip 41 and is continuous to the chip side walls 44A to 44D of the semiconductor chip 41. Specifically, the outer end portion 130B is formed flush with the chip side walls 44A to 44D of the semiconductor chip 41. The outer end portion 130B forms flush ground surfaces with the chip side walls 44A to 44D of the semiconductor chip 41 and the insulating side walls 53A to 53D of the insulating layer 51. As a matter of course, in another embodiment, the outer end portion 130B may be formed inside the first main surface 42 at intervals from the chip side walls 44A to 44D.

The main body portion 130C has a flat surface that extends substantially parallel to the first main surface 42 of the semiconductor chip 41. The main body portion 130C has the connection portions 132 to which the lower end portion (seal via conductors 65) of the seal conductor 61 is connected. The connection portions 132 are formed at portions of the main body portion 130C at intervals from the inner end portion 130A and the outer end portion 130B. Besides the field insulating film 131, the separating structure 130 can take on any of the various configurations shown in FIG. 14A to FIG. 14D.

Figure 14A:
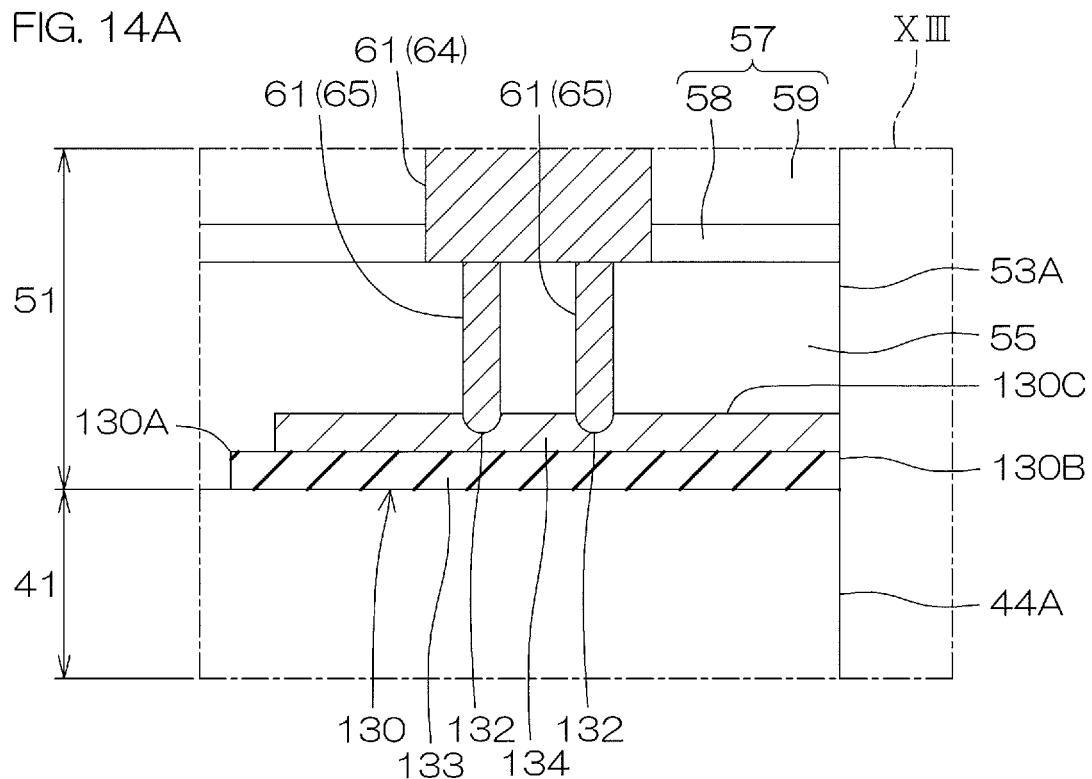
FIG. 14A is an enlarged view of the region XIII shown in FIG. 8 and is a diagram showing a separating structure according to a second configuration example.

FIG. 14A is an enlarged view of the region XIII shown in FIG. 8 and is a diagram showing a separating structure 130 according to a second configuration example. Referring to FIG. 14A, the separating structure 130 may have a laminated structure that includes an insulating film 133 that is formed on the first main surface 42 and a conductor film 134 that is formed on the insulating film 133. In this case, one of either or both of the insulating film 133 and the conductor film 134 may be exposed from the chip side walls 44A to 44D.

The insulating film 133 may include silicon oxide or silicon nitride. The insulating film 133 may be the field insulating film 131. A thickness of the insulating film 133 may be not less than 0.1 μm and not more than 5 μm. The conductor film 134 includes polysilicon or a metal and is formed in an electrically floating state. A thickness of the conductor film 134 may be not less than 0.1 μm and not more than 5 μm. The connection portions 132 with the seal conductor 61 are formed in the conductor film 134.

FIG. 14B is an enlarged view of the region XIII shown in FIG. 8 and is a diagram showing the separating structure 130 according to a third configuration example. Referring to FIG. 14B, the separating structure 130 includes a trench 135 that is formed in the first main surface 42 and an embedded body 136 that is embedded in the trench 135. In this case, the trench 135 and the embedded body 136 are exposed from the chip side walls 44A to 44D. The embedded body 136 is embedded in the trench 135 such as to be electrically separated from the semiconductor chip 41. Specifically, the embedded body 136 is embedded in the trench 135 such as to be in an electrically floating state.

In this configuration example, the embedded body 136 is constituted of an insulator 137. That is, the separating structure 130 is constituted of a trench insulating structure. The trench insulating structure may be an STI (shallow trench isolation). A depth of the trench 135 may be not less than 0.1 μm and not more than 5 μm. The embedded body 136 may include silicon oxide or silicon nitride. The embedded body 136 may have a main surface that projects further upward than the first main surface 42. The embedded body 136 may have a main surface that is positioned further toward a bottom wall side of the trench 135 than the first main surface 42. The embedded body 136 may have a main surface that is continuous to the first main surface 42. The connection portions 132 with the seal conductor 61 are formed in the embedded body 136.

FIG. 14C is an enlarged view of the region XIII shown in FIG. 8 and is a diagram showing the separating structure 130 according to a fourth configuration example. Referring to FIG. 14C, the separating structure 130 includes the trench 135 that is formed in the first main surface 42 and the embedded body 136 that is embedded in the trench 135. In this case, the trench 135 and the embedded body 136 are exposed from the chip side walls 44A to 44D. The embedded body 136 is embedded in the trench 135 such as to be electrically separated from the semiconductor chip 41. Specifically, the embedded body 136 is embedded in the trench 135 such as to be in an electrically floating state.

In this configuration example, the embedded body 136 includes an insulating film 138 that is formed on a wall surface of the trench 135 and a conductor 139 that is embedded in the trench 135 across the insulating film 138. The conductor 139 is electrically insulated from the semiconductor chip 41 by the insulating film 138 and is embedded in the electrically floating state. That is, the separating structure 130 is constituted of a trench insulating structure. The trench insulating structure may be an STI.

A depth of the trench 135 may be not less than 0.1 μm and not more than 5 μm. The insulating film 138 may include silicon oxide or silicon nitride. A thickness of the insulating film 138 may be not less than 0.1 μm and not more than 2 μm. The conductor 139 includes polysilicon or a metal and is embedded in the electrically floating state. The conductor 139 may have a main surface that projects further upward than the first main surface 42. The conductor 139 may have a main surface that is positioned further toward the bottom wall side of the trench 135 than the first main surface 42. The conductor 139 may have a main surface that is continuous to the first main surface 42. The connection portions 132 with the seal conductor 61 are formed in the conductor 139.

FIG. 14D is an enlarged view of the region XIII shown in FIG. 8 and is a diagram showing the separating structure 130 according to a fifth configuration example. Referring to FIG. 14D, the separating structure 130 is constituted of a portion of the insulating layer 51. The separating structure 130 may include the lowermost insulating layer 55 and one or a plurality of interlayer insulating layers 57. In this configuration example, the separating structure 130 is constituted of the lowermost insulating layer 55. In this configuration example, the seal conductor 61 does not have the seal via conductors 65 and has a lower end portion that is constituted of a seal plug conductor 64. The connection portion 132 of the separating structure 130 is constituted of a connection portion of the insulating layer 51 (lowermost insulating layer 55) and the lower end portion (seal plug conductor 64) of the seal conductor 61.

Referring to FIG. 8 and FIG. 9, the semiconductor device 5 further includes an inorganic insulating layer 140 that is formed on the insulating main surface 52 of the insulating layer 51 such as to cover the seal conductor 61. The inorganic insulating layer 140 may be referred to as a passivation layer. The inorganic insulating layer 140 protects the insulating layer 51 and the semiconductor chip 41 from above the insulating main surface 52.

In this embodiment, the inorganic insulating layer 140 has a laminated structure that includes a first inorganic insulating layer 141 and a second inorganic insulating layer 142. The first inorganic insulating layer 141 may include silicon oxide. The first inorganic insulating layer 141 preferably includes USG (undoped silicate glass), which is a silicon oxide that is not doped with an impurity. A thickness of the first inorganic insulating layer 141 may be not less than 50 nm and not more than 5000 nm. The second inorganic insulating layer 142 may include silicon nitride. A thickness of the second inorganic insulating layer 142 may be not less than 500 nm and not more than 5000 nm. By increasing a total thickness of the inorganic insulating layer 140, a dielectric withstand voltage on the high potential coils 23 can be increased.

If the first inorganic insulating layer 141 is constituted of USG and the second inorganic insulating layer 142 is constituted of silicon nitride, a dielectric breakdown voltage (V/cm) of USG exceeds the dielectric breakdown voltage (V/cm) of silicon nitride. Therefore, if the inorganic insulating layer 140 is to be thickened, it is preferable to form the first inorganic insulating layer 141 that is thicker than the second inorganic insulating layer 142.

The first inorganic insulating layer 141 may include at least one among BPSG (boron doped phosphor silicate glass) and PSG (phosphorus silicate glass) as an example of silicon oxide. However, in this case, an impurity (boron or phosphorus) is included inside the silicon oxide and thus in terms of increasing the dielectric withstand voltage on the high potential coils 23, it is especially preferable that the first inorganic insulating layer 141 constituted of USG is formed. As a matter of course, the inorganic insulating layer 140 may have a single layer structure constituted of one of either of the first inorganic insulating layer 141 and the second inorganic insulating layer 142.

The inorganic insulating layer 140 covers an entire area of the seal conductor 61 and has a plurality of low potential pad openings 143 and a plurality of high potential pad openings 144 that are formed in a region outside the seal conductor 61. The plurality of low potential pad openings 143 respectively expose the plurality of low potential terminals 11. The plurality of high potential pad openings 144 respectively expose the plurality of high potential terminals 12. The inorganic insulating layer 140 may have overlap portions riding on peripheral edge portions of the low potential terminals 11. The inorganic insulating layer 140 may have overlap portions riding on peripheral edge portions of the high potential terminals 12.

The semiconductor device 5 further includes an organic insulating layer 145 that is formed on the inorganic insulating layer 140. The organic insulating layer 145 may include a photosensitive resin. The organic insulating layer 145 may include at least one among a polyimide, a polyamide, and a polybenzoxazole. In this embodiment, the organic insulating layer 145 includes a polyimide. A thickness of the organic insulating layer 145 may be not less than 1 μm and not more than 50 μm.

A thickness of the organic insulating layer 145 preferably exceeds the total thickness of the inorganic insulating layer 140. Further, a total thickness of the inorganic insulating layer 140 and the organic insulating layer 145 is preferably not less than the distance D2 between the low potential coils 22 and the high potential coils 23. In this case, the total thickness of the inorganic insulating layer 140 is preferably not less than 2 μm and not more than 10 μm. Also, the thickness of the organic insulating layer 145 is preferably not less than 5 μm and not more than 50 μm. By these structures, thickening of the inorganic insulating layer 140 and the organic insulating layer 145 can be suppressed and, at the same time, the dielectric withstand voltage on the high potential coils 23 can be increased appropriately by a laminated film of the inorganic insulating layer 140 and the organic insulating layer 145.

The organic insulating layer 145 includes a first portion 146 that covers a region at a low potential side and a second portion 147 that covers a region at a high potential side. The first portion 146 covers the seal conductor 61 across the inorganic insulating layer 140. The first portion 146 has a plurality of low potential terminal openings 148 that respectively expose the plurality of low potential terminals 11 (low potential pad openings 143) in the region outside the seal conductor 61. The first portion 146 may have overlap portions riding on peripheral edges (overlap portions) of the low potential pad openings 143.

The second portion 147 is formed at an interval from the first portion 146 and exposes the inorganic insulating layer 140 between itself and the first portion 146. The second portion 147 has a plurality of high potential terminal openings 149 that respectively expose the plurality of high potential terminals 12 (high potential pad openings 144).

The second portion 147 may have overlap portions riding on peripheral edges (overlap portions) of the high potential pad openings 144.

The second portion 147 entirely covers the transformers 21A to 21D and the dummy pattern 85. Specifically, the second portion 147 entirely covers the plurality of high potential coils 23, the plurality of high potential terminals 12, the first high potential dummy pattern 87, the second high potential dummy pattern 88, and the floating dummy pattern 121.

If the organic insulating layer 145 is not formed, the plurality of high potential coils 23, the plurality of high potential terminals 12, the seal conductor 61, the first high potential dummy pattern 87, the second high potential dummy pattern 88, and the floating dummy pattern 121 may sustain damage due to a filler included in the package main body 2 (molded resin). This type of damage is referred to as filler attack.

The organic insulating layer 145 protects the plurality of high potential coils 23, the plurality of high potential terminals 12, the seal conductor 61, the first high potential dummy pattern 87, the second high potential dummy pattern 88, and the floating dummy pattern 121 from the filler included in the package main body 2 (molded resin). A slit between the first portion 146 and the second portion 147 functions as an anchor portion with respect to the package main body 2 (molded resin).

A portion of the package main body 2 (molded resin) enters into the slit between the first portion 146 and the second portion 147 and is connected to the inorganic insulating layer 140. An adhesion force of the package main body 2 (molded resin) to the semiconductor device 5 is thereby increased. As a matter of course, the first portion 146 and the second portion 147 may be formed integrally. Also, the organic insulating layer 145 may include just one of either of the first portion 146 and the second portion 147. However, in this case, filler attack must be taken into consideration.

FIG. 15 is a graph of average instantaneous dielectric breakdown voltages. In FIG. 15, the ordinate indicates the average instantaneous dielectric breakdown voltage [KV·rms] and the abscissa indicates the item. A higher average instantaneous dielectric breakdown voltage means that the withstand voltage of the insulating layer 51 is higher. A first bar G1, a second bar G2, a third bar G3, and a fourth bar G4 are shown in FIG. 15.

The first bar G1 indicates the average instantaneous dielectric breakdown voltage of the semiconductor device 5 according to a first structure. With the semiconductor device 5 according to the first structure, the dummy pattern 85 is not formed. The second bar G2 indicates the average instantaneous dielectric breakdown voltage of the semiconductor device 5 according to a second structure. With the semiconductor device 5 according to the second structure, the dummy pattern 85 that includes just the second high potential dummy pattern 88 is formed.

The third bar G3 indicates the average instantaneous dielectric breakdown voltage of the semiconductor device 5 according to a third structure. With the semiconductor device 5 according to the third structure, the dummy pattern 85 that includes just the floating dummy pattern 121 and the second high potential dummy pattern 88 is formed. The fourth bar G4 indicates the average instantaneous dielectric breakdown voltage of the semiconductor device 5 according to a fourth structure. With the semiconductor device 5 according to the fourth structure, the dummy pattern 85 that includes the first high potential dummy pattern 87, the second high potential dummy pattern 88, and the floating dummy pattern 121 is formed.

Referring to the first bar G1 and the second bar G2, the average instantaneous dielectric breakdown voltage increased by 11.2% by forming the second high potential dummy pattern 88. Referring to the second bar G2 and the third bar G3, the average instantaneous dielectric breakdown voltage increased by 13.2% by forming the floating dummy pattern 121 in addition to the second high potential dummy pattern 88.

Referring to the third bar G3 and the fourth bar G4, the average instantaneous dielectric breakdown voltage increased by 6.2% by forming the first high potential dummy pattern 87 in addition to the second high potential dummy pattern 88 and the floating dummy pattern 121. Referring to the first bar G1 and the fourth bar G4, the average instantaneous dielectric breakdown voltage increased by 13.37% by forming the first high potential dummy pattern 87, the second high potential dummy pattern 88, and the floating dummy pattern 121.

Figure 16:
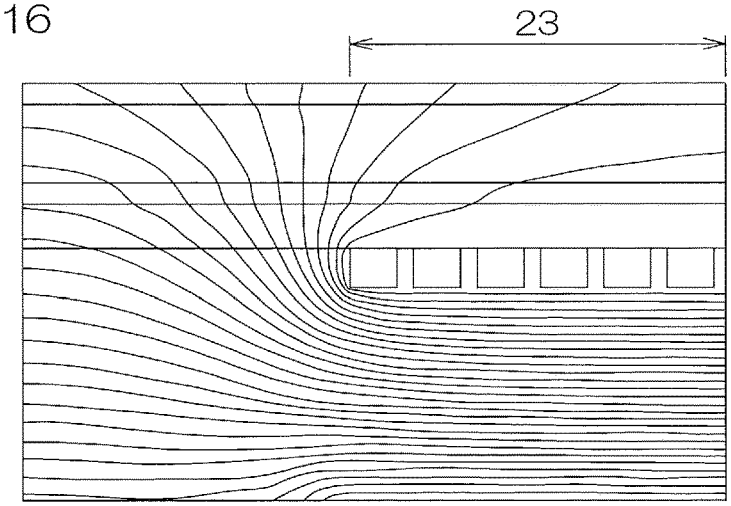
FIG. 16 is a diagram obtained by examining an electric field distribution in a vicinity of a high potential coil by simulation.

FIG. 16 is a diagram obtained by examining equipotential lines (electric field distribution) in a vicinity of a high potential coil 23 by simulation. The electric field distribution of the semiconductor device 5 according to the first structure described above is shown in FIG. 16. Referring to FIG. 16, in the case of the semiconductor device 5 according to the first structure, the equipotential lines wrap around to an upper side of the high potential coil 23 and concentrate at a peripheral edge of the high potential coil 23. It can thus be understood that with the semiconductor device 5 according to the first structure, the electric filed concentrates at the peripheral edge of the high potential coil 23. The average instantaneous dielectric breakdown voltage is decreased by this type of electric field concentration.

Figure 17:
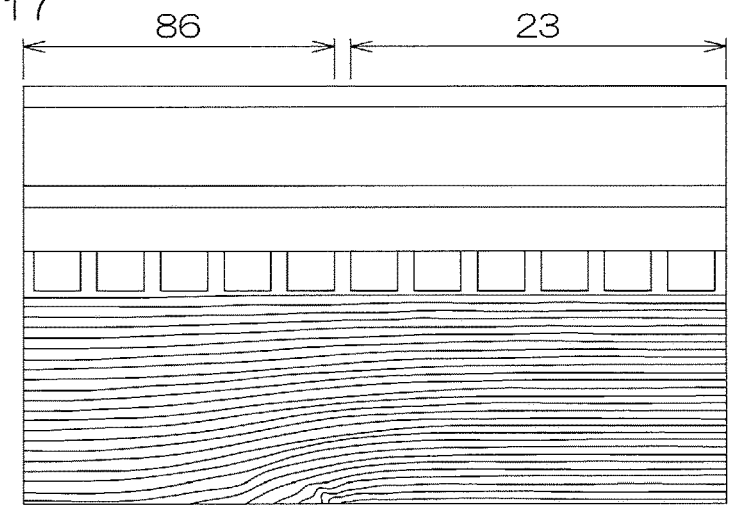
FIG. 17 is a diagram obtained by examining an electric field distribution of a first high potential dummy pattern by simulation.

FIG. 17 is a diagram obtained by examining equipotential lines (electric field distribution) in a vicinity of the first high potential dummy pattern 87 by simulation. The electric field distribution of the semiconductor device 5 according to the fourth structure described above is shown in FIG. 17. Referring to FIG. 17, in the case of the semiconductor device 5 according to the fourth structure, the equipotential lines bypass the high potential coil 23 and the first high potential dummy pattern 87 and leak out to an upper side of the first high potential dummy pattern 87. That is, in the case of the semiconductor device 5 according to the fourth structure, the electric field is not concentrated at the high potential coil 23. The average instantaneous dielectric breakdown voltage can thereby be increased.

Although specific illustration is omitted, the second high potential dummy pattern 88 also exhibits the same effect as the first high potential dummy pattern 87. That is, in a vicinity of the second high potential dummy pattern 88, the equipotential lines bypass the high potential coil 23 and the second high potential dummy pattern 88 and leak out to an upper side of the second high potential dummy pattern 88. The electric field concentration with respect to the high potential coil 23 can thereby be suppressed and the average instantaneous dielectric breakdown voltage can thus be increased.

Figure 18:
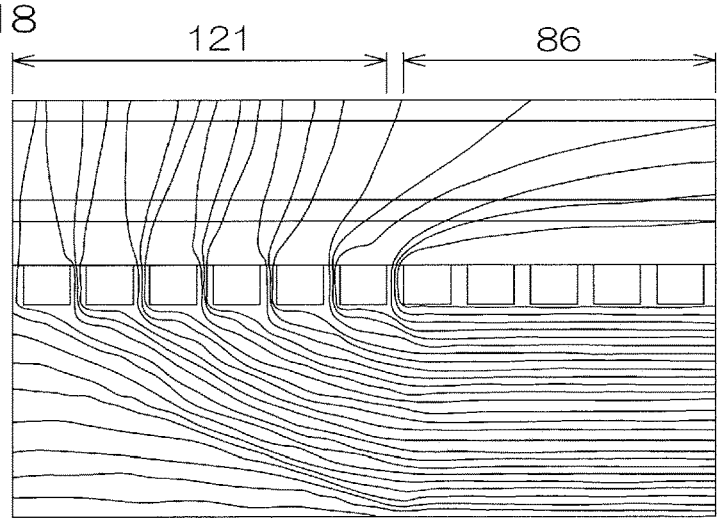
FIG. 18 is a diagram obtained by examining an electric field distribution of a floating dummy pattern by simulation.

FIG. 18 is a diagram obtained by examining an electric field distribution in a vicinity of the floating dummy pattern 121 by simulation. The electric field distribution of the semiconductor device 5 according to the fourth structure described above is shown in FIG. 18. Referring to FIG. 18, in the case of the semiconductor device 5 according to the fourth structure, the equipotential lines leak out to the upper side of the high potential coil 23 from regions between adjacent portions of the floating dummy pattern 121. That is, in the case of the semiconductor device 5 according to the fourth structure, the electric field that leaks out to the upper side of the high potential coil 23 is thinned out by the floating dummy pattern 121. The electric field concentration with respect to the high potential coil 23 can thereby be suppressed and the average instantaneous dielectric breakdown voltage can thus be increased.

Specifically, the equipotential lines leak out to an upper side of the high potential dummy pattern 86 from the regions between adjacent portions of the floating dummy pattern 121. That is, in the case of the semiconductor device 5 according to the fourth structure, the electric field that leaks out to the upper side of the high potential dummy pattern 86 is thinned out by the floating dummy pattern 121.

In the dummy pattern 85 that includes the high potential dummy pattern 86 and the floating dummy pattern 121, the high potential dummy pattern 86 keeps the electric field leaking out to the upper side of the high potential coil 23 away from the high potential coil 23. On the other hand, in a region separated from the high potential coil 23, the floating dummy pattern 121 disperses the electric field leaking out to the upper side of the high potential dummy pattern 86 in directions away from the high potential coil 23 and the high potential dummy pattern 86. The electric field concentration with respect to the high potential coil 23 can thereby be suppressed appropriately and the average instantaneous dielectric breakdown voltage can thus be increased appropriately.

It was thus found that the electric field concentration with respect to the high potential coil 23 can be suppressed and the average instantaneous dielectric breakdown voltage can be increased by forming the dummy pattern 85 that includes the first high potential dummy pattern 87, the second high potential dummy pattern 88, and the floating dummy pattern 121. It was also found from the results of FIG. 16, FIG. 17, and FIG. 18 that it suffices that the dummy pattern 85 include at least one among the first high potential dummy pattern 87, the floating dummy pattern 121, and the second high potential dummy pattern 88.

As described above, the semiconductor device 5 includes the semiconductor chip 41, the insulating layer 51, the first functional device 45, the low potential terminals 11, the high potential terminals 12, and the seal conductor 61. The insulating layer 51 is formed on the first main surface 42 of the semiconductor chip 41. The first functional device 45 is formed inside the insulating layer 51. The low potential terminals 11 are formed on the insulating layer 51 and are electrically connected to the first functional device 45.

The high potential terminals 12 are formed on the insulating layer 51 at intervals from the low potential terminals 11 and are electrically connected to the first functional device 45. The seal conductor 61 is embedded as a wall in the insulating layer 51 such as to demarcate a region including the first functional device 45, the low potential terminals 11, and the high potential terminals 12 from another region in plan view and is electrically separated from the semiconductor chip 41, the first functional device 45, the low potential terminals 11, and the high potential terminals 12.

By this structure, undesirable conduction between the high potential terminals 12 and the seal conductor 61 can be suppressed when a voltage is applied to the low potential terminals 11 and the high potential terminals 12. Also, undesirable conduction between the low potential terminals 11 and the seal conductor 61 can be suppressed. Also, undesirable conduction between the first functional device 45 and the seal conductor 61 can be suppressed. Withstand voltage can thus be improved.

In this structure, the seal conductor 61 is preferably fixed in the electrically floating state. By this structure, the seal conductor 61 can be suppressed reliably from forming a current path. Undesirable conduction of the seal conductor 61 can thus be suppressed appropriately.

The seal conductor 61 is preferably embedded in the insulating layer 51 at an interval in the normal direction Z from the first main surface 42 of the semiconductor chip 41. By this structure, the seal conductor 61 can be electrically separated from the semiconductor chip 41 appropriately. Mutual conduction between the semiconductor chip 41 and the seal conductor 61 can thus be suppressed appropriately.

The semiconductor device 5 preferably further includes the separating structure 130 that is interposed between the semiconductor chip 41 and the seal conductor 61 and electrically separates from the semiconductor chip 41 and the seal conductor 61. By this structure, the seal conductor 61 can be electrically separated appropriately from the semiconductor chip 41 by the separating structure 130.

The separating structure 130 may include the field insulating film 131 that is formed in the first main surface 42 of the semiconductor chip 41. The separating structure 130 may include the trench 135 that is formed in the first main surface 42 and the embedded body 136 that is embedded in the trench 135. The embedded body 136 is embedded in the trench 135 such as to be electrically separated from the semiconductor chip 41. Specifically, the embedded body 136 is embedded in the trench 135 such as to be in the electrically floating state. The separating structure 130 may be formed by using a portion of the insulating layer 51.

The separating structure 130 is preferably exposed from the chip side walls 44A to 44D of the semiconductor chip 41. By this structure, even if the seal conductor 61 is formed to be shifted to the chip side walls 44A to 44D sides, the seal conductor 61 can be connected appropriately to the separating structure 130 because the separating structure 130 that is exposed from the chip side walls 44A to 44D is formed at peripheral edges of the first main surface 42.

The insulating side walls 53A to 53D of the insulating layer 51 are preferably continuous to the chip side walls 44A to 44D of the semiconductor chip 41. Further, the insulating layer 51 is preferably continuous to the outer end portion 130B of the separating structure 130. By this structure, the seal conductor 61 can be insulted appropriately by the insulating layer 51 and the separating structure 130.

The seal conductor 61 is preferably formed to an annular shape that surrounds the first functional device 45, the low potential terminals 11, and the high potential terminals 12 in plan view. By this structure, the first functional device 45, the low potential terminals 11, and the high potential terminals 12 can be protected appropriately by the seal conductor 61.

The semiconductor device 5 includes the inorganic insulating layer 140 that covers the seal conductor 61 on the insulating layer 51. The inorganic insulating layer 140 has the low potential pad openings 143 and the high potential pad openings 144 that are formed in the region outside the seal conductor 61. The low potential pad openings 143 expose the low potential terminals 11 and the high potential pad openings 144 expose the high potential terminals 12. By this structure, the seal conductor 61 can be protected and an insulating property of the seal conductor 61 with respect to the exterior can be increased at the same time by the inorganic insulating layer 140.

The semiconductor device 5 further includes the organic insulating layer 145 that is formed on the inorganic insulating layer 140 such as to cover the seal conductor 61 across the inorganic insulating layer 140. By this structure, the seal conductor 61 can be protected and the insulating property of the seal conductor 61 with respect to the exterior can be increased further at the same time by the organic insulating layer 145.

The first functional device 45 may include the transformers 21 (passive devices) that are formed inside the insulating layer 51. The transformers 21 include the low potential coils 22 (low potential patterns) that are formed inside the insulating layer 51 and the high potential coils 23 (high potential pattern) that are formed inside the insulating layer 51 such as to oppose the low potential coils 22 in the normal direction Z. The high potential coils 23 oppose the semiconductor chip 41 across the low potential coils 22. The low potential coils 22 are electrically connected to the low potential terminals 11 and the high potential coils 23 are electrically connected to the high potential terminals 12.

By this structure, undesirable conduction between the high potential terminals 12 and the seal conductor 61 can be suppressed when a voltage is applied to the transformers 21 via the low potential terminals 11 and the high potential terminals 12. Also, undesirable conduction between the low potential terminals 11 and the seal conductor 61 can be suppressed when a voltage is applied to the transformers 21 via the low potential terminals 11 and the high potential terminals 12. Also, undesirable conduction between the transformers 21 and the seal conductor 61 can be suppressed when a voltage is applied to the transformers 21 via the low potential terminals 11 and the high potential terminals 12.

Also, the semiconductor device 5 further includes the second functional device 60 that is formed on the first main surface 42 of the semiconductor chip 41. The insulating layer 51 covers the second functional device 60. The low potential terminals 11 and the high potential terminals 12 are electrically connected to the second functional device 60. The seal conductor 61 demarcates a region that includes the second functional device 60 from another region in plan view and is electrically separated from the second functional device 60.

By this structure, undesirable conduction between the second functional device 60 and the seal conductor 61 can be suppressed when a voltage is applied to the low potential terminals 11 and the high potential terminals 12. Therefore, by the semiconductor device 5, effects that are the same as the effects exhibited between the first functional device 45 and the seal conductor 61 can also be exhibited between the second functional device 60 and the seal conductor 61.

Also, the semiconductor device 5 includes the dummy pattern 85 that is formed inside the insulating layer 51 such as to be positioned in the peripheries of the high potential coils 23 in plan view. The dummy pattern 85 shields the electric fields formed between the low potential coils 22 and the high potential coils 23 and suppresses the electric field concentration with respect to the high potential coils 23. Thereby, the electric field concentration with respect to the high potential coils 23 can be suppressed and the dielectric withstand voltage (average instantaneous dielectric breakdown voltage) can be improved. Further, by the semiconductor device 5, undesirable conduction between the dummy pattern 85 and the seal conductor 61 can be suppressed when a voltage is applied to the low potential terminals 11 and the high potential terminals 12. A withstand voltage improvement effect by the dummy pattern 85 and the seal conductor 61 can thus be realized appropriately.

In this embodiment, the dummy pattern 85 is interposed in the regions between adjacent ones of the plurality of high potential coils 23 in plan view. The electric field concentration with respect to the plurality of high potential coils 23 can thereby be suppressed using the regions between adjacent ones of the plurality of high potential coils 23.

In this embodiment, the dummy pattern 85 is interposed in the region between the low potential terminals 11 and the high potential coils 23 in plan view. Undesirable conduction between the low potential terminals 11 and the high potential coils 23 due to the electric field concentration at the high potential coils 23 can thereby be suppressed.

In this embodiment, the dummy pattern 85 is interposed in the region between the low potential terminals and the high potential terminals 12 in plan view. Undesirable conduction between the low potential terminals 11 and the high potential terminals 12 due to the electric field concentration at the high potential coils 23 can thereby be suppressed.

In this embodiment, the dummy pattern 85 is interposed in a region between the seal conductor 61 and the high potential coils 23 in plan view. Undesirable conduction between the seal conductor 61 and the high potential coils 23 due to the electric field concentration at the high potential coils 23 can thereby be suppressed.

In this embodiment, the dummy pattern 85 is interposed in a region between the seal conductor 61 and the high potential terminals 12 in plan view. Undesirable conduction between the seal conductor 61 and the high potential terminals 12 due to the electric field concentration at the high potential coils 23 can thereby be suppressed.

In this embodiment, the dummy pattern 85 includes the high potential dummy pattern 86 that is formed in the peripheries of the high potential coils 23 in plan view. The high potential dummy pattern 86 suppresses the electric fields leaking out to the upper sides of the high potential coils 23 in the region of the peripheries of the high potential coils 23. The electric field concentration with respect to the high potential coils 23 can thereby be suppressed appropriately in the region of the peripheries of the high potential coils 23.

The dummy pattern 85 includes the first high potential dummy pattern 87 that is interposed in the regions between adjacent ones of the plurality of high potential coils 23 in plan view. The first high potential dummy pattern 87 suppresses the electric fields leaking out to the upper sides of the plurality of high potential coils 23 in the regions between adjacent ones of the plurality of high potential coils 23. The electric field concentration with respect to the plurality of high potential coils 23 can thereby be suppressed appropriately in the regions between adjacent ones of the plurality of high potential coils 23.

Also, the dummy pattern 85 includes the second high potential dummy pattern 88 that is positioned in the region outside the regions between adjacent ones of the plurality of high potential coils 23 in plan view. The second high potential dummy pattern 88 suppresses the electric fields leaking out to the upper sides of the plurality of high potential coils 23 in the region outside the regions between adjacent ones of the plurality of high potential coils 23. The electric field concentration with respect to the plurality of high potential coils 23 can thereby be suppressed appropriately in the region outside the regions between adjacent ones of the plurality of high potential coils 23.

Also, the dummy pattern 85 includes the floating dummy pattern 121 that is formed in the electrically floating state in the peripheries of the high potential coils 23 in plan view. The floating dummy pattern 121 shields the electric fields between the low potential coils 22 and the high potential coils 23 such as to disperse the electric fields leaking out to the upper sides of the high potential coils 23. Electric field concentration with respect to the high potential coils 23 can thereby be suppressed.

Also, in the periphery of the high potential dummy pattern 86, the floating dummy pattern 121 disperses the electric fields leaking out to the upper side of the high potential dummy pattern 86. Thereby, the electric field concentration with respect to the high potential dummy pattern 86 can be suppressed and, at the same time, the electric field concentration with respect to the high potential coils 23 can be suppressed appropriately. In this structure, it is preferable for the seal conductor 61 that is in the electrically floating state to be formed. In this case, the seal conductor 61 does not cause a voltage drop with respect to the floating dummy pattern 121. Undesirable conduction between the dummy pattern 85 and the seal conductor 61 can thus be suppressed appropriately.

As can be understood from FIG. 16, the dummy pattern 85 preferably includes all of the first high potential dummy pattern 87, the floating dummy pattern 121, and the second high potential dummy pattern 88. However, the average instantaneous dielectric breakdown voltage can be improved even with a dummy pattern 85 that includes any one or two of the first high potential dummy pattern 87, the floating dummy pattern 121, and the second high potential dummy pattern 88.

That is, a dummy pattern 85 having just the first high potential dummy pattern 87 may be adopted. Also, a dummy pattern 85 having just the second high potential dummy pattern 88 may be adopted. Also, a dummy pattern 85 having just the floating dummy pattern 121 may be adopted.

Also, a dummy pattern 85 having just the first high potential dummy pattern 87 and the second high potential dummy pattern 88 may be adopted. Also, a dummy pattern 85 having just the first high potential dummy pattern 87 and the floating dummy pattern 121 may be adopted. Also, a dummy pattern 85 having just the second high potential dummy pattern 88 and the floating dummy pattern 121 may be adopted.

Also, the first high potential dummy pattern 87 may be changed to a floating dummy pattern 121. Also, the first high potential dummy pattern 87 and the second high potential dummy pattern 88 may be changed to floating dummy patterns 121.

Such floating dummy patterns 121 are formed by disconnecting the first high potential dummy pattern 87 and the second high potential dummy pattern 88 from the high potential connection wirings 81 (high potential terminals 12A to 12F). With the floating dummy pattern 121, due to being formed in the electrically floating state, voltage drops with respect to the high potential coils 23 are not formed. Therefore, with the floating dummy pattern 121, the electric field concentration with respect to the high potential coils 23 can be suppressed while suppressing increase in electric field strength with respect to the high potential coils 23. However, in the case of the floating dummy pattern 121, the presence of electric fields leaking out to the upper sides of the high potential coils 23 should be taken into consideration.

Also, the floating dummy pattern 121 may be changed to a second high potential dummy pattern 88. However, in this case, electric field strengths between the low potential terminals 11 (seal conductor 61) and the second high potential dummy pattern 88 increase as a result of distances between the low potential terminals 11 (seal conductor 61)

and the second high potential dummy pattern 88 becoming close. A possibility that undesirable electric field concentration may occur at the high potential coils 23 and at the second high potential dummy pattern 88 when the electric field strengths increase should be taken into consideration.

Figure 19:
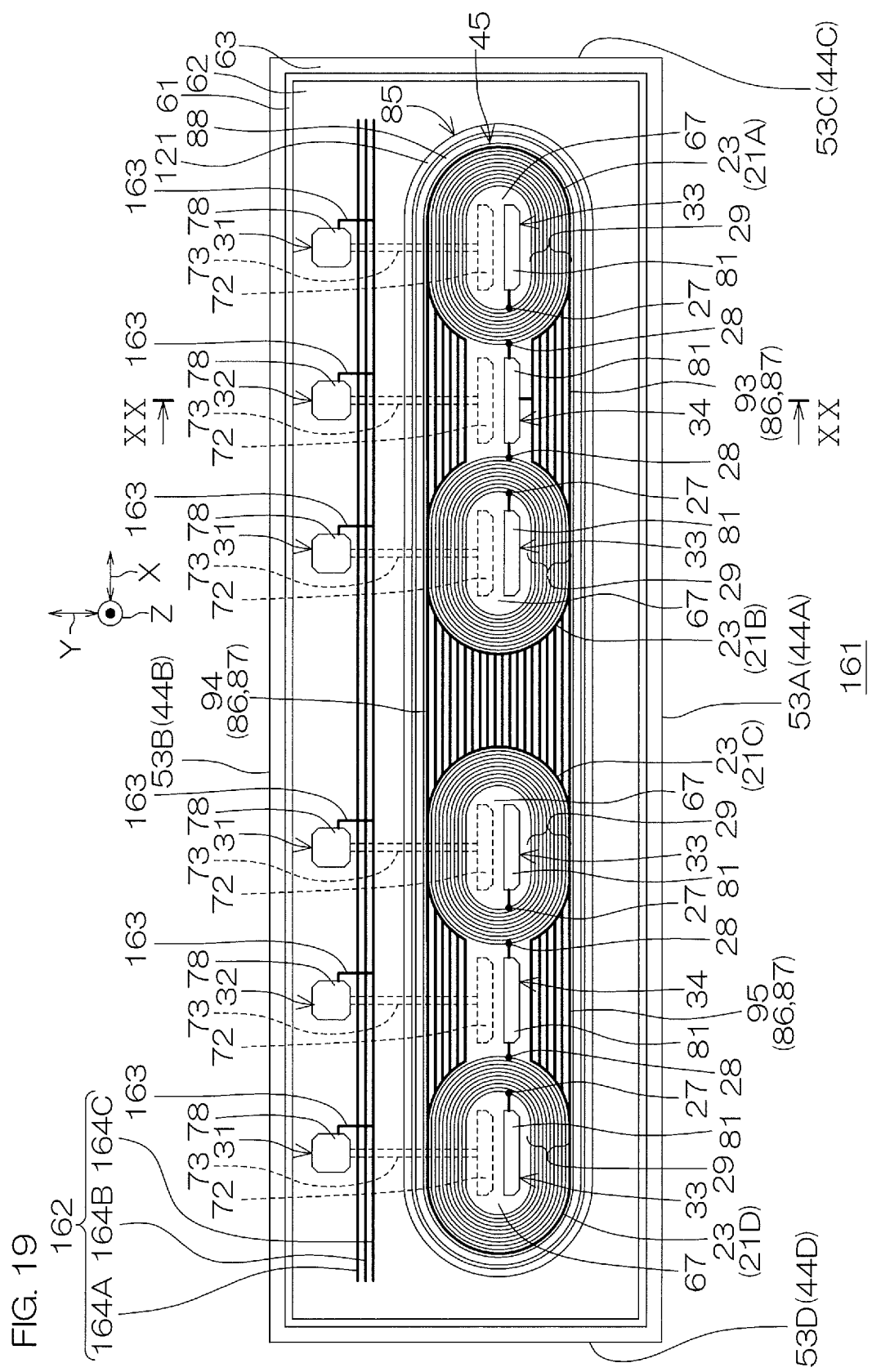
FIG. 19 is a plan view corresponding to FIG. 7 and is a plan view of a semiconductor device according to a second preferred embodiment of the present invention.
Figure 20:
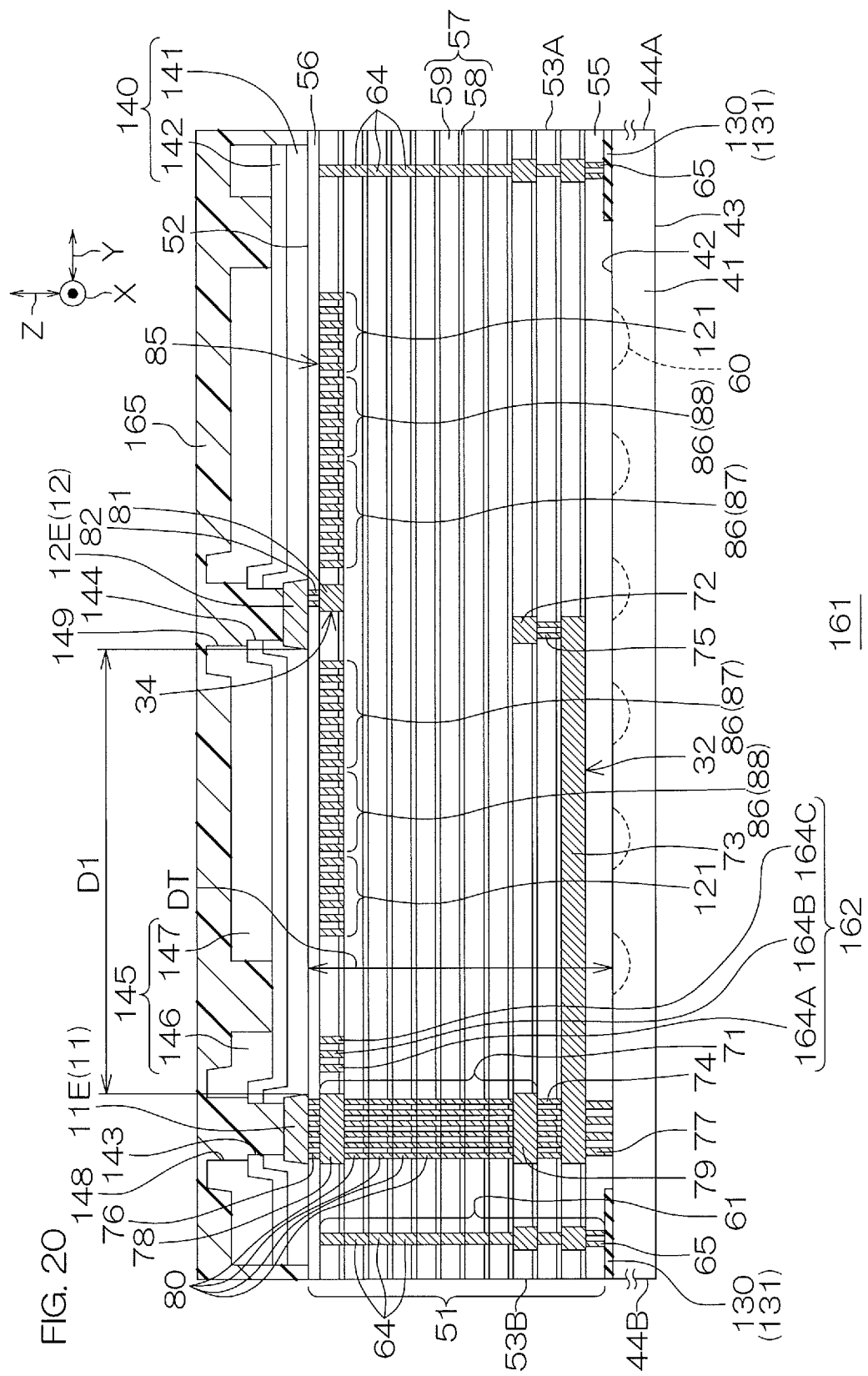
FIG. 20 is a sectional view taken along line XX-XX shown in FIG. 19.

FIG. 19 is a plan view corresponding to FIG. 7 and is a plan view of a semiconductor device 161 according to a second preferred embodiment of the present invention. FIG. 20 is a sectional view taken along line XX-XX shown in FIG. 19. In the following, structures corresponding to structures described for the semiconductor device 5 are provided with the same reference signs and description thereof shall be omitted. In FIG. 20, an example where the separating structure 130 (field insulating film 131) according to the first configuration example is shown (see also FIG. 13). However, in the semiconductor device 161 according to the second preferred embodiment, any one of the separating structures 130 according to the second to fifth configuration examples may be formed in place of the separating structure 130 according to the first configuration example (see also FIG. 14A to FIG. 14D).

Referring to FIG. 19 and FIG. 20, the dummy pattern 85 of the semiconductor device 161 further includes a low potential dummy pattern 162. In FIG. 19, the low potential dummy pattern 162 is indicated by thick lines. The low potential dummy pattern 162 is preferably formed of the same conductive materials as the low potential coils 22, etc. That is, as with the low potential coils 22, etc., the low potential dummy pattern 162 preferably includes a barrier layer and a main body layer.

The low potential dummy pattern 162 is formed of a pattern (discontinuous pattern) differing from the high potential coils 23 and the low potential coils 22 and is independent of the transformers 21A to 21D. That is, the low potential dummy pattern 162 does not function as the transformers 21A to 21D. A voltage less than the voltage applied to the high potential terminals 12 is applied to the low potential dummy pattern 162. The voltage applied to the low potential terminals 11 (that is, the reference voltage) is preferably applied to the low potential dummy pattern 162. That is, the low potential dummy pattern 162 is preferably fixed at the same potential as the low potential terminals 11. The low potential dummy pattern 162 includes a connection portion 163 connected to an arbitrary second electrode layer 79.

The low potential dummy pattern 162 is formed in peripheries of the low potential terminals 11 in plan view. Specifically, the low potential dummy pattern 162 is formed in regions in closer proximity to the low potential terminals 11 than the high potential coils 23 (high potential terminals 12) in plan view. That the low potential dummy pattern 162 is in proximity to the low potential terminals 11 in plan view means that in plan view, a distance between the low potential dummy pattern 162 and a low potential terminal 11 is less than a distance between the low potential dummy pattern 162 and a high potential coil 23 (high potential terminal 12).

A depth position of the low potential dummy pattern 162 in the interior of the insulating layer 51 is arbitrary and is adjusted in accordance with the electric field strengths to be relaxed. The low potential dummy pattern 162 is preferably formed in regions inside the insulating layer 51 in closer proximity to the low potential terminals 11 than the low potential coils 22 in regard to the normal direction Z. That the low potential dummy pattern 162 is in proximity to the low potential terminals 11 in regard to the normal direction Z means that in regard to the normal direction Z, a distance between the low potential dummy pattern 162 and a low potential terminal 11 is less than a distance between the low potential dummy pattern 162 and a low potential coil 22. The low potential dummy pattern 162 is preferably formed inside the same interlayer insulating layer 57 as the high potential coils 23.

The low potential dummy pattern 162 is preferably interposed in the regions between the low potential terminals 11 and the high potential coils 23 in plan view. The low potential dummy pattern 162 is preferably interposed in the regions between the low potential terminals 11 and the high potential terminals 12 in plan view.

In this embodiment, the low potential dummy pattern 162 is routed at a line density equal to the line density of the high potential coils 23 per unit area. That the line density of the low potential dummy pattern 162 is equal to the line density of the high potential coils 23 means that the line density of the low potential dummy pattern 162 falls within a range of ±20% of the line density of the high potential coils 23.

The low potential dummy pattern 162 is preferably formed to a shape with ends. By this structure, forming of a loop circuit of current in the low potential dummy pattern 162 can be suppressed appropriately. Noise due to current flowing through the low potential dummy pattern 162 can thereby be suppressed and therefore, undesirable electric field concentration due to the noise can be suppressed and, at the same time, fluctuations in the electrical characteristics of the transformers 21A to 21D can be suppressed appropriately.

In this embodiment, the low potential dummy pattern 162 is formed as a band extending in the first direction X. The low potential dummy pattern 162 crosses the plurality of low potential terminals 11A to 11F in plan view. The low potential dummy pattern 162 is thereby interposed in the regions between the low potential terminals 11A to 11F and the plurality of high potential coils 23 in plan view. Also, the low potential dummy pattern 162 is interposed in the regions between the low potential terminals 11A to 11F and the high potential terminals 12A to 12F in plan view.

In this embodiment, the low potential dummy pattern 162 includes a plurality (three in this embodiment) of low potential lines 164A, 164B, and 164C. The plurality of low potential lines 164A to 164C are formed at intervals in that order from the low potential terminals 11A to 11F side toward the high potential terminals 12A to 12F side. The plurality of low potential lines 164A to 164C are electrically connected to an arbitrary low potential connection wiring 72.

The plurality of low potential lines 164A to 164C are respectively formed as bands extending in the first direction X in plan view. That is, the plurality of low potential lines 164A to 164C are formed as stripes extending in the first direction X as a whole in plan view.

A width of each of the low potential lines 164A to 164C may be not less than 0.1 μm and not more than 5 μm. The width of each of the low potential lines 164A to 164C is preferably not less than 1 μm and not more than 3 μm. The width of each of the low potential lines 164A to 164C is defined by a width in a direction orthogonal to the direction in which the low potential lines 164A to 164C extend. The width of each of the low potential lines 164A to 164C is preferably equal to the width of each high potential coil 23. That the width of each of the low potential lines 164A to 164C is equal to the width of each high potential coil 23 means that the width of each of the low potential lines 164A to 164C falls in a range of within ±20% of the width of each high potential coil 23.

Thirteenth pitches between two adjacent ones of the low potential lines 164A to 164C may be not less than 0.1 µm and not more than 5 µm. The thirteenth pitches are preferably not less than 1 µm and not more than 3 µm. The thirteenth pitches are preferably equal to each other. That the thirteenth pitches are equal to each other means that the thirteenth pitches fall in a range of within ±20% of the thirteenth pitches. By these structures, the imbalance in the electric fields in the insulating layer 51 can be suppressed and therefore, the undesirable electric field concentration can be suppressed. The number, width, and pitches of the low potential lines 164A to 164C are adjusted in accordance with the electric fields to be relaxed and are not restricted to specific values.

The semiconductor device 161 further includes a main surface insulating layer 165 that covers the insulating main surface 52 of the insulating layer 51. On the insulating main surface 52, the main surface insulating layer 165 entirely covers the low potential terminals 11A to 11F, the high potential terminals 12A to 12F, the organic insulating layer 145, the inorganic insulating layer 140 (second inorganic insulating layer 142), etc.

The main surface insulating layer 165 has a second dielectric breakdown strength BS2 that is not more than a first dielectric breakdown strength BS1 of the insulating layer 51 (BS2≤BS1). Specifically, the second dielectric breakdown strength BS2 is less than the first dielectric breakdown strength BS1 (BS2<BS1).

Specifically, the insulating layer 51 includes silicon oxide and/or silicon nitride and has the first dielectric breakdown strength BS1 of not less than 1 MV/cm and not more than 15 MV/cm. The first dielectric breakdown strength BS1 is preferably not less than 5 MV/cm and not more than 15 MV/cm. As long as it has the first dielectric breakdown strength BS1 of not less than 1 MV/cm, the insulating layer 51 may include an insulating material besides silicon oxide and silicon nitride. On the other hand, the second dielectric breakdown strength BS2 may be not less than 0.1 MV/cm and not more than 1 MV/cm. The second dielectric breakdown strength BS2 may be not less than 0.1 MV/cm and not more than 0.5 MV/cm.

In this embodiment, the main surface insulating layer 165 is constituted of a resin layer. The main surface insulating layer 165 may include at least one among an epoxy resin layer, a polyimide resin layer, and a polybenzoxazole resin layer. The main surface insulating layer 165 may be formed by a portion of the molded resin. If the main surface insulating layer 165 is formed by a portion of the molded resin, the main surface insulating layer 165 may be formed by a portion of the package main body 2. That is, in a state of being sealed by the package main body 2, the main surface insulating layer 165 may include a portion of the package main body 2 that covers the insulating main surface 52 of the insulating layer 51.

Electric field strengths between the low potential terminals 11A to 11F and the high potential dummy pattern 86 are governed by a distance between the low potential dummy pattern 162 and the high potential dummy pattern 86. Therefore, in the insulating layer 51, the electric field strengths between the low potential terminals 11A to 11F and the high potential dummy pattern 86 are increased by the low potential dummy pattern 162.

On the other hand, due to the increase in the electric field strengths in the insulating layer 51, the electric field strengths in the main surface insulating layer 165 decreases. That is, the low potential dummy pattern 162 purposely increases the electric field strengths in the insulating layer 51 having the comparatively high first dielectric breakdown strength BS1 and at the same time decreases the electric field strengths in the main surface insulating layer 165 having the comparatively low second dielectric breakdown strength BS2. The dielectric withstand voltage of the main surface insulating layer 165 can thereby be improved relatively.

With the semiconductor device 161 described above, the same effects as the effects described for the semiconductor device 5 can be exhibited. Also, with the semiconductor device 161, the low potential dummy pattern 162 is included. The dielectric withstand voltage of the main surface insulating layer 165 can thereby be improved. Also, with the semiconductor device 161, the seal conductor 61 demarcates the region including the low potential dummy pattern 162 from another region in plan view and is electrically separated from the low potential dummy pattern 162. By this structure, undesirable conduction between the low potential dummy pattern 162 and the seal conductor 61 can be suppressed when a voltage is applied to the low potential terminals 11 and the high potential terminals 12. The withstand voltage can thus be increased.

FIG. 21 is a sectional view of a region corresponding to FIG. 8 and is a sectional view of a semiconductor device 191 according to a third preferred embodiment of the present invention. In the following, structures corresponding to structures described for the semiconductor device 5 are provided with the same reference signs and description thereof shall be omitted. In FIG. 21, an example where the separating structure 130 (field insulating film 131) according to the first configuration example is shown (see also FIG. 13). However, in the semiconductor device 191 according to the third preferred embodiment, any one of the separating structures 130 according to the second to fifth configuration examples may be formed in place of the separating structure 130 according to the first configuration example (see also FIG. 14A to FIG. 14D).

The semiconductor device 5 according to the first preferred embodiment has the plurality of transformers 21A to 21D each having a low potential coil 22 and a high potential coil 23. On the other hand, the semiconductor device 191 according to the third preferred embodiment includes a plurality of capacitors 192 in place of the plurality of transformers 21A to 21D. The positioning of the plurality of capacitors 192 is the same as the positioning of the plurality of transformers 21A to 21D. In FIG. 21, just one capacitor 192 is shown.

In place of a low potential coil 22 and a high potential coil 23, the capacitors 192 each include a low potential electrode 193 (low potential pattern) of flat plate shape and a high potential electrode 194 (high potential pattern) of flat plate shape. The low potential electrode 193 is electrically connected to low potential terminals 11 via a first low potential wiring 31. The low potential electrode 193 is electrically connected to the lead-out wiring 73 via the second connection plug electrode 75.

A planar shape of the low potential electrode 193 is arbitrary. The low potential electrode 193 may be formed to a polygonal shape such as a triangular shape, a quadrilateral shape, etc., or a circular shape or an elliptical shape in plan view. The low potential electrode 193 is electrically connected to the corresponding low potential terminals 11 via the corresponding first low potential wiring 31.

The high potential electrode 194 opposes the low potential electrode 193 in the normal direction Z and accumulates charge with the low potential electrode 193. The high potential electrode 194 is electrically connected to high potential terminals 12 via a first high potential wiring 33.

The high potential electrode 194 is electrically connected to the high potential terminals 12 via the pad plug electrode 82.

A planar shape of the high potential electrode 194 is arbitrary. The high potential electrode 194 may be formed to a polygonal shape such as a triangular shape, a quadrilateral shape, etc., or a circular shape or an elliptical shape in plan view. The high potential electrode 194 is electrically connected to the corresponding high potential terminals 12 via the corresponding first high potential wiring 33.

With the semiconductor device 191 described above, the same effects as the effects described for the semiconductor device 5 can be exhibited. The semiconductor device 191 may also include the low potential dummy pattern 162 according to the second preferred embodiment.

The preferred embodiments of the present invention can be implemented in yet other embodiments.

In each of the preferred embodiments described above, the semiconductor device 5, 161, or 191 may include the separating structure 130 having a structure in which at least two among the separating structures 130 according to the first to fifth configuration examples are combined in any mode.

With each of the preferred embodiments described above, an example where the first functional device 45 and the second functional device 60 are formed was described. However, a configuration that does not have the first functional device 45 and has just the second functional device 60 may be adopted. In this case, the dummy pattern 85 may be removed. By this structure, the same effects as the effects described in regard to the second functional device 60 in the first preferred embodiment (excluding the effects related to the dummy pattern 85) can be exhibited.

That is, the undesirable conduction between the high potential terminals 12 and the seal conductor 61 can be suppressed when a voltage is applied to the second functional device 60 via the low potential terminals 11 and the high potential terminals 12. Also, the undesirable conduction between the low potential terminals 11 and the seal conductor 61 can be suppressed when a voltage is applied to the second functional device 60 via the low potential terminals 11 and the high potential terminals 12.

Also, with each of the preferred embodiments described above, an example where the second functional device 60 is formed was described. However, the second functional device 60 is not necessarily required and may be omitted.

Also, with each of the preferred embodiments described above, an example where the dummy pattern 85 is formed was described. However, the dummy pattern 85 is not necessarily required and may be omitted.

Also, with each of the preferred embodiments described above, an example where the first functional device 45 is constituted of the multichannel type device that includes the plurality of transformers 21 was described. However, the first functional device 45 that is constituted of a single channel type that includes a single transformer 21 may be adopted.

Examples of features extracted from the present description and drawings are indicated below. The following [A1] to [A19] each provide a semiconductor device with which withstand voltage can be improved in a structure that includes a seal conductor.

[A1] A semiconductor device including a semiconductor chip that has a main surface, an insulating layer that is formed on the main surface, a functional device that is formed in at least one among the semiconductor chip and the insulating layer, a low potential terminal that is formed on the insulating layer and is electrically connected to the functional device, a high potential terminal that is formed on the insulating layer at an interval from the low potential terminal and is electrically connected to the functional device, and a seal conductor that is embedded as a wall in the insulating layer such as to demarcate a region including the functional device, the low potential terminal and the high potential terminal from another region in plan view, and is electrically separated from the semiconductor chip, the functional device, the low potential terminal and the high potential terminal.

According to this semiconductor device, undesirable conduction between the high potential terminal and the seal conductor can be suppressed when a voltage is applied to the low potential terminal and the high potential terminal. Also, undesirable conduction between the low potential terminal and the seal conductor can be suppressed. Also, undesirable conduction between the functional device and the seal conductor can be suppressed. The withstand voltage can thus be improved.

[A2] The semiconductor device according to A1, where the seal conductor is fixed in an electrically floating state.

[A3] The semiconductor device according to A1 or A2, where the seal conductor is embedded in the insulating layer at an interval from the semiconductor chip in a normal direction to the main surface.

[A4] The semiconductor device according to any one of A1 to A3, further including a separating structure that is interposed between the semiconductor chip and the seal conductor and electrically separates the seal conductor from the semiconductor chip.

[A5] The semiconductor device according to A4, where the separating structure includes an insulating film that is formed on the main surface of the semiconductor chip.

[A6] The semiconductor device according to A4, where the separating structure includes a trench that is formed in the main surface and an embedded body that is embedded in the trench such as to be electrically separated from the semiconductor chip.

[A7] The semiconductor device according to A4, where the separating structure is constituted of a portion of the insulating layer.

[A8] The semiconductor device according to any one of A4 to A7, where the separating structure is exposed from a side wall of the semiconductor chip.

[A9] The semiconductor device according to any one of A1 to A8, where the insulating layer has an insulating side wall that is continuous to the side wall of the semiconductor chip.

[A10] The semiconductor device according to any one of A1 to A9, where the seal conductor is formed to an annular shape that surrounds the functional device, the low potential terminal and the high potential terminal in plan view.

[A11] The semiconductor device according to any one of A1 to A10, further including an inorganic insulating layer that covers the seal conductor on the insulating layer and has a plurality of pad openings that respectively expose the low potential terminal and the high potential terminal.

[A12] The semiconductor device according to A11, further including an organic insulating layer that is formed on the inorganic insulating layer such as to cover the seal conductor across the inorganic insulating layer.

[A13] The semiconductor device according to any one of A1 to A12, where the functional device includes a low potential pattern that is formed inside the insulating layer and a high potential pattern that is formed inside the insulating layer such as to oppose the low potential pattern in a normal direction to the main surface, the low potential terminal is connected to the low potential pattern, and the high potential terminal is electrically connected to the high potential pattern.

[A14] The semiconductor device according to A13, where the high potential pattern opposes the semiconductor chip across the low potential pattern.

[A15] The semiconductor device according to A13 or A14, where the functional device is a transformer that includes a low potential coil as the low potential pattern and a high potential coil as the high potential pattern.

[A16] The semiconductor device according to A13 or A14, where the functional device is a capacitor that includes a low potential electrode as the low potential pattern and a high potential electrode as the high potential pattern.

[A17] The semiconductor device according to any one of A1 to A12, where the functional device includes at least one among a passive device, a semiconductor rectifying device and a semiconductor switching device, and is formed in the main surface of the semiconductor chip.

[A18] The semiconductor device according to any one of A1 to A12, where the functional device includes a first functional device that is formed in the insulating layer and a second functional device that is formed in the semiconductor chip.

[A19] A semiconductor device including a semiconductor chip that has a main surface, an insulating layer that is formed on the main surface, a low potential pattern that is formed inside the insulating layer, a high potential pattern that is formed inside the insulating layer such as to oppose the low potential pattern in a normal direction to the main surface, a dummy pattern that is formed in a periphery of the high potential pattern inside the insulating layer, includes a conductor, and shields an electric field between the low potential pattern and the high potential pattern, a low potential terminal that is formed on the insulating layer and is electrically connected to the low potential pattern, a high potential terminal that is formed on the insulating layer at an interval from the low potential terminal and is electrically connected to the high potential pattern, and a seal conductor that is embedded as a wall in the insulating layer such as to demarcate a region including the low potential pattern, the high potential pattern, the dummy pattern, the low potential terminal and the high potential terminal from another region in plan view, and is electrically separated from the semiconductor chip, the low potential pattern, the high potential pattern, the dummy pattern, the low potential terminal and the high potential terminal.

According to this semiconductor device, electric field concentration with respect to the high potential pattern can be suppressed by the dummy pattern when a voltage is applied to the low potential terminal and the high potential terminal. Further, according to this semiconductor device, undesirable conduction between the high potential pattern (high potential terminal) and the seal conductor can be suppressed when a voltage is applied to the low potential terminal and the high potential terminal. Also, undesirable conduction between the low potential pattern (low potential terminal) and the seal conductor can be suppressed. Also, undesirable conduction between the dummy pattern and the seal conductor can be suppressed. The withstand voltage can thus be improved.

The present application corresponds to Japanese Patent Application No. 2019-217565 filed in the Japan Patent Office on Nov. 19, 2019 and the entire disclosure of this application is incorporated herein by reference. While preferred embodiments of the present invention have been described in detail, these are merely specific examples used to clarify the technical contents of the present invention and the present invention should not be interpreted as being limited to these specific examples and the scope of the present invention is to be limited by the appended claims.

REFERENCE SIGNS LIST 5 semiconductor device
11 low potential terminal
12 high potential terminal
21 transformer
22 low potential coil
22 high potential coil
41 semiconductor chip
42 first main surface
44A first chip side wall
44B second chip side wall
44C third chip side wall
44D fourth chip side wall
45 first functional device
51 insulating layer
53A first insulating side wall
53B second insulating side wall
53C third insulating side wall
53D fourth insulating side wall
60 second functional device
61 seal conductor
85 dummy pattern
130 separating structure
131 field insulating film
135 trench
136 embedded body
140 inorganic insulating film
145 organic insulating film
161 semiconductor device
191 semiconductor device
192 capacitor
193 low potential electrode
194 high potential electrode

The invention claimed is:
1. A semiconductor device comprising:
a semiconductor chip that has a main surface;
an insulating layer that is formed on the main surface;
a functional device that is formed in at least one among the semiconductor chip and the insulating layer;
a low potential terminal that is formed on the insulating layer and is electrically connected to the functional device;
a high potential terminal that is formed on the insulating layer at an interval from the low potential terminal and is electrically connected to the functional device; and
a seal conductor that is embedded as a wall in the insulating layer such as to demarcate a region including the functional device, the low potential terminal and the high potential terminal from another region in plan view, and is electrically separated from the semiconductor chip, the functional device, the low potential terminal and the high potential terminal.

2. The semiconductor device according to claim 1, wherein the seal conductor is fixed in an electrically floating state.

3. The semiconductor device according to claim 1, wherein the seal conductor is embedded in the insulating layer at an interval from the semiconductor chip in a normal direction to the main surface.

4. The semiconductor device according to claim 1, further comprising:

a separating structure that is interposed between the semiconductor chip and the seal conductor and electrically separates the seal conductor from the semiconductor chip.

5. The semiconductor device according to claim 4, wherein the separating structure includes an insulating film that is formed on the main surface of the semiconductor chip.

6. The semiconductor device according to claim 4, wherein the separating structure includes a trench that is formed in the main surface and an embedded body that is embedded in the trench such as to be electrically separated from the semiconductor chip.

7. The semiconductor device according to claim 4, wherein the separating structure is constituted of a portion of the insulating layer.

8. The semiconductor device according to claim 4, wherein the separating structure is exposed from a side wall of the semiconductor chip.

9. The semiconductor device according to claim 1, wherein the insulating layer has an insulating side wall that is continuous to the side wall of the semiconductor chip.

10. The semiconductor device according to claim 1, wherein the seal conductor is formed to an annular shape that surrounds the functional device, the low potential terminal and the high potential terminal in plan view.

11. The semiconductor device according to claim 1, further comprising:
an inorganic insulating layer that covers the seal conductor on the insulating layer and has a plurality of pad openings that respectively expose the low potential terminal and the high potential terminal.

12. The semiconductor device according to claim 11, further comprising:
an organic insulating layer that is formed on the inorganic insulating layer such as to cover the seal conductor across the inorganic insulating layer.

13. The semiconductor device according to claim 1, wherein the functional device includes a low potential pattern that is formed inside the insulating layer and a high potential pattern that is formed inside the insulating layer such as to oppose the low potential pattern in a normal direction to the main surface,
the low potential terminal is connected to the low potential pattern, and
the high potential terminal is electrically connected to the high potential pattern.

14. The semiconductor device according to claim 13, wherein the high potential pattern opposes the semiconductor chip across the low potential pattern.

15. The semiconductor device according to claim 13, wherein the functional device is a transformer that includes a low potential coil as the low potential pattern and a high potential coil as the high potential pattern.

16. The semiconductor device according to claim 13, wherein the functional device is a capacitor that includes a low potential electrode as the low potential pattern and a high potential electrode as the high potential pattern.

17. The semiconductor device according to claim 1, wherein the functional device includes at least one among a passive device, a semiconductor rectifying device and a semiconductor switching device, and is formed in the main surface of the semiconductor chip.

18. The semiconductor device according to claim 1, wherein the functional device includes a first functional device that is formed in the insulating layer and a second functional device that is formed in the semiconductor chip.

19. A semiconductor device comprising:
a semiconductor chip that has a main surface;
an insulating layer that is formed on the main surface;
a low potential pattern that is formed inside the insulating layer;
a high potential pattern that is formed inside the insulating layer such as to oppose the low potential pattern in a normal direction to the main surface;
a dummy pattern that is formed in a periphery of the high potential pattern inside the insulating layer, includes a conductor, and shields an electric field between the low potential pattern and the high potential pattern;
a low potential terminal that is formed on the insulating layer and is electrically connected to the low potential pattern;
a high potential terminal that is formed on the insulating layer at an interval from the low potential terminal and is electrically connected to the high potential pattern; and
a seal conductor that is embedded as a wall in the insulating layer such as to demarcate a region including the low potential pattern, the high potential pattern, the dummy pattern, the low potential terminal and the high potential terminal from another region in plan view, and is electrically separated from the semiconductor chip, the low potential pattern, the high potential pattern, the dummy pattern, the low potential terminal and the high potential terminal.

* * * * *